(12) United States Patent
Murakami et al.

(10) Patent No.: US 11,323,642 B2
(45) Date of Patent: *May 3, 2022

(54) IMAGING DEVICE AND CAMERA SYSTEM, AND DRIVING METHOD OF IMAGING DEVICE

(71) Applicant: PANASONIC INTELLECTUAL PROPERTY MANAGEMENT CO., LTD., Osaka (JP)

(72) Inventors: Masashi Murakami, Kyoto (JP); Kazuko Nishimura, Kyoto (JP); Yasuo Miyake, Osaka (JP); Yasunori Inoue, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/116,121

(22) Filed: Dec. 9, 2020

(65) Prior Publication Data
US 2021/0092312 A1 Mar. 25, 2021

Related U.S. Application Data

(63) Continuation of application No. 16/352,367, filed on Mar. 13, 2019, now Pat. No. 10,893,222.

(30) Foreign Application Priority Data

Mar. 29, 2018 (JP) .............................. JP2018-064057

(51) Int. Cl.
*H04N 5/355* (2011.01)
*H01L 27/146* (2006.01)

(52) U.S. Cl.
CPC ....... *H04N 5/355* (2013.01); *H01L 27/14612* (2013.01)

(58) Field of Classification Search
CPC ............... H04N 5/355; H04N 5/35527; H04N 5/37452; H04N 5/35518; H04N 5/3559;
(Continued)

(56) References Cited

U.S. PATENT DOCUMENTS 10,893,222 B2 * 1/2021 Murakami ......... H04N 5/35518
2011/0241151 A1 10/2011 Nakatani et al.
(Continued)

FOREIGN PATENT DOCUMENTS

EP 3425900 1/2019
JP 2009-049525 3/2009
(Continued)

OTHER PUBLICATIONS

Non-Final Office Action issued in U.S. Appl. No. 16/352,367, dated May 15, 2020.
(Continued)

*Primary Examiner* — Lin Ye
*Assistant Examiner* — John H Morehead, III
(74) *Attorney, Agent, or Firm* — McDermott Will & Emery LLP

(57) ABSTRACT

An imaging device including a photoelectric converter including a first electrode, a second electrode, and a photoelectric conversion layer; a voltage supply circuit that applies a bias voltage between the first electrode and the second electrode; an amplifier transistor including a gate electrically connected to the second electrode, the amplifier transistor being configured to output a signal that corresponds to a potential of the gate; and a detection circuit that is configured to detect a level of the signal from the amplifier transistor. The voltage supply circuit applies the bias voltage in a first voltage range, in a case where the level detected by the detection circuit is less than a first threshold value, and applies the bias voltage in a second voltage range that is (Continued)

greater than the first voltage range, in a case where the level detected by the detection circuit is greater than a second threshold value.

20 Claims, 47 Drawing Sheets

(58) Field of Classification Search
CPC ......... H01L 27/14612; H01L 27/14638; H01L 27/14665
See application file for complete search history.

(56) References Cited

U.S. PATENT DOCUMENTS

| 2014/0291608 | A1 | 10/2014 | Sargent et al. | |
|---|---|---|---|---|
| 2016/0190188 | A1 | 6/2016 | Murakami et al. | |
| 2017/0332025 | A1 | 11/2017 | Nozawa et al. | |
| 2018/0020171 | A1 | 1/2018 | Miyake et al. | |
| 2018/0227526 | A1* | 8/2018 | Tokuhara | H01L 27/146 |
| 2018/0315798 | A1* | 11/2018 | Shimasaki | G01J 1/44 |
| 2019/0244987 | A1* | 8/2019 | Murakami | H01L 27/142 |

FOREIGN PATENT DOCUMENTS

| JP | 2011-228648 | 11/2011 |
|---|---|---|
| JP | 2017-046333 | 3/2017 |
| JP | 2017-208812 | 11/2017 |
| WO | 2017/094229 | 6/2017 |
| WO | 2017/150167 | 9/2017 |

OTHER PUBLICATIONS

Notice of Allowance issued in U.S. Appl. No. 16/352,367, dated Sep. 18, 2020.

* cited by examiner

| SENSOR OUTPUT [LSB] | OUTPUT AFTER CORRECTION [LSB] |
|---|---|
| 0 | 0 |
| ⋮ | ⋮ |
| N | X |
| ⋮ | ⋮ |

| SENSOR OUTPUT [LSB] | OUTPUT AFTER CORRECTION [LSB] |
|---|---|
| 0 | 0 |
| ⋮ | ⋮ |
| N | X |
| ⋮ | ⋮ |

FIG. 49

| SENSOR OUTPUT [LSB] | OUTPUT AFTER CORRECTION [LSB] |
|---|---|
| 0 | 0 |
| ⋮ | ⋮ |
| N | Y |
| ⋮ | ⋮ |

FIG. 50

| EXPOSURE QUANTITY | OUTPUT @Va[LSB] | OUTPUT @Vb[LSB] | OUTPUT @Vc[LSB] |
|---|---|---|---|
| 0 | 0 | 0 | 0 |
| t1 | P11 | P12 | P13 |
| t2 | P21 | P22 | P23 |
| t3 | P23 | P23 | P33 |

IMAGING DEVICE AND CAMERA SYSTEM, AND DRIVING METHOD OF IMAGING DEVICE

CROSS-REFERENCE OF RELATED APPLICATIONS

This application is a Continuation of U.S. patent application Ser. No. 16/352,367, filed on Mar. 13, 2019, which claims the benefit of Japanese Application No. 2018-064057, filed on Mar. 29, 2018, the entire disclosures of which applications are incorporated by reference herein.

BACKGROUND

1. Technical Field

The present disclosure relates to an imaging device and a camera system. The present disclosure also relates to a driving method of an imaging device.

2. Description of the Related Art

In the field of imaging devices, a configuration is known in which, instead of a photodiode, a photoelectric conversion layer is arranged above a semiconductor substrate on which a read circuit is formed. This kind of configuration is referred to as a stacked type. For example, Japanese Unexamined Patent Application Publication No. 2011-228648 discloses an imaging element that has an organic photoelectric conversion layer sandwiched between a pixel electrode and a transparent opposite electrode, above a substrate on which a read circuit is formed. During operation, a predetermined voltage is applied to the opposite electrode.

The specification of U.S. Pat. No. 9,054,246 discloses an imaging system having a quantum dot layer that serves as a photoelectric conversion layer. Furthermore, the specification of U.S. Pat. No. 9,054,246 discloses that the gain of the quantum dot layer is adjusted by altering a potential difference applied between a transparent electrode and a pixel electrode arranged on either side of the quantum dot layer.

SUMMARY

In the field of imaging devices, an expansion in dynamic range is required.

A non-limiting exemplary embodiment of the present disclosure provides the following, for example.

In one general aspect, the techniques disclosed here feature an imaging device including a photoelectric converter that includes a first electrode, a second electrode, and a photoelectric conversion layer located between the first electrode and the second electrode; a voltage supply circuit that applies a bias voltage between the first electrode and the second electrode; an amplifier transistor that includes a gate electrically connected to the second electrode, the amplifier transistor being configured to output a signal that corresponds to a potential of the gate; and a detection circuit that is configured to detect a level of the signal from the amplifier transistor. The voltage supply circuit applies the bias voltage in a first voltage range, in a case where the level detected by the detection circuit is less than a first threshold value, and applies the bias voltage in a second voltage range that is greater than the first voltage range, in a case where the level detected by the detection circuit is greater than a second threshold value.

General or specific aspects may be realized by means of an element, a device, a system, an integrated circuit, a method, or a computer program. Furthermore, general or specific aspects may be realized by means of an arbitrary combination of an element, a device, an apparatus, a system, an integrated circuit, a method, and a computer program.

Additional benefits and advantages of the disclosed embodiments will be apparent from the specification and the drawings. The benefits and/or advantages may be individually provided by the various embodiments or features disclosed in the specification and the drawings, and need not all be provided in order to obtain one or more of the same.

BRIEF DESCRIPTION OF THE DRAWINGS

FIG. 49 is a drawing depicting an example of a correction table stored in the memory of an imaging device of sample 2;

FIG. 50 is a drawing depicting another example of a correction table stored in the memory;

DETAILED DESCRIPTION

Figure 1:
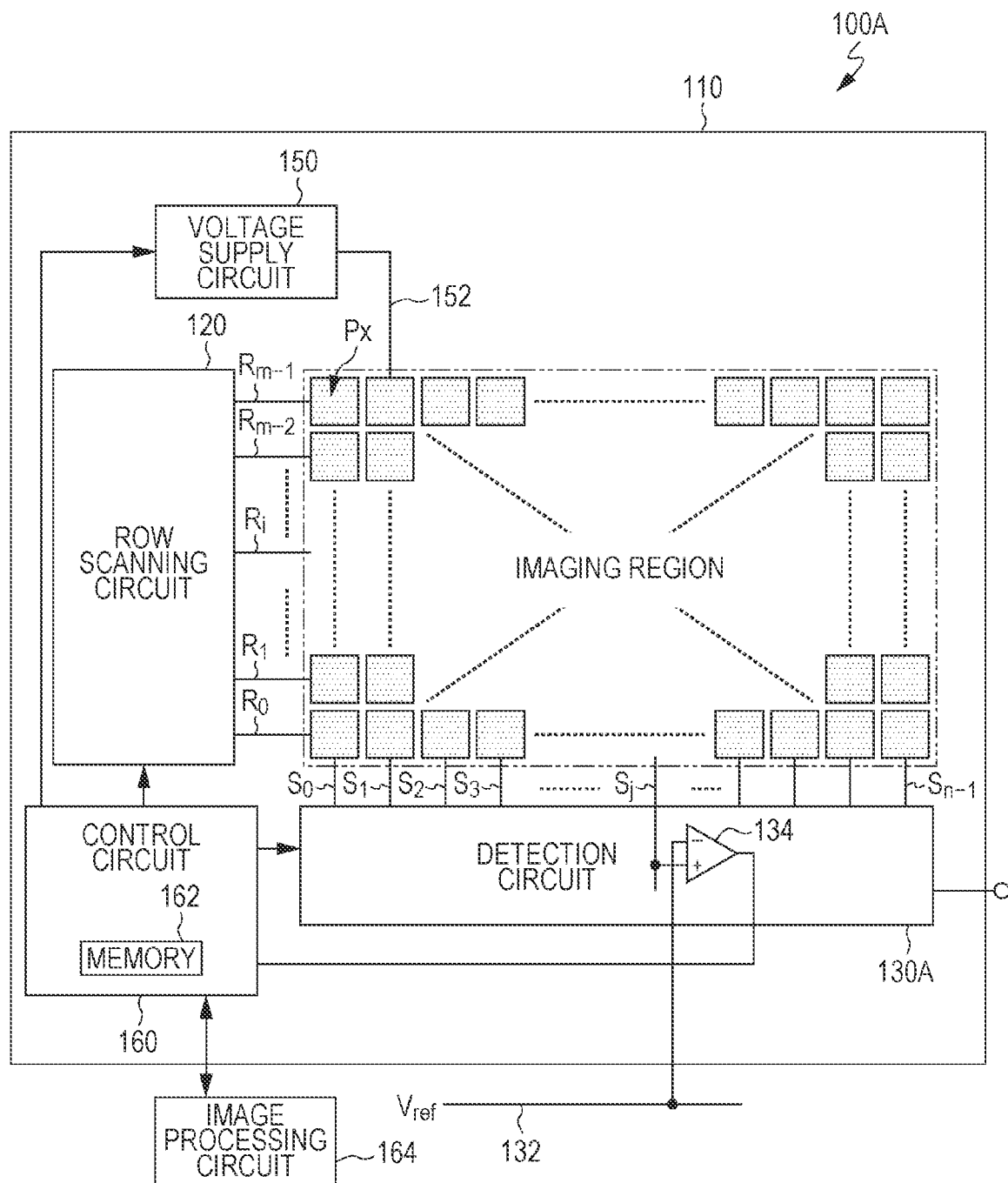
FIG. 1 is a drawing schematically depicting an exemplary configuration of an imaging device according to a first embodiment of the present disclosure.

An overview of an aspect of the present disclosure is as follows.

[Item 1]

An imaging device provided with:

a photoelectric converter that includes a first electrode, a second electrode, and a photoelectric conversion layer located between the first electrode and the second electrode;

a voltage supply circuit;

an output circuit that is coupled to the second electrode, the output circuit being configured to output a signal that corresponds to a potential of the second electrode; and a detection circuit that is configured to detect a level of the signal from the output circuit, wherein the photoelectric converter has photoelectric conversion characteristics in which a first rate of change is greater than a second rate of change, the first rate of change being a rate of change of a photoelectric conversion efficiency of the photoelectric converter with respect to a bias voltage applied between the first electrode and the second electrode when the bias voltage is in a first voltage range, the second rate being a rate of change of the photoelectric conversion efficiency of the photoelectric converter with respect to the bias voltage when the bias voltage is in a second voltage range that is greater than the first voltage range, and the voltage supply circuit:

supplies a voltage to one of the first electrode and the second electrode to cause a potential difference between the first electrode and the second electrode to be a first potential difference, in a case where the level detected by the detection circuit is less than a first threshold value;

and supplies a voltage to the one of the first electrode and the second electrode to cause the potential difference between the first electrode and the second electrode to be a second potential difference that is greater than the first potential difference, in a case where the level detected by the detection circuit is greater than or equal to a second threshold value that is greater than or equal to the first threshold value.

[Item 2]

The imaging device according to item 1, wherein the voltage supply circuit:

supplies a first voltage to the one of the first electrode and the second electrode, in a case where the level detected by the detection circuit is less than the first threshold value; and, supplies a second voltage that is greater than the first voltage to the one of the first electrode and the second electrode, in a case where the level detected by the detection circuit is greater than or equal to the second threshold value.

[Item 3]

The imaging device according to item 2, wherein the output circuit includes:

a first transistor that has a gate coupled to the second electrode, the first transistor being configured to receive a third voltage to one of a source and a drain; and a second transistor that has a gate coupled to the second electrode, the second transistor being configured to receive a fourth voltage that is greater than the third voltage to one of a source and a drain.

[Item 4]

The imaging device according to item 2, wherein the output circuit includes:

a capacitor; and a switching element that is coupled between the second electrode and the capacitor, and, the switching element is set to on-state when the signal that corresponds to the potential of the second electrode is read, in a case where the level detected by the detection circuit is greater than or equal to the second threshold value, the potential of the second electrode having been changed by photoelectric conversion in the photoelectric converter.

[Item 5]

The imaging device according to item 2, wherein the output circuit includes a capacitor that has one electrode coupled to the second electrode, and, a potential of another electrode of the capacitor is temporarily decreased when the signal that corresponds to the potential of the second electrode is read, in a case where the level detected by the detection circuit is greater than or equal to the second threshold value, the potential of the second electrode having been changed by photoelectric conversion in the photoelectric converter.

[Item 6]

The imaging device according to item 2, wherein the output circuit includes:

a first transistor that has a gate coupled to the second electrode; and an attenuator that is coupled between the second electrode and the gate of the first transistor, and, the attenuator attenuates a voltage applied to the gate of the first transistor, in a case where the level detected by the detection circuit is greater than or equal to the second threshold value.

[Item 7]

The imaging device according to any one of items 2 to 6, wherein a potential of the first electrode is greater than the potential of the second electrode, in both of a state in which the first voltage is supplied to the one of the first electrode and the second electrode, and a state in which the second voltage is supplied to the one of the first electrode and the second electrode.

[Item 8]

The imaging device according to any one of items 2 to 7, wherein, in a graph of the photoelectric conversion efficiency of the photoelectric converter with respect to the bias voltage, when Vt is a value of the bias voltage corresponding to an intersecting point between a first tangent at a point where the photoelectric conversion efficiency rises from 0 and a second tangent at a point where the bias voltage is a largest value during operation, the first voltage range is a voltage range that is less than the Vt.

[Item 9]

The imaging device according to any one of items 2 to 7, wherein, in a graph of the photoelectric conversion efficiency of the photoelectric converter with respect to the bias voltage, when Vt is a value of the bias voltage corresponding to an intersecting point between a first tangent at a point where a value of the photoelectric conversion efficiency is 0.06 and a second tangent at a point where the bias voltage is a largest value during operation, the first voltage range is a voltage range that is less than the Vt.

[Item 10]

The imaging device according to any one of items 2 to 7, wherein the second voltage range is a voltage range in which a change in the photoelectric conversion efficiency with respect to a change of 1 V in the bias voltage is less than 10%.

[Item 11]

The imaging device according to any one of items 2 to 7, wherein the second voltage range is a voltage range in which the photoelectric conversion efficiency is 0.7 or more.

[Item 12]

The imaging device according to any one of items 8 to 11, wherein a first efficiency that is the photoelectric conversion efficiency of the photoelectric converter when the first voltage is supplied is less than a second efficiency that is the photoelectric conversion efficiency of the photoelectric converter when the second voltage is supplied.

[Item 13]

The imaging device according to item 12, wherein the first voltage and the second voltage are voltages within the second voltage range.

[Item 14]

The imaging device according to item 13, wherein a ratio of the second efficiency with respect to the first efficiency is greater than 1 and 1.25 or less.

[Item 15]

A camera system provided with:
an imaging device that includes:
a photoelectric converter that includes a first electrode, a second electrode, and a photoelectric conversion layer located between the first electrode and the second electrode;
a voltage supply circuit; and
an output circuit that is coupled to the second electrode, the output circuit being configured to output a signal that corresponds to a potential of the second electrode; and
a light quantity detector that detects a quantity of light incident on the photoelectric converter, wherein
the photoelectric converter has photoelectric conversion characteristics in which a first rate of change is greater than a second rate of change, the first rate of change being a rate of change of a photoelectric conversion efficiency of the photoelectric converter with respect to a bias voltage applied between the first electrode and the second electrode when the bias voltage is in a first voltage range, the second rate being a rate of change of the photoelectric conversion efficiency of the photoelectric converter with respect to the bias voltage when the bias voltage is in a second voltage range that is greater than the first voltage range, and
the voltage supply circuit:
supplies a voltage to one of the first electrode and the second electrode to cause a potential difference between the first electrode and the second electrode to be a first potential difference, in a case where the quantity of light detected by the light quantity detector is less than a first quantity of light; and,
supplies a voltage to the one of the first electrode and the second electrode to cause the potential difference between the first electrode and the second electrode to be a second potential difference that is greater than the first potential difference, in a case where the quantity of light detected by the light quantity detector is greater than or equal to a second quantity of light that is greater than or equal to the first quantity of light.

[Item 16]

A driving method of an imaging device that has a photoelectric converter that includes a first electrode, a second electrode, and a photoelectric conversion layer located between the first electrode and the second electrode, the driving method comprising:
supplying a voltage to one of the first electrode and the second electrode to cause a potential difference between the first electrode and the second electrode to be a first potential difference, in a case where a quantity of light incident on the photoelectric converter is less than a first quantity of light; and
supplying a voltage to the one of the first electrode and the second electrode to cause the potential difference between the first electrode and the second electrode to be a second potential difference that is greater than the first potential difference, in a case where the quantity of light incident on the photoelectric converter is greater than or equal to a second quantity of light that is greater than or equal to the first quantity of light.

[Item 17]

An imaging device provided with:
a photoelectric converter that includes a first electrode, a second electrode, and a photoelectric conversion layer located between the first electrode and the second electrode;
a voltage supply circuit that is electrically coupled to one of the first electrode and the second electrode;
an output circuit that is electrically coupled to the second electrode and outputs a signal that corresponds to a potential of the second electrode; and
a detection circuit that detects a level of the signal from the output circuit,
in which a rate of change of a photoelectric conversion efficiency of the photoelectric converter with respect to a bias voltage, which is applied between the first electrode and the second electrode, when the bias voltage is in a first voltage range is greater than when the bias voltage is in a second voltage range that is higher than the first voltage range, and
the voltage supply circuit,
in a case where the level detected by the detection circuit is lower than a predetermined threshold value, applies a voltage to the one of the first electrode and the second electrode in such a way that a potential difference between the first electrode and the second electrode becomes a first potential difference, and,
in a case where the level detected by the detection circuit is greater than or equal to the threshold value, applies a voltage to the one of the first electrode and the second electrode in such a way that the potential difference between the first electrode and the second electrode becomes a second potential difference that is greater than the first potential difference.

According to the configuration of item 17, in a situation where the illuminance is high, the bias voltage that is applied between the first electrode and the second electrode increases, and therefore the photoelectric converter can be driven in a voltage region in which the rate of change in the photoelectric conversion efficiency with respect to the bias voltage is relatively small. As a result, it becomes possible to ensure linearity in a wider range, and the dynamic range can be expanded by means of electrical control. Furthermore, in a situation where the illuminance is low, the bias voltage applied between the first electrode and the second electrode can be made to be relatively low, and therefore the effect of suppressing power consumption can be expected.

[Item 18]

The imaging device according to item 17,
in which the voltage supply circuit,
in a case where the level detected by the detection circuit is lower than the threshold value, applies a first voltage to the one of the first electrode and the second electrode, and, in a case where the level detected by the detection circuit is greater than or equal to the threshold value, applies a second voltage that is higher than the first voltage to the one of the first electrode and the second electrode.

According to the configuration of item 18, in a situation where the illuminance is high, from among the mutually different voltages, the relatively high second voltage is selectively applied to the photoelectric converter from the voltage supply circuit. It therefore becomes possible to reduce power consumption.

[Item 19]

The imaging device according to item 18,
in which the output circuit includes:
a first signal detection transistor that has a gate electrically coupled to the second electrode, and receives a third voltage to one of a drain and a source; and
a second signal detection transistor that has a gate electrically coupled to the second electrode, and receives a fourth voltage that is higher than the third voltage to one of a drain and a source.

According to the configuration of item 19, a capacitor is coupled to the second electrode by way of a reset transistor when a signal is read, and therefore the level of input to a source follower, for example, can be temporarily reduced to a level that is less than a power source voltage. Therefore, even in a case such as where the potential of the second electrode exceeds the power source voltage, for example, it becomes possible to read a signal by means of a source follower without boosting the power source voltage.

[Item 20]

The imaging device according to item 18, in which the output circuit includes:

a capacitor; and a switching element that is coupled between the second electrode and the capacitor, and, in a case where the level detected by the detection circuit is greater than or equal to a threshold value, the switching element is set to on-state when the signal that corresponds to the potential of the second electrode and has been changed by photoelectric conversion in the photoelectric converter is read.

According to the configuration of item 20, whether or not signal reading is to be carried out can be switched by way of either of two source followers having mutually different magnitudes for source follower power sources, in accordance with the potential of the second electrode. It therefore becomes possible to read a signal even in a case such as where the potential of the second electrode exceeds the power source voltage, for example.

[Item 21]

The imaging device according to item 18, in which the output circuit includes a capacitor that has one electrode coupled to the second electrode, and, in a case where the level detected by the detection circuit is greater than or equal to a threshold value, a potential of another electrode of the capacitor is temporarily decreased when the signal that corresponds to the potential of the second electrode and has been changed by photoelectric conversion in the photoelectric converter is read.

According to the configuration of item 21, even in a case such as where the potential of the second electrode exceeds the power source voltage, the potential of the second electrode can be selectively lowered when a signal is read. Therefore, even in a case such as where the potential of the second electrode exceeds the power source voltage, for example, it becomes possible to read a signal by means of a source follower without boosting the power source voltage.

[Item 22]

The imaging device according to item 18, in which the output circuit includes:

a first signal detection transistor that has a gate electrically coupled to the second electrode; and an attenuator that is coupled between the second electrode and the gate of the first signal detection transistor, and, in a case where the level detected by the detection circuit is greater than or equal to a threshold value, the attenuator attenuates a voltage applied to the gate of the first signal detection transistor, by a predetermined proportion.

According to the configuration of item 22, even in a case such as where the potential of the second electrode exceeds the power source voltage, the level of input to a source follower, for example, can be attenuated by a predetermined proportion. Therefore, even in a case such as where the potential of the second electrode exceeds the power source voltage, for example, it becomes possible to read a signal by means of a source follower without boosting the power source voltage.

[Item 23]

The imaging device according to any one of items 18 to 22, in which a potential of the first electrode is higher than the potential of the second electrode in both of a state in which the first voltage is applied to the one of the first electrode and the second electrode and a state in which the second voltage is applied to the one of the first electrode and the second electrode.

According to the configuration of item 23, positive charges from among the charges generated by photoelectric conversion can be collected by the second electrode, and electron holes can be accumulated in a charge accumulation region as signal charges. Furthermore, the potential of the charge accumulation region gradually rises due to continued accumulation of the signal charges, and therefore the effective bias voltage according to the photoelectric conversion layer can be made to be less than the value of the second voltage.

[Item 24]

The imaging device according to any one of items 18 to 23, in which, in a graph of the photoelectric conversion efficiency of the photoelectric converter with respect to the bias voltage, when Vt is a value of the bias voltage corresponding to an intersecting point between a first tangent at a point where the photoelectric conversion efficiency rises from 0 and a second tangent at a point where the bias voltage is the largest value during operation, the first voltage range is a voltage range that is less than Vt.

[Item 25]

The imaging device according to any one of items 18 to 23, in which, in a graph of the photoelectric conversion efficiency of the photoelectric converter with respect to the bias voltage, when Vt is a value of the bias voltage corresponding to an intersecting point between a first tangent at a point where the value of the photoelectric conversion efficiency becomes 0.06 and a second tangent at a point where the bias voltage is the largest value during operation, the first voltage range is a voltage range that is less than Vt.

[Item 26]

The imaging device according to any one of items 18 to 23, in which the second voltage range is a voltage range in which a change in the photoelectric conversion efficiency with respect to a change of 1 V in the bias voltage is less than 10%.

[Item 27]

The imaging device according to any one of items 18 to 23, in which the second voltage range is a voltage range in which the photoelectric conversion efficiency is 0.7 or more.

According to the configuration of item 27, it is easy to achieve correspondence between the magnitude of the bias voltage applied between the first electrode and the second electrode and ISO numerical values.

[Item 28]

The imaging device according to any one of items 24 to 27, in which a first efficiency that is the photoelectric conversion efficiency of the photoelectric converter when the first voltage is being supplied is lower than a second efficiency that is the photoelectric conversion efficiency of the photoelectric converter when the second voltage is being supplied.

[Item 29]

The imaging device according to item 28, in which the first voltage and the second voltage are voltages within the second voltage range.

According to the configuration of item 29, an advantage can be obtained in that reliability is easily ensured since high-voltage elements are not required, and power saving and high-speed driving can be expected when the first voltage is being supplied.

[Item 30]

The imaging device according to item 29, in which the ratio of the second efficiency with respect to the first efficiency is 1 or more and 1.25 or less.

[Item 31]

The imaging device according to any one of items 17 to 30, further provided with a charge accumulation unit that is electrically coupled to the second electrode and temporarily accumulates charges collected by the second electrode, in which a potential of the charge accumulation unit increases together with accumulation of charges in the charge accumulation unit.

According to the configuration of item 31, high-voltage elements and element isolation regions are not required, and therefore reliability is easily ensured.

[Item 32]

The imaging device according to any one of items 17 to 31, including a plurality of pixels each having a photoelectric converter and an output circuit, the plurality of pixels including a first pixel and a second pixel that is arranged adjacent to the first pixel, and further provided with a third electrode that is located between the second electrode of the first pixel and the second electrode of the second pixel, and is electrically insulated from the second electrode of the first pixel and the second electrode of the second pixel.

According to the configuration of item 32, by adjusting the potential of the third electrode, it is possible for charges generated in the vicinity of the boundary between the two pixels to be preferentially collected by the third electrode. As a result, it becomes possible for the effective photoelectric conversion efficiency to be further decreased, and the dynamic range relating to the direction in which the illuminance is high to be further expanded.

[Item 33]

A camera system provided with:

an imaging device that has a photoelectric converter that includes a first electrode, a second electrode, and a photoelectric conversion layer located between the first electrode and the second electrode; and a voltage supply circuit that is electrically coupled to one of the first electrode and the second electrode, in which the imaging device further has:

an output circuit that is electrically coupled to the second electrode and outputs a signal that corresponds to a potential of the second electrode; and a detection circuit that detects a level of the signal from the output circuit, a rate of change of a photoelectric conversion efficiency of the photoelectric converter with respect to a bias voltage, which is applied between the first electrode and the second electrode, when the bias voltage is in a first voltage range is greater than when the bias voltage is in a second voltage range that is higher than the first voltage range, and the voltage supply circuit, in a case where the level detected by the detection circuit is lower than a predetermined threshold value, applies a voltage to the one of the first electrode and the second electrode in such a way that a potential difference between the first electrode and the second electrode becomes a first potential difference, and, in a case where the level detected by the detection circuit is greater than or equal to the threshold value, applies a voltage to the one of the first electrode and the second electrode in such a way that the potential difference between the first electrode and the second electrode becomes a second potential difference that is greater than the first potential difference.

According to the configuration of item 33, an effect that is similar to that of item 17 can be obtained.

[Item 34]

The camera system according to item 33, in which the voltage supply circuit, in a case where the level detected by the detection circuit is lower than the threshold value, applies a first voltage to the one of the first electrode and the second electrode, and, in a case where the level detected by the detection circuit is greater than or equal to the threshold value, applies a second voltage that is higher than the first voltage to the one of the first electrode and the second electrode.

According to the configuration of item 34, an effect that is similar to that of item 18 can be obtained.

[Item 35]

The camera system according to item 34, in which the output circuit includes:

a capacitor; and a switching element that is coupled between the second electrode and the capacitor, and, in a case where the level detected by the detection circuit is greater than or equal to a threshold value, the switching element is set to on-state when the signal that corresponds to the potential of the second electrode and has been changed by photoelectric conversion in the photoelectric converter is read.

According to the configuration of item 35, an effect that is similar to that of item 20 can be obtained.

[Item 36]

The camera system according to item 34, in which the output circuit includes a capacitor that has one electrode coupled to the second electrode, and, in a case where the level detected by the detection circuit is greater than or equal to a threshold value, a potential of another electrode of the capacitor is temporarily decreased when the signal that corresponds to the potential of the second electrode and has been changed by photoelectric conversion in the photoelectric converter is read.

According to the configuration of item 36, an effect that is similar to that of item 21 can be obtained.

[Item 37]

The camera system according to item 34, in which the output circuit includes:

a first signal detection transistor that has a gate electrically coupled to the second electrode; and an attenuator that is coupled between the second electrode and the gate of the first signal detection transistor, and, in a case where the level detected by the detection circuit is greater than or equal to a threshold value, the attenuator attenuates a voltage applied to the gate of the first signal detection transistor, by a predetermined proportion.

According to the configuration of item 37, an effect that is similar to that of item 22 can be obtained.

[Item 38]

A camera system provided with:

an imaging device that has a photoelectric converter that includes a first electrode, a second electrode, and a photoelectric conversion layer located between the first electrode and the second electrode; and a light quantity detector that detects a quantity of light incident on the photoelectric converter, in which the imaging device further has:

an output circuit that is electrically coupled to the second electrode and outputs a signal that corresponds to a potential of the second electrode; and a voltage supply circuit that is electrically coupled to one of the first electrode and the second electrode, a rate of change of a photoelectric conversion efficiency of the photoelectric converter with respect to a bias voltage, which is applied between the first electrode and the second electrode, when the bias voltage is in a first voltage range is greater than when the bias voltage is in a second voltage range that is higher than the first voltage range, and the voltage supply circuit, in a case where the quantity of light detected by the light quantity detector is less than a predetermined quantity of light, applies a voltage to the one of the first electrode and the second electrode in such a way that a potential difference between the first electrode and the second electrode becomes a first potential difference, and, in a case where the quantity of light detected by the light quantity detector is greater than or equal to the predetermined quantity of light, applies a voltage to the one of the first electrode and the second electrode in such a way that the potential difference between the first electrode and the second electrode becomes a second potential difference that is greater than the first potential difference.

According to the configuration of item 38, an effect that is similar to that of item 17 can be obtained.

[Item 39]

A camera system provided with:

an imaging device that has a photoelectric converter that includes a first electrode, a second electrode, and a photoelectric conversion layer located between the first electrode and the second electrode;

a voltage supply circuit that is electrically coupled to one of the first electrode and the second electrode; and a light quantity detector that detects a quantity of light incident on the photoelectric converter, in which a rate of change of a photoelectric conversion efficiency of the photoelectric converter with respect to a bias voltage, which is applied between the first electrode and the second electrode, when the bias voltage is in a first voltage range is greater than when the bias voltage is in a second voltage range that is higher than the first voltage range, the imaging device further has an output circuit that is electrically coupled to the second electrode and outputs a signal that corresponds to a potential of the second electrode, and the voltage supply circuit, in a case where the quantity of light detected by the light quantity detector is less than a predetermined quantity of light, applies a voltage to the one of the first electrode and the second electrode in such a way that a potential difference between the first electrode and the second electrode becomes a first potential difference, and, in a case where the quantity of light detected by the light quantity detector is greater than or equal to the predetermined quantity of light, applies a voltage to the one of the first electrode and the second electrode in such a way that the potential difference between the first electrode and the second electrode becomes a second potential difference that is greater than the first potential difference.

According to the configuration of item 39, an effect that is similar to that of item 17 can be obtained.

[Item 40]

The camera system according to item 38 or 39, in which the light quantity detector includes a light quantity detection circuit that detects the level of the signal from the output circuit.

According to the configuration of item 40, information relating to the quantity of light incident on the photoelectric converter can be obtained by way of detecting the level of the signal that is output from a pixel.

[Item 41]

The camera system according to any one of items 38 to 40, in which the voltage supply circuit, in a case where the quantity of light detected by the light quantity detector is less than the predetermined quantity of light, applies a first voltage to the one of the first electrode and the second electrode, and, in a case where the quantity of light detected by the light quantity detector is greater than or equal to the predetermined quantity of light, applies a second voltage that is higher than the first voltage to the one of the first electrode and the second electrode.

According to the configuration of item 41, an effect that is similar to that of item 18 can be obtained.

[Item 42]

The camera system according to item 34 or 41, in which the output circuit includes:

a first signal detection transistor that has a gate electrically coupled to the second electrode, and receives a third voltage to one of a drain and a source; and a second signal detection transistor that has a gate electrically coupled to the second electrode, and receives a fourth voltage that is higher than the third voltage to one of a drain and a source.

According to the configuration of item 42, an effect that is similar to that of item 19 can be obtained.

[Item 43]

The camera system according to item 41, in which the output circuit includes:

a capacitor; and a switching element that is coupled between the second electrode and the capacitor, and, in a case where the quantity of light detected by the light quantity detector is greater than or equal to the predetermined quantity of light, the switching element is set to on-state when the signal that corresponds to the potential of the second electrode and has been changed by photoelectric conversion in the photoelectric converter is read.

According to the configuration of item 43, an effect that is similar to that of item 20 can be obtained.

[Item 44]

The camera system according to item 41, in which the output circuit includes a capacitor that has one electrode coupled to the second electrode, and, in a case where the quantity of light detected by the light quantity detector is greater than or equal to the predetermined quantity of light, a potential of another electrode of the capacitor is temporarily decreased when the signal that corresponds to the potential of the second electrode and has been changed by photoelectric conversion in the photoelectric converter is read.

According to the configuration of item 44, an effect that is similar to that of item 21 can be obtained.

[Item 45]

The camera system according to item 41, in which the output circuit includes:

a first signal detection transistor that has a gate electrically coupled to the second electrode; and an attenuator that is coupled between the second electrode and the gate of the first signal detection transistor, and, in a case where the quantity of light detected by the light quantity detector is greater than or equal to a predetermined quantity of light, the attenuator attenuates a voltage applied to the gate of the first signal detection transistor, by a predetermined proportion.

According to the configuration of item 45, an effect that is similar to that of item 22 can be obtained.

[Item 46]

The camera system according to item 34, 35, 36, 37, 41, 42, 43, 44, or 45, in which a potential of the first electrode is higher than the potential of the second electrode in both of a state in which the first voltage is applied to the one of the first electrode and the second electrode and a state in which the second voltage is applied to the one of the first electrode and the second electrode.

According to the configuration of item 46, an effect that is similar to that of item 23 can be obtained.

[Item 47]

The camera system according to item 34, 35, 36, 37, 41, 42, 43, 44, 45, or 46, in which, in a graph of the photoelectric conversion efficiency of the photoelectric converter with respect to the bias voltage, when Vt is a value of the bias voltage corresponding to an intersecting point between a first tangent at a point where the photoelectric conversion efficiency rises from 0 and a second tangent at a point where the bias voltage is the largest value during operation, the first voltage range is a voltage range that is less than Vt.

[Item 48]

The camera system according to item 34, 35, 36, 37, 41, 42, 43, 44, 45, or 46, in which, in a graph of the photoelectric conversion efficiency of the photoelectric converter with respect to the bias voltage, when Vt is a value of the bias voltage corresponding to an intersecting point between a first tangent at a point where a value of the photoelectric conversion efficiency becomes 0.06 and a second tangent at a point where the bias voltage is the largest value during operation, the first voltage range is a voltage range that is less than Vt.

[Item 49]

The camera system according to item 34, 35, 36, 37, 41, 42, 43, 44, 45, or 46, in which the second voltage range is a voltage range in which a change in the photoelectric conversion efficiency with respect to a change of 1 V in the bias voltage is less than 10%.

[Item 50]

The camera system according to item 34, 35, 36, 37, 41, 42, 43, 44, 45, or 46, in which the second voltage range is a voltage range in which the photoelectric conversion efficiency is 0.7 or more.

According to the configuration of item 50, an effect that is similar to that of item 27 can be obtained.

[Item 51]

The camera system according to any one of items 47 to 50, in which a first efficiency that is the photoelectric conversion efficiency of the photoelectric converter when the first voltage is being supplied is lower than a second efficiency that is the photoelectric conversion efficiency of the photoelectric converter when the second voltage is being supplied.

[Item 52]

The camera system according to item 51, in which the first voltage and the second voltage are voltages within the second voltage range.

According to the configuration of item 52, an effect that is similar to that of item 29 can be obtained.

[Item 53]

The camera system according to item 52, in which the ratio of the second efficiency with respect to the first efficiency is 1 or more and 1.25 or less.

[Item 54]

The camera system according to any one of items 33 to 53, further provided with a charge accumulation unit that is electrically coupled to the second electrode and temporarily accumulates charges collected by the second electrode, in which a potential of the charge accumulation unit increases together with accumulation of charges in the charge accumulation unit.

According to the configuration of item 54, an effect that is similar to that of item 31 can be obtained.

[Item 55]

The camera system according to any one of items 33 to 54, in which the imaging device includes a plurality of pixels each having a photoelectric converter and an output circuit, the plurality of pixels include a first pixel and a second pixel that is arranged adjacent to the first pixel, and the imaging device is further provided with a third electrode that is located between the second electrode of the first pixel and the second electrode of the second pixel, and is electrically insulated from the second electrode of the first pixel and the second electrode of the second pixel.

According to the configuration of item 55, an effect that is similar to that of item 32 can be obtained.

[Item 56]

A driving method of an imaging device that has a photoelectric converter that includes a first electrode, a second electrode, and a photoelectric conversion layer located between the first electrode and the second electrode, in which, in a case where a quantity of light incident on the photoelectric converter is less than a predetermined quantity of light, a voltage is applied to one of the first electrode and the second electrode in such a way that a potential difference between the first electrode and the second electrode becomes a first potential difference, and, in a case where the quantity of light incident on the photoelectric converter is greater than or equal to the predetermined quantity of light, a voltage is applied to the one of the first electrode and the second electrode in such a way that the potential difference between the first electrode and the second electrode becomes a second potential difference that is greater than the first potential difference.

According to the configuration of item 56, it is possible to expand the dynamic range relating to the direction in which the illuminance is high, by means of electrical control.

[Item 57]

The driving method of an imaging device according to item 56, in which, in a case where a quantity of light incident on the photoelectric converter is less than the predetermined quantity of light, a first voltage is applied to one of the first electrode and the second electrode, and, in a case where the quantity of light incident on the photoelectric converter is greater than or equal to the predetermined quantity of light, a second voltage that is higher than the first voltage is applied to the one of the first electrode and the second electrode.

According to the configuration of item 57, an effect that is similar to that of item 18 can be obtained.

Hereinafter, embodiments of the present disclosure will be described in detail with reference to the drawings. It should be noted that the embodiments described hereinafter all represent general or specific examples. The numerical values, the shapes, the materials, the constituent elements, the arrangement of the constituent elements, the mode of connection, the steps, and the order of the steps and so forth given in the following embodiments are examples and are not intended to restrict the present disclosure. The various aspects described in the present specification may be combined with each other provided there are no resulting inconsistencies. Furthermore, from among the constituent elements in the following embodiments, constituent elements that are not mentioned in the independent claims indicating the most significant concepts are described as optional constituent elements. In the following description, constituent elements having substantially the same functions are denoted by common reference characters, and descriptions thereof are sometimes omitted. Furthermore, some elements are sometimes not depicted to avoid the drawings becoming overly complicated.

First Embodiment

FIG. 1 schematically depicts a configuration of an imaging device according to a first embodiment of the present disclosure. An imaging device 100A depicted in FIG. 1 has a plurality of pixels Px each including in a portion thereof a photoelectric converter supported on a semiconductor substrate 110. Although not depicted in FIG. 1, the semiconductor substrate 110 has a plurality of output circuits formed respectively corresponding to the pixels Px.

The plurality of pixels Px are arranged two-dimensionally, for example, on the semiconductor substrate 110, and thereby form an imaging region. The quantity and arrangement of the pixels Px are not restricted to the example depicted in FIG. 1 and are arbitrary. For example, by arranging the plurality of pixels Px one-dimensionally, the imaging device 100A can be used as a line sensor.

As described in detail hereinafter with reference to the drawings, the photoelectric converter of each pixel Px has a pixel electrode, a transparent opposite electrode, and a photoelectric conversion layer sandwiched between these electrodes. Typically, a plurality of pixel electrodes are arranged in the imaging region corresponding to the pixels Px, whereas an opposite electrode is provided in the form of a single electrode layer that is continuous among the plurality of pixels Px. That is, typically, the potential of the opposite electrode is common among the plurality of pixels Px. Similarly for the photoelectric conversion layer, a continuous single photoelectric conversion structure can be shared among the plurality of pixels Px. In other words, the photoelectric converter of each pixel Px includes part of a single transparent electrode that is continuous among the plurality of pixels Px and part of a continuous single photoelectric conversion structure.

In the configuration exemplified in FIG. 1, the imaging device 100A includes a row scanning circuit 120 that is coupled to each pixel Px via row signal lines Ri, and a detection circuit 130A that is coupled to each pixel Px via output signal lines $S_j$. Here, the subscript m and n appended to the reference characters in FIG. 1 independently represent an integer greater than or equal to 1. The row signal lines $R^i$ are provided for each row of the plurality of pixels Px, and are electrically coupled to one or more pixels Px belonging to the same row. In FIG. 1, for simplicity, the row signal lines $R_i$ are representatively depicted as signal lines coupled to the row scanning circuit 120; however, it is also possible for two or more signal lines to be provided for each row of the plurality of pixels Px. The output signal lines $S_j$ are provided for each column of the plurality of pixels Px, and are electrically coupled to the output circuit of one or more pixels Px belonging to the same row. As depicted, each of the output signal lines $S_j$ is coupled to the detection circuit 130A.

Typically, the detection circuit 130A includes in a portion thereof a circuit for carrying out noise-suppression signal processing represented by correlated double sampling, analog-digital conversion, and the like. Pixel signals that express an image of an object are read to outside of the imaging device 100A as an output of the detection circuit 130A.

Here, the detection circuit 130A has the function of detecting the level of output signals that are read from the pixels Px via the output signal lines $S_j$. In this example, a reference line 132 is coupled to the detection circuit 130A. Voltage $V_{ref}$ is applied to the reference line 132 during operation. The detection circuit 130A may have one or more comparators 134 that output comparison results of the voltage level of each output signal line Sj, which is the voltage level of each output signal line $S_j$, and the voltage level of the reference line 132, for example. The comparison of the voltage levels may be executed in the form of comparing analog values or may be executed in the form of comparing digital values.

In the configuration exemplified in FIG. 1, the imaging device 100A also has a voltage supply circuit 150 and a control circuit 160. The voltage supply circuit 150 is coupled to a voltage line 152 that is coupled to the aforementioned opposite electrode, for example, and is thereby coupled to each pixel Px. The voltage supply circuit 150 supplies a predetermined voltage via the voltage line 152 to the photoelectric converter of each pixel Px during operation of the imaging device 100A.

The voltage supply circuit 150 is configured so as to be able to at least switch between and apply two or more different voltages to the voltage line 152. The voltage that is output from the voltage supply circuit 150 may be altered in steps or may be altered continuously. The voltage supply circuit 150 is not restricted to a specific power source circuit, and may be a circuit that converts a voltage supplied from a power source such as a battery into a predetermined voltage, or may be a circuit that generates a predetermined voltage. The voltage supply circuit 150 may be part of the row scanning circuit 120.

The control circuit 160 receives command data, a clock, and the like supplied from outside, for example, for the imaging device 100A and controls the entirety of the imaging device 100A. The control circuit 160 can be realized by means of a microcontroller including one or more processors, for example. The control circuit 160 can include one or more memories. In the configuration exemplified in FIG. 1, the control circuit 160 includes in a portion thereof a memory 162. The memory 162 may be provided in the form of a chip or a package separate from the imaging device 100A.

In this example, an image processing circuit 164 is coupled to the control circuit 160. The image processing circuit 164 can be realized by means of a digital signal processor (DSP), an image signal processor (ISP), an field-programmable gate array (FPGA), or the like. The image processing circuit 164 may be part of the control circuit 160.

Typically, the control circuit 160 has a timing generator, and supplies drive signals to the row scanning circuit 120, the detection circuit 130A, the voltage supply circuit 150, and the like. In FIG. 1, the arrow extending to the control circuit 160 and the arrows extending from the control circuit 160 schematically represent an input signal to the control circuit 160 and output signals from the control circuit 160, respectively. Furthermore, in this example, the control circuit 160 is configured so as to receive comparison results between the level of the output signals from the pixels Px of each column and the voltage level of the reference line 132 from the detection circuit 130A, and supply drive signals corresponding to the voltage level comparison results to the voltage supply circuit 150.

In a case where, for example, the level of the output signals detected by the detection circuit 130A is lower than the voltage level of the reference line 132, on the basis of a drive signal from the control circuit 160, the voltage supply circuit 150 applies a voltage to the voltage line 152 such that a potential difference applied between the opposite electrode and the pixel electrode of the photoelectric converters becomes a first potential difference. In a case where the level of the output signals detected by the detection circuit 130A is greater than or equal to the voltage level of the reference line 132, a voltage is applied to the voltage line 152 such that the potential difference applied between the opposite electrode and the pixel electrode becomes a second potential difference that is greater than the first potential difference. The voltage supply circuit 150, for example, applies a first voltage V1 to the voltage line 152 in a case where the level of the output signals detected by the detection circuit 130A is lower than the voltage level of the reference line 132, and applies a second voltage V2 that is higher than the first voltage V1 in a case where the level of the output signals detected by the detection circuit 130A is greater than or equal to the voltage level of the reference line 132. Typically, in a case where the illuminance on the photoelectric converters is comparatively high, the level of the output signals from the detection circuit 130A is greater than or equal to the voltage level of the reference line 132. That is, in the present embodiment, the potential difference applied between the opposite electrode and the pixel electrode of the photoelectric converters is controlled by changing the voltage applied to the opposite electrode, for example, of the photoelectric converters in accordance with the illuminance on the photoelectric converters.

In a case where the level of the output signals detected by the detection circuit 130A is lower than the voltage level of the reference line 132, for example, in a case where the first voltage V1 is applied to the voltage line 152 and the illuminance on the photoelectric converters is comparatively high, the relatively high second voltage V2 is applied to the voltage line 152. According to this kind of mode, the voltage applied to the photoelectric converters is increased as required, and it is therefore possible to suppress power consumption in a standard photographing mode.

As described in detail hereinafter, the photoelectric converters of the pixels Px can have photoelectric conversion characteristics in which the photoelectric conversion efficiency increases in accordance with an increase in a bias voltage between the opposite electrode and the pixel electrode. Furthermore, the photoelectric converters typically have photoelectric conversion characteristics with which, when the bias voltage applied between the pixel electrode and the opposite electrode is in a second voltage range that is higher than the first voltage range, the rate of change in the photoelectric conversion efficiency decreases compared to when the bias voltage is in the first voltage range. By means of control that increases the bias voltage between the opposite electrode and the pixel electrode in a case where the level of the output signals is greater than or equal to a predetermined level, in a situation where the illuminance is high, the photoelectric converters can be driven in a voltage region with which the photoelectric conversion efficiency indicates a linear change with respect to a change in the potential difference between the pixel electrode and the opposite electrode. It thereby becomes possible to use a wider voltage region while guaranteeing linearity. In addition, power consumption can be suppressed by using a relatively low bias voltage in a standard photographing mode. In other words, the effects of expanding the dynamic range by means of electrical control and suppressing power consumption can be obtained. In this way, according to the embodiments of the present disclosure, sensitivity is adjusted by means of electrical control in accordance with the illuminance, and therefore the effect of suppressing power consumption can be obtained while enabling photographing at a sensitivity that corresponds to the environment in which photographing is carried out.

The function of the control circuit 160 may be realized by means of a combination of a general-purpose processing circuit and software, or may be realized by means of hardware specifically for this kind of processing. It should be noted that, in the example depicted in FIG. 1, the row scanning circuit 120, the detection circuit 130A, the voltage supply circuit 150, and the control circuit 160 are integrally formed on the semiconductor substrate 110 on which the plurality of pixels Px are arranged. For example, the control circuit 160 can be an integrated circuit formed on the semiconductor substrate 110. Due to these circuits being arranged on the semiconductor substrate 110 on which the output circuits of each pixel Px are formed, it becomes possible to integrally form these circuits on the semiconductor substrate 110 together with the output circuits of each pixel Px, by applying a process that is similar to the process of forming the output circuits of each pixel Px. However, it is not essential for all of these circuits to be integrally formed on the semiconductor substrate 110 together with the output circuits of each pixel Px. It is also possible for some or all of these circuits to be arranged on a substrate that is different from the semiconductor substrate 110 on which the output circuits of each pixel Px are formed. In this case, the imaging device 100A can be provided in the form of a package in which the semiconductor substrate 110 on which the plurality of pixels Px are formed, the row scanning circuit 120, the detection circuit 130A, the voltage supply circuit 150, and the control circuit 160 are integrated.

In the aforementioned example, the control circuit 160 detects the level of the output signals from each pixel Px by means of the detection circuit 130A, and determines whether the quantity of light incident on the photoelectric converters is greater than or equal to a predetermined quantity of light by means of a comparison based on the voltage level of the reference line 132. In other words, the control circuit 160 executes a determination in which the voltage level of the reference line 132 is used as a threshold value. However, the method of determining whether the quantity of light incident on photoelectric converters is greater than or equal to the predetermined quantity of light is not restricted to this example.

For example, the detection circuit 130A may be configured so as to include an analog-digital conversion circuit and to output digital data that expresses the magnitude of the voltages of the output signal lines S detected, to the control circuit 160 or the image processing circuit 164. In this case, a threshold value for determining whether the quantity of light incident on photoelectric converters is greater than or equal to the predetermined quantity of light can be stored in advance in the memory 162, for example. In a case where, for example, a digital value received from the detection circuit 130A is lower than the threshold value retained in the memory 162, the control circuit 160 determines that the quantity of light incident on the photoelectric converters is lower than the predetermined quantity of light. In addition, the control circuit 160 executes control in which a voltage is applied to the voltage line 152 to cause the potential difference between the opposite electrode and the pixel electrode to be a first potential difference that is relatively small. For example, the control circuit 160 causes the voltage supply circuit 150 to be driven in such a way that the relatively low first voltage V1 is applied to the voltage line 152.

(Exemplary Configuration of Pixels Px)

Figure 2:
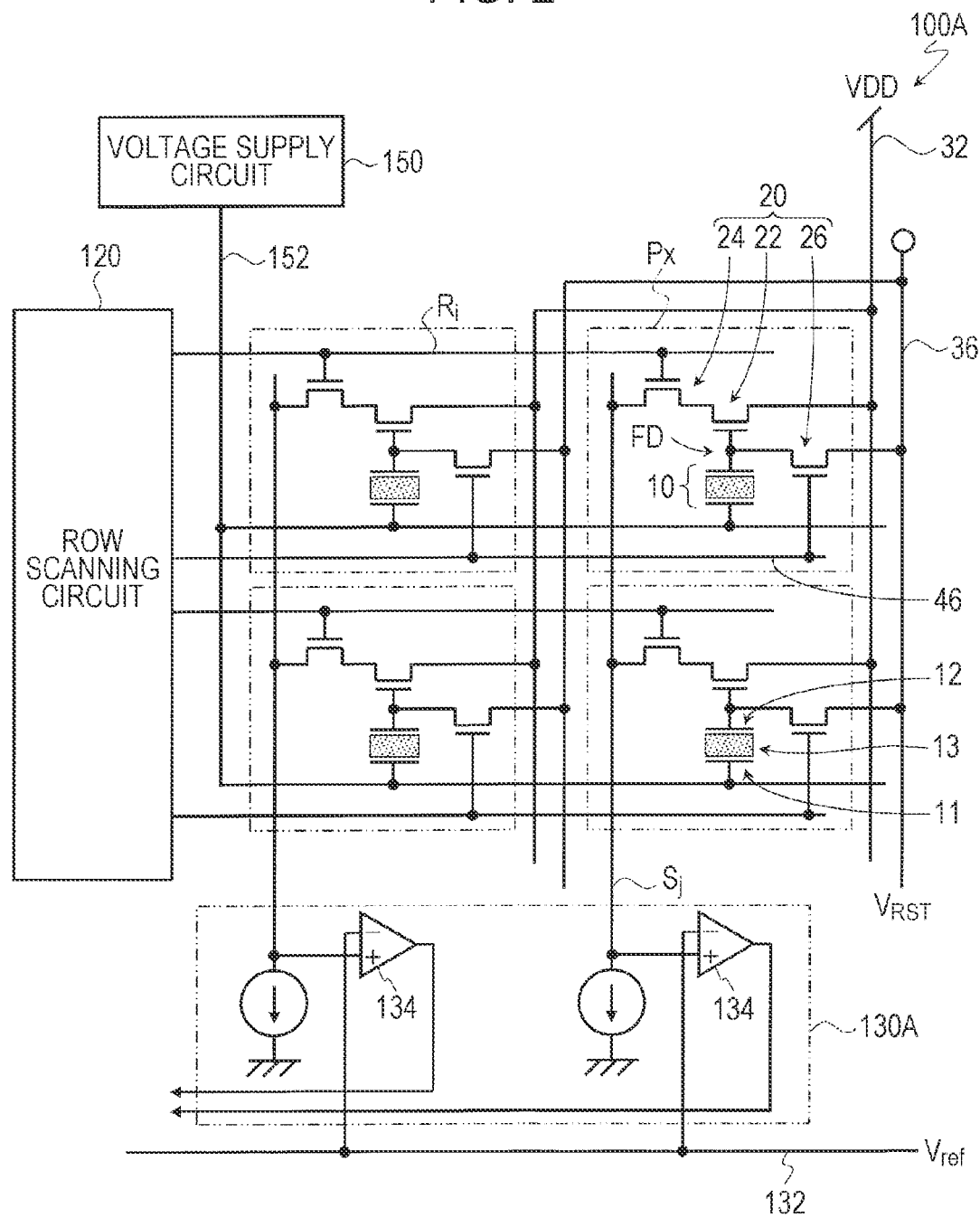
FIG. 2 is a drawing depicting an exemplary circuit configuration of the imaging device depicted in FIG. 1.

FIG. 2 depicts an exemplary circuit configuration of the imaging device 100A. Four pixels are extracted from the plurality of pixels Px included in the imaging region depicted in FIG. 1 and schematically depicted in FIG. 2.

Each pixel Px includes a photoelectric converter 10 and an output circuit 20 that is electrically coupled to the photoelectric converter 10. In the configuration exemplified in FIG. 2, the output circuit 20 includes a signal detection transistor 22, an address transistor 24, and a reset transistor 26. The signal detection transistor 22, the address transistor 24, and the reset transistor 26 are typically field-effect transistors formed on the semiconductor substrate 110, and, hereinafter, an example is described in which N-channel MOS transistors are used as the transistors unless otherwise particularly specified.

As schematically depicted in FIG. 2, the photoelectric converter 10 includes an opposite electrode 11 serving as a first electrode, a pixel electrode 12 serving as a second electrode, and a photoelectric conversion layer 13 sandwiched between the opposite electrode 11 and the pixel electrode 12. The opposite electrode 11 is transparent. It should be noted that the word "transparent" in the present specification means that at least a portion of light of a wavelength that can be absorbed by the photoelectric conversion layer 13 is transmitted, and it is not essential for light to be transmitted across the entire wavelength range of visible light.

As depicted, the opposite electrode 11 of each pixel Px is electrically coupled to the voltage line 152. Consequently, the voltage supply circuit 150 is able to selectively apply the first voltage V1 or the second voltage V2, for example, collectively to the opposite electrodes 11 of the plurality of pixels Px via the voltage line 152. In FIG. 2, it is depicted as if the voltage line 152 is coupled to each opposite electrode 11 of the plurality of pixels Px. However, typically, the opposite electrode 11 of each pixel Px is a single transparent electrode that is continuous among the plurality of pixels Px, and it is not necessary for the voltage line 152 to be a wire that branches into a plurality.

Meanwhile, the pixel electrode 12 is provided electrically isolated in each pixel Px. As depicted, the pixel electrode 12 of each pixel Px is coupled to the gate of the signal detection transistor 22 of the corresponding output circuit 20. The source of the signal detection transistor 22 is coupled to the corresponding output signal line $S_j$ via the address transistor 24. The drain of the signal detection transistor 22 is coupled to a power source line 32. The power source line 32 functions as a source-follower power source due to a power source voltage VDD of approximately 3.3 V applied during operation.

The gate of the address transistor 24 is coupled to a row signal line $R_i$. The row scanning circuit 120 can switch the address transistors 24 between on-state and off-state and can read signals from the pixels Px of a selected row to an output signal line $S_j$, by controlling the voltage levels applied to the row signal lines Ri.

In this example, the output circuit 20 includes the reset transistor 26. One of the source and the drain of the reset transistor 26 is coupled to a node FD. The node FD electrically couples the photoelectric converter 10 to the gate of the signal detection transistor 22. The other of the source and the drain of the reset transistor 26 is coupled to a reset voltage line 36. A predetermined reset voltage $V_{RST}$ is applied to the reset voltage line 36 during operation of the imaging device 100A. Typically, as depicted, a reset signal line 46 is coupled in common to the gates of the reset transistors 26 of the plurality of pixels Px belonging to the same row.

In this example, the reset signal line 46 is coupled to the row scanning circuit 120. The row scanning circuit 120 switches the reset transistors 26 to on-state in units of rows of the plurality of pixels Px by controlling the voltage level applied to the reset signal line 46. Thus, the potential of the node FD of a pixel Px in which the reset transistor 26 has been switched to on-state can be reset to $V_{RST}$. If the voltage applied to the opposite electrode 11 of each pixel Px from the voltage supply circuit 150 is taken as V1 or V2, a bias voltage that is applied between the pixel electrode 12 and the opposite electrode 11 immediately after a reset is (V1−$V_{RST}$) or (V2−$V_{RST}$). As described hereinafter, in the embodiments of the present disclosure, specific values of these voltages can be selected such that (V1−$V_{RST}$)>0 and (V2−$V_{RST}$)>0 are satisfied.

Figure 3A:
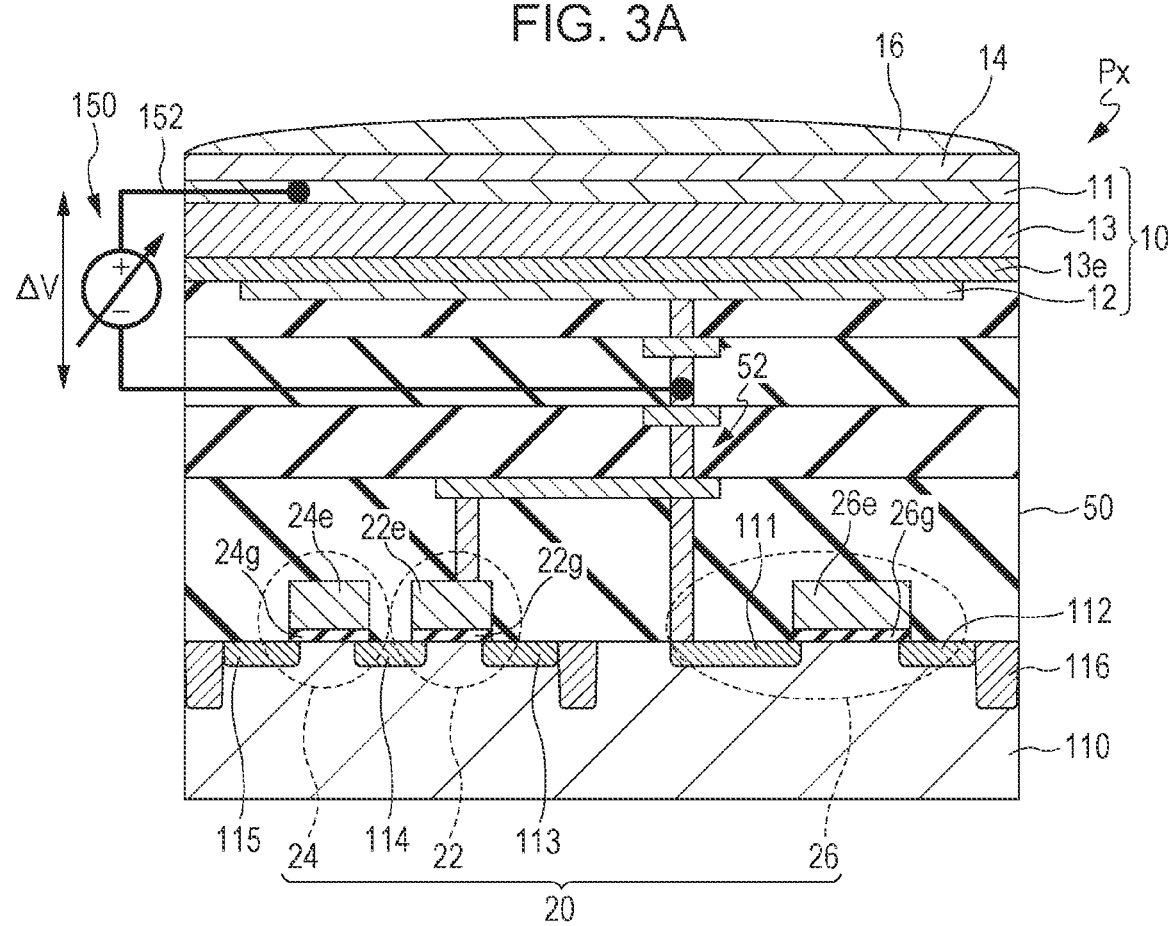
FIG. 3A is a cross-sectional view schematically depicting an exemplary device structure of a pixel.

FIG. 3A depicts an exemplary device structure of a pixel Px. The semiconductor substrate 110 has impurity regions 111 to 115 and element isolation regions 116. The element isolation regions 116 electrically isolate the output circuit 20 provided in each pixel Px, between the pixels Px. Hereinafter, a P-type silicon substrate is given as an example of the semiconductor substrate 110. The impurity regions 111 to 115 are typically N-type diffusion regions. The semiconductor substrate 110 may be an insulating substrate having a semiconductor layer provided on the surface thereof or the like.

The signal detection transistor 22 includes the impurity regions 113 and 114 from among the impurity regions 111 to 115, agate insulation layer 22g on the semiconductor substrate 110, and a gate electrode 22e on the gate insulation layer 22g. The impurity region 113 functions as a drain region of the signal detection transistor 22. The impurity region 114 functions as a source region of the signal detection transistor 22. In the configuration depicted, the address transistor 24 shares the impurity region 114 with the signal detection transistor 22. The address transistor 24 includes a gate insulation layer 24g on the semiconductor substrate 110, a gate electrode 24e on the gate insulation layer 24g, and the impurity region 115. The impurity region 115 functions as a source region of the address transistor 24.

The reset transistor 26 includes the impurity regions 111 and 112, a gate insulation layer 26g on the semiconductor substrate 110, and a gate electrode 26e on the gate insulation layer 26g. Although not depicted in FIG. 3A, the aforementioned reset voltage line 36, for example, is coupled to the impurity region 112. It should be noted that the aforementioned power source line 32 is coupled to the impurity region 113 serving as the drain region of the signal detection transistor 22. An aforementioned output signal line $S_j$ is coupled to the impurity region 115 serving as the source region of the address transistor 24. As schematically depicted in FIG. 3A, an element isolation region 116 is provided between the reset transistor 26 and the signal detection transistor 22.

An interlayer insulating layer 50 covers the signal detection transistor 22, the address transistor 24, and the reset transistor 26 formed on the semiconductor substrate 110. The photoelectric converter 10 of each pixel Px is supported by the interlayer insulating layer 50. The interlayer insulating layer 50 includes a plurality of insulating layers each formed from silicon dioxide, for example.

The opposite electrode 11 of the photoelectric converter 10 is located at the side where light from an object is incident, and is typically formed from a transparent electrically conductive material such as ITO. As mentioned above, the opposite electrode 11 is typically provided in the form of a single electrode layer that is continuous across the plurality of pixels Px. An optical filter 14 such as a color filter, a microlens 16 may be arranged on a main surface, at the opposite side of the opposite electrode 11 to the photoelectric conversion layer 13.

The photoelectric conversion layer 13 located between the opposite electrode 11 and the pixel electrode 12 is formed from an organic material or an inorganic material such as amorphous silicon, and receives incident light via the opposite electrode 11 and causes excitons to be generated. The photoelectric conversion layer 13 may include a layer configured from an organic material and a layer configured from an inorganic material. Similar to the opposite electrode 11, the photoelectric conversion layer 13 is typically provided in the form of a single photoelectric conversion structure that is continuous across the plurality of pixels Px.

The pixel electrode 12 is located nearer the semiconductor substrate 110 than the photoelectric conversion layer 13, and is spatially separated from the pixel electrodes 12 of other adjacent pixels Px and is thereby electrically isolated therefrom. The pixel electrode 12 can be formed from a metal such as aluminum or copper, a metal nitride, polysilicon imparted with conductivity due to being doped with an impurity, for example.

Each pixel Px has a conductive structure 52 inside the interlayer insulating layer 50. The conductive structure 52 electrically couples the pixel electrode 12 to the output circuit 20 including the signal detection transistor 22 and the like. The conductive structure 52 includes a via formed from a metal such as copper, a plug formed from polysilicon, or the like, and electrically couples the pixel electrode 12 and the impurity region 111 formed in the semiconductor substrate 110 to each other, as schematically depicted in FIG. 3A. This conductive structure 52 is also coupled to the gate electrode 22e of the signal detection transistor 22. In other words, the output circuit 20 outputs a signal that corresponds to the potential of the pixel electrode 12 to the corresponding output signal line $S_j$ by means of a source follower that includes the signal detection transistor 22.

During operation, a potential difference ΔV is applied between the opposite electrode 11 and the pixel electrode 12 as schematically depicted in FIG. 3A, due to a predetermined voltage applied to the opposite electrode 11 from the voltage supply circuit 150 via the voltage line 152. Here, the voltage supply circuit 150 applies a voltage to the opposite electrode 11 such that the potential of the opposite electrode 11 becomes higher than the potential of the pixel electrode 12, based on the pixel electrode 12. By making the potential of the opposite electrode 11 higher than the potential of the pixel electrode 12, from among positive and negative charges generated in the photoelectric conversion layer 13 due to the incidence of light, charges having a positive polarity, such as electron holes, can be collected by the pixel electrode 12 as signal charges. Hereinafter, unless otherwise specified, an example in which electron holes are used as signal charges will be described. It should be noted that, in the example depicted in FIG. 3A, an electron blocking layer 13e is arranged between the photoelectric conversion layer 13 and the pixel electrode 12, and the injection of electrons into the pixel electrode 12 from the photoelectric conversion layer 13 is suppressed. The electron blocking layer 13e may have a photoelectric conversion function.

In a typical embodiment of the present disclosure, a first voltage V1 and a second voltage V2 with which the potential of the opposite electrode 11 becomes higher than the potential of the pixel electrode 12 are used in either of a state in which the first voltage V1 is applied to the voltage line 152 from the voltage supply circuit 150 and a state in which the second voltage V2 is applied to the voltage line 152 from the voltage supply circuit 150. It should be noted that the potential of the pixel electrode 12 is determined according to the aforementioned reset voltage $V_{RST}$ that is supplied via the reset transistor 26. Consequently, in a typical embodiment of the present disclosure, $(V1-V_{RST})>0$ and $(V2-V_{RST})>0$ are satisfied. A positive voltage of 0 V or in the vicinity of 0 V, for example, is used as the reset voltage $V_{RST}$.

The impurity region 111 is coupled to the conductive structure 52 in the interlayer insulating layer 50. A P-N junction formed in the semiconductor substrate 110 by the impurity region 111 functions as a charge accumulation capacitance in which positive charges, such as electron holes, collected by the pixel electrode 12 are temporarily accumulated. In a typical embodiment of the present disclosure, electron holes are used as signal charges, and therefore the potential of the impurity region 111 serving as a charge accumulation unit increases together with the accumulation of signal charges in the impurity region 111.

Figure 3B:
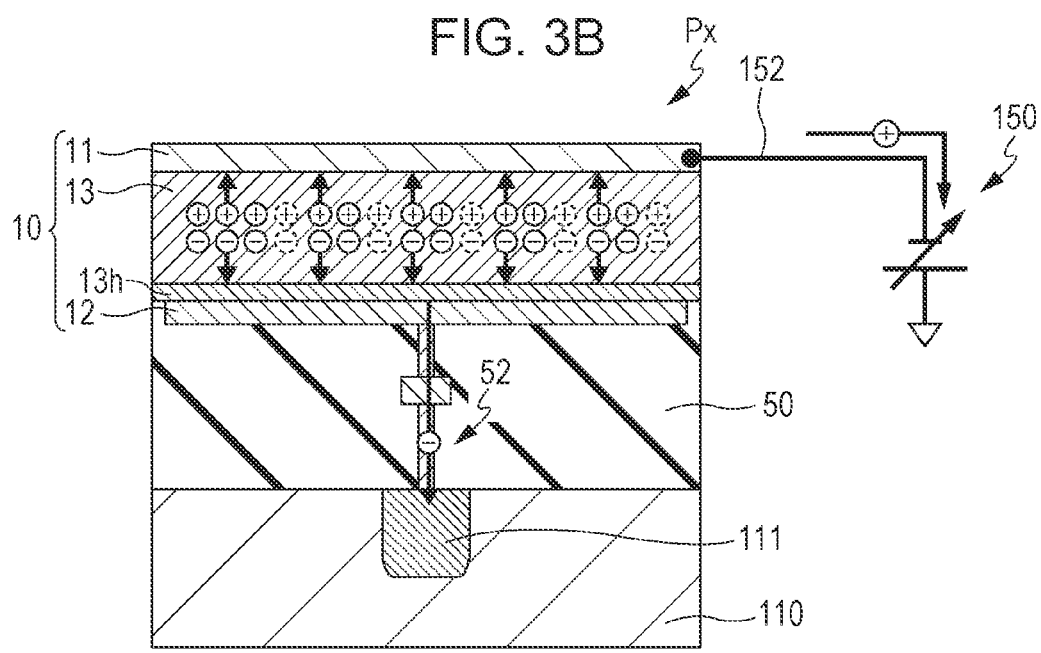
FIG. 3B is a schematic cross-sectional view for describing an operation of the pixel in a case where electrons are used as signal charges.

By applying a voltage to the opposite electrode 11 such that the potential of the opposite electrode 11 becomes lower than that of the pixel electrode 12, it goes without saying that it is also possible for electrons to be used as signal charges, for example. FIG. 3B is a schematic cross-sectional view for describing an operation of the pixels Px in a case where electrons are used as signal charges. In a case where negative charges are to be collected by the pixel electrode 12, for example, it is sufficient that a voltage is applied to the opposite electrode 11 such that the potential of the pixel electrode 12 becomes higher than the potential of the opposite electrode 11. In the configuration exemplified in FIG. 3B, an electron-hole blocking layer 13h is arranged between the photoelectric conversion layer 13 and the pixel electrode 12, and the injection of electron holes into the pixel electrode 12 from the photoelectric conversion layer 13 is suppressed.

With this case also, the control circuit 160 causes a predetermined voltage to be output from the voltage supply circuit 150 such that the potential difference applied between the opposite electrode 11 and the pixel electrode 12 becomes the first potential difference, in a case where the level of the output signals detected by the detection circuit 130A is less than the voltage level of the reference line 132, for example. Furthermore, in a case where the level of the output signals detected by the detection circuit 130A is greater than or equal to the voltage level of the reference line 132, the control circuit 160 causes a voltage to be output from the voltage supply circuit 150 such that the potential difference applied between the opposite electrode 11 and the pixel electrode 12 becomes a second potential difference that is greater than the first potential difference. It should be noted that, in a configuration in which electrons are accumulated as signal charges, the potential of the impurity region 111 serving as a charge accumulation unit decreases together with the accumulation of signal charges in the impurity region 111.

(Exemplary Photoelectric Conversion Characteristics of Photoelectric Conversion Layer)

Here, a description will be given regarding a relationship between the photoelectric conversion characteristics of the photoelectric conversion layer 13 and the voltage supplied to the voltage line 152 by the voltage supply circuit 150. Hereinafter, unless otherwise specified, an example in which electron holes are used as signal charges will be described.

Figure 4:
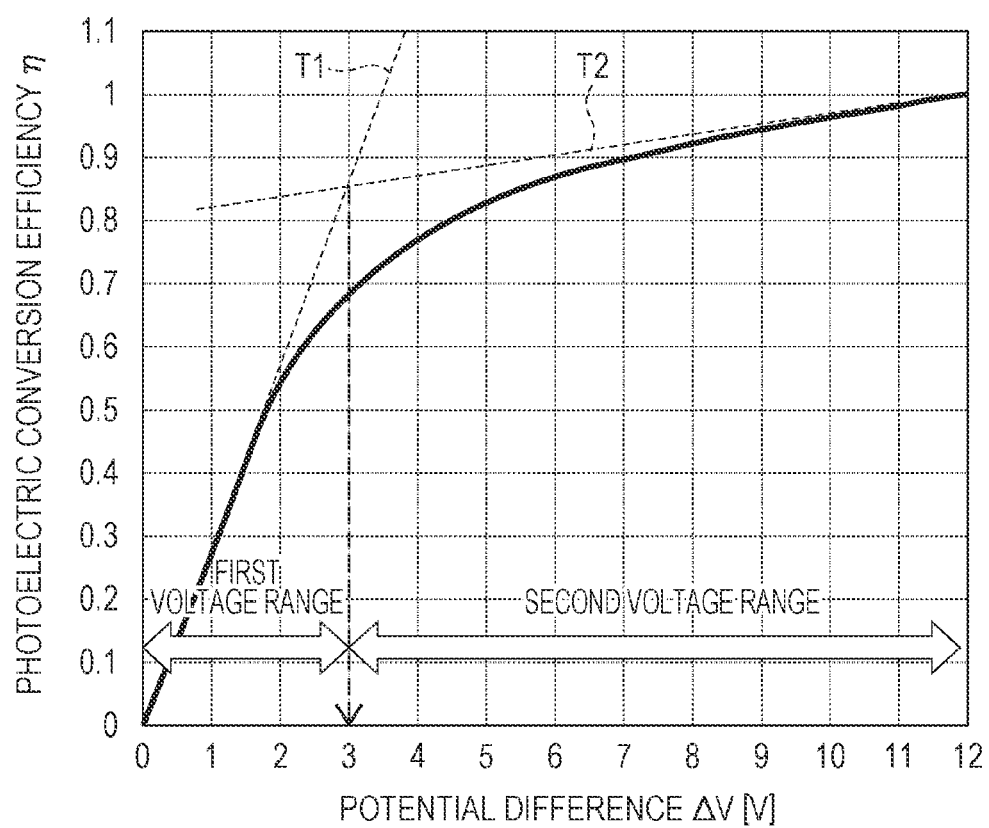
FIG. 4 is a drawing depicting a typical example of the photoelectric conversion characteristics of a photoelectric conversion layer.

FIG. 4 depicts a typical example of the photoelectric conversion characteristics of the photoelectric conversion layer 13. In FIG. 4, the horizontal axis represents the potential difference $\Delta V$ applied between the opposite electrode 11 and the pixel electrode 12, and the vertical axis represents the photoelectric conversion efficiency $\eta$ of the photoelectric conversion layer 13. Here, the photoelectric conversion efficiency $\eta$ means the ratio per unit second of the number of charges collected by the pixel electrode 12, with respect to the number of photons incident on the photoelectric converter 10, for one pixel Px. It should be noted that the number of charges is a number that is measured with elementary electric charge as a unit.

As exemplified in FIG. 4, in the embodiments of the present disclosure, a change is indicated in which the photoelectric conversion efficiency $\eta$ of the photoelectric conversion layer 13 generally increases with an upwardly convex curved form with respect to an increase in the potential difference $\Delta V$ applied between the opposite electrode 11 and the pixel electrode 12. A photoelectric conversion layer having photoelectric conversion characteristics such as those depicted in FIG. 4 can be realized by using organic photoelectric conversion materials that are generally applied in the forming of an organic photoelectric conversion film and combinations thereof.

In the example depicted in FIG. 4, the photoelectric conversion efficiency $\eta$ indicates a comparatively sharp increase with respect to a change in the potential difference $\Delta V$ in a voltage region having a comparatively low potential difference $\Delta V$ of approximately 0 to 3 V, and indicates a comparatively gentle increase with respect to a change in the potential difference $\Delta V$ in a voltage region having a comparatively high potential difference $\Delta V$ of approximately 3 V or more. In the present specification, a voltage range in which the photoelectric conversion efficiency $\eta$ indicates a comparatively sharp increase with respect to a change in the potential difference $\Delta V$ applied between the opposite electrode 11 and the pixel electrode 12 is referred to as a first voltage range, and a voltage range in which the photoelectric conversion efficiency $\eta$ indicates a comparatively gentle increase with respect to a change in the potential difference $\Delta V$ is referred to as a second voltage range.

As depicted in FIG. 4, a change in the level of the signals with respect to a change in the quantity of light incident on the photoelectric converters 10, in the second voltage range is relatively small compared to that in the first voltage range, and, in the example depicted in FIG. 4, it can be said that the photoelectric converters 10 indicate photoelectric conversion characteristics that are comparatively flat in the second voltage range. The second voltage range, for example, can be a voltage region in which a change in the level of the signals with respect to a change in the quantity of light incident on the photoelectric converters 10 is 25% or less. "A change in the level of the signals with respect to a change in the quantity of incident light being 25% or less" is a change that corresponds to ⅓ of the difference between two adjacent levels when converted into International Organization for Standardization-standards (ISO-standards).

The first voltage range can be defined as a voltage range in which the potential difference $\Delta V$ applied between the opposite electrode 11 and the pixel electrode 12, in other words, the rate of change in the photoelectric conversion efficiency of the photoelectric converter 10 with respect to the bias voltage, indicates a larger value than when the bias voltage is in the second voltage range. The specific ranges of the first voltage range and the second voltage range may differ depending on the use of the imaging device 100A, the material of the photoelectric conversion layer 13, and the like, but can be defined as described hereinafter, for example. In a graph of the photoelectric conversion efficiency $\eta$ of the photoelectric converter 10 with respect to the bias voltage between the opposite electrode 11 and the pixel electrode 12, as indicated by a dashed line in FIG. 4, a tangent T1 is drawn at a point where the photoelectric conversion efficiency $\eta$ rises from 0. Furthermore, a tangent T2 is drawn at a point corresponding to the largest value during operation for the bias voltage. The value of the bias voltage at an intersecting point of these tangents T1 and T2 is taken as Vt, and a voltage range that is less than Vt is taken as the first voltage range.

In the example depicted in FIG. 4, the value of the potential difference $\Delta V$ where the photoelectric conversion efficiency $\eta$ rises from 0 is 0 V, and the largest value of the bias voltage during operation is $\Delta V=12$ V. The X coordinate of the intersecting point of the tangents at these points is approximately 3 V, and consequently, as depicted in FIG. 4, a voltage region of approximately 0 V or more and less than 3 V can be taken as the first voltage range, and a voltage region of approximately 3 V or more and 12 V or less can be taken as the second voltage range.

Figure 5:
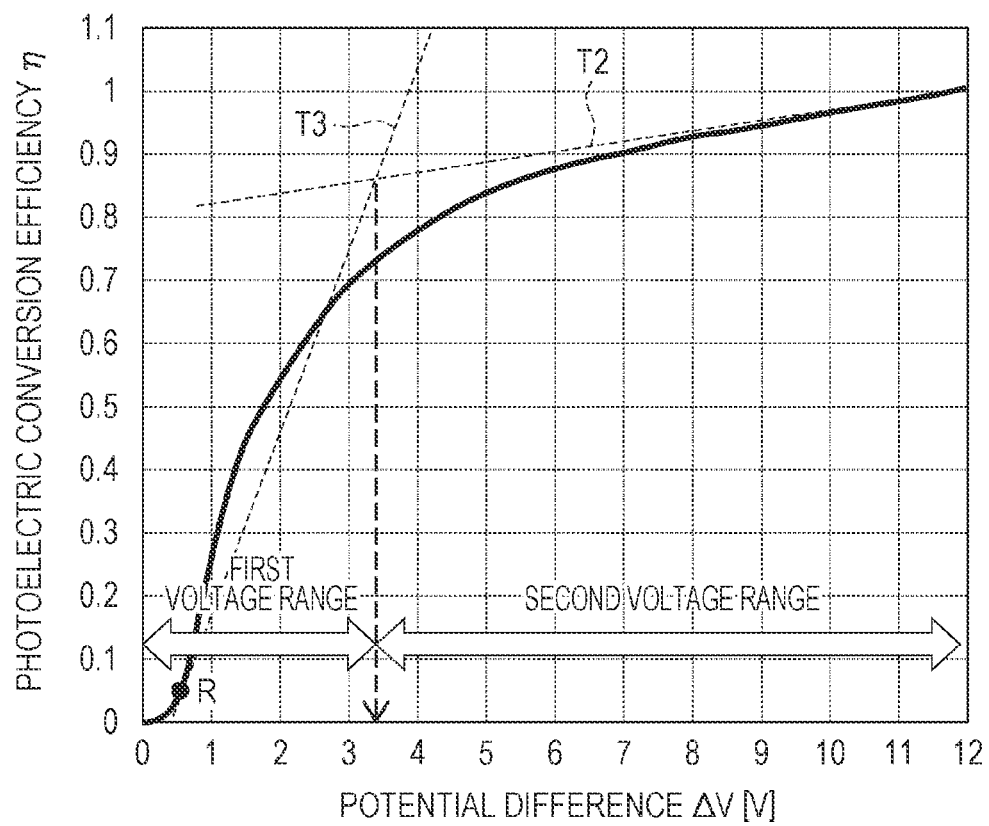
FIG. 5 is a drawing for describing an example of a method of determining specific ranges for a first voltage range and a second voltage range.

However, it is also possible that there is no intersection between the tangent T1 at the point where the photoelectric conversion efficiency $\eta$ rises from 0 and the tangent T2 at the point corresponding to the largest value during operation for the bias voltage, in a case where a characteristic curve in which the photoelectric conversion efficiency $\eta$ rises gently from 0 is obtained in a region in which the potential difference $\Delta V$ is comparatively small, as exemplified in FIG. 5. In such a case, in a graph of the photoelectric conversion efficiency $\eta$, as indicated by a dashed line in FIG. 5, a tangent T3 is drawn at a point R where the value of the photoelectric conversion efficiency $\eta$ becomes 0.06, and an intersecting point between this tangent T3 and the tangent T2 is obtained. Then, the value of the bias voltage at the intersecting point of the tangents T3 and T2 may be taken as Vt, and a voltage range that is less than Vt may be taken as the first voltage range.

It should be noted that the aforementioned value 0.06 for the photoelectric conversion efficiency η is a normalized value when the photoelectric conversion efficiency η at the point corresponding to the largest value during operation for the bias voltage is taken as 1. In the field of digital cameras, ND filters are sometimes combined in a digital camera for photographing with a low shutter speed or the like. The sensitivity realized by means of the value 0.06 for the photoelectric conversion efficiency η generally corresponds to the case where an ND16 filter is applied. Consequently, in a graph of the photoelectric conversion efficiency η with respect to the potential difference ΔV, Vt is obtained using the tangent at the point R where the Y coordinate is 0.06, and thus a sensitivity corresponding to a range of ND2 to ND16, for example, can be realized by means of electrical control.

Figure 6:
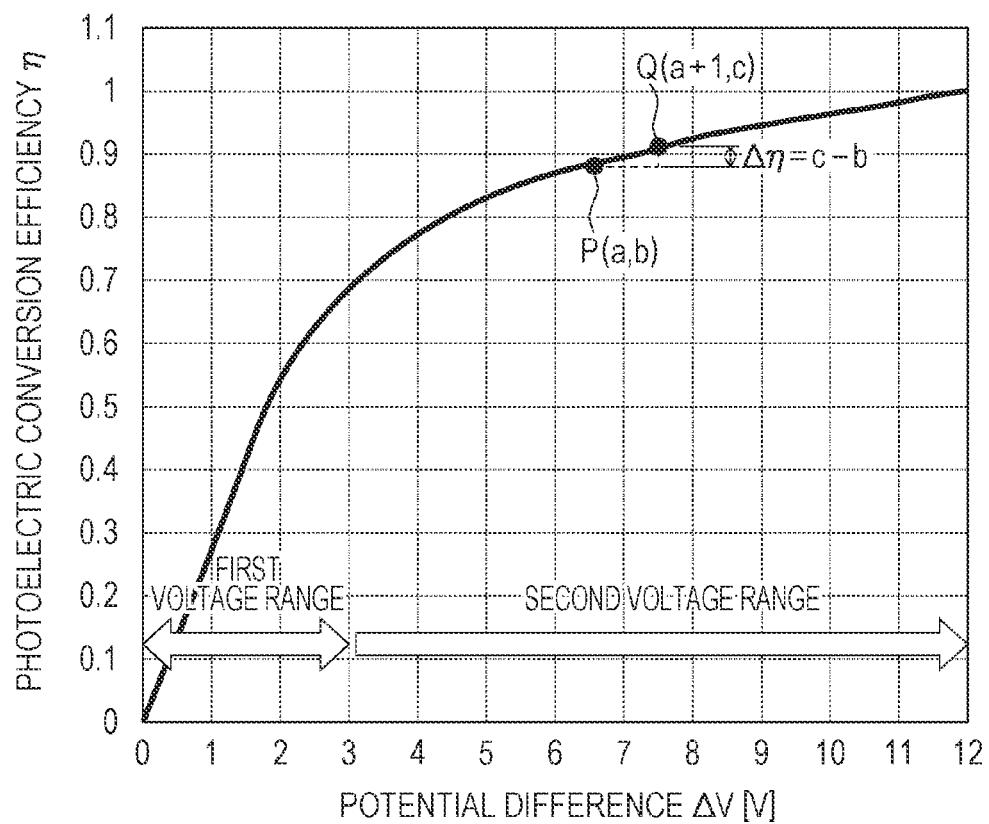
FIG. 6 is a drawing for describing another example of a method of determining specific ranges for the first voltage range and the second voltage range.

Alternatively, a voltage range in which a change in the photoelectric conversion efficiency η is less than 10% with respect to a change of 1 V in the bias voltage may be used as the second voltage range. In this case, the second voltage range is determined as being a voltage range in which (c−b) constituting an increment in the photoelectric conversion efficiency η satisfies the relationship (c−b)<0.1*b when a first point P(a, b) and a second point Q(a+1, c) are taken on the graph, as depicted in FIG. 6. Here, "*" in the aforementioned relational expression represents multiplication.

Figure 7:
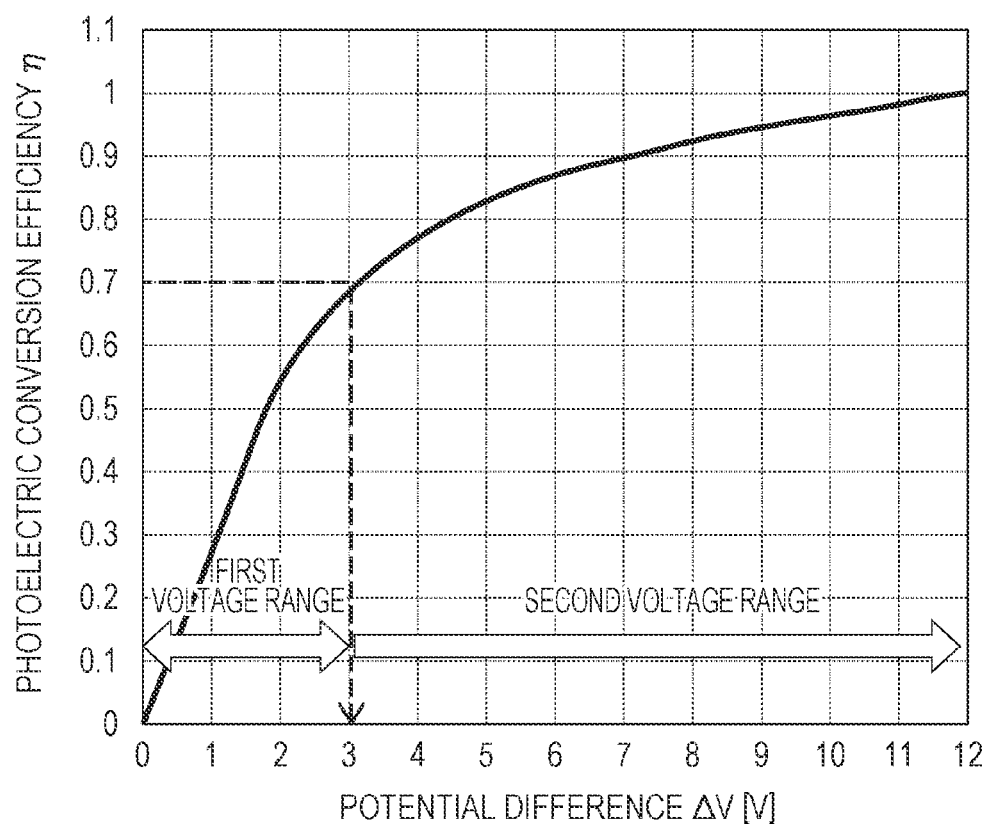
FIG. 7 is a drawing for describing yet another example of a method of determining specific ranges for the first voltage range and the second voltage range.

As yet another alternative, the first voltage range or the second voltage range can also be determined as described hereinafter. For example, in a graph of the photoelectric conversion efficiency η of the photoelectric converter 10 with respect to the bias voltage between the opposite electrode 11 and the pixel electrode 12, a region in which the photoelectric conversion efficiency η is 0.7 or more may serve as the second voltage range, as depicted in FIG. 7. It should be noted that, when a region in which the photoelectric conversion efficiency η is 0.7 or more is defined as the second voltage range, there is an advantage in that it is easy to achieve correspondence with ISO numerical values. It is sufficient that specific ranges for the first voltage range and the second voltage range are set as appropriate in accordance with the use of the imaging device 100A or the like.

As the aforementioned first voltage V1 and second voltage V2, voltages can be used with which the photoelectric conversion efficiency η produced when the first voltage V1 is supplied to the photoelectric converter 10 is lower than when the second voltage V2 is supplied to the photoelectric converter 10. As mentioned above, the photoelectric conversion efficiency η in the photoelectric conversion layer 13, typically, generally increases in a monotonous manner with respect to an increase in the potential difference ΔV applied between the opposite electrode 11 and the pixel electrode 12. In a typical embodiment of the present disclosure, voltages in the second voltage range are used as the first voltage V1 and the second voltage V2. Hereinafter, a description will be given regarding an operation example of the imaging device 100A when voltages in the second voltage range are used as the first voltage V1 and the second voltage V2.

Operation Example of Imaging Device 100A

Here, the photoelectric conversion efficiency η in the photoelectric conversion layer 13 is assumed to indicate a change such as that depicted in FIG. 4 with respect to an increase in the potential difference ΔV applied between the opposite electrode 11 and the pixel electrode 12, and the value Vt of the bias voltage at the aforementioned intersecting point between the tangents T1 and T2 is assumed to be 3 V. At such time, when a voltage region of less than 3 V is taken as the first voltage range and a voltage region of 3 V or more and 12 V or less is determined as the second voltage range, for example, a voltage of 6 V can be used as the first voltage V1 and a voltage of 12 V can be used as the second voltage V2, for example.

In a case where definitions such as these are adopted for the first voltage range and the second voltage range, the ratio of the photoelectric conversion efficiency η produced when the second voltage V2 is applied to the opposite electrode 11 with respect to the value of the photoelectric conversion efficiency η produced when the first voltage V1 is applied to the opposite electrode 11 is, typically, greater than 1 and 1.25 or less. In this example, the photoelectric conversion efficiency η produced when the first voltage V1 is applied to the opposite electrode 11 is approximately 0.87, the value of the photoelectric conversion efficiency η produced when the second voltage V2 is applied is approximately 1.0, and the value of the ratio for these values for η is approximately 1.15. It should be noted that 2, which is the value of the ratio (V2/V1) of the second voltage V2 with respect to the first voltage V1, is greater than the aforementioned ratio value 1.15 in relation to η.

Figure 8:
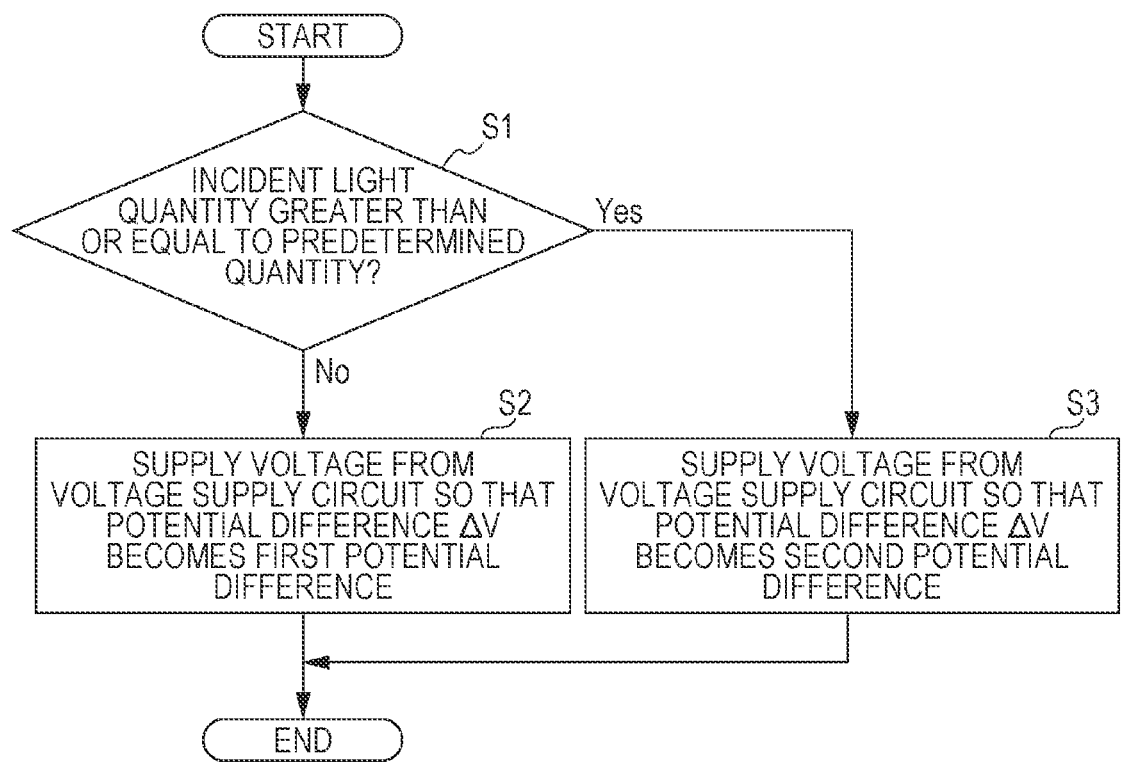
FIG. 8 is a schematic flowchart depicting a first exemplary operation of the imaging device.

FIG. 8 is a schematic flowchart depicting a first exemplary operation of the imaging device 100A. In the example depicted in FIG. 8, first, it is determined whether or not the quantity of light incident on the photoelectric converters 10 is greater than or equal to a predetermined quantity of light (step S1). For example, the level of the signals that are output to the output signal lines $S_j$ from the output circuits 20 is detected by the detection circuit 130A. In a case where the detected level is greater than or equal to the voltage level of the reference line 132 serving as a threshold value, it can be determined that the quantity of light incident on the photoelectric converters 10 is greater than or equal to the predetermined quantity of light. The level of the signals from the output circuits 20 may be detected by, for example, when the user has half-pressed a release button, switching the address transistors 24 of some of the pixels Px to on, and causing a voltage that corresponds to the illuminance to be output from the output circuits 20. Alternatively, the level of the signals detected by the detection circuit 130A in, for example, the frame immediately preceding the frame in which images are to be acquired from thereon may be used.

It goes without saying that the method of determining whether or not the quantity of light incident on the photoelectric converters 10 is greater than or equal to the predetermined quantity of light is not restricted to a specific method, and various methods can be adopted. For example, the level of the signals detected by the detection circuit 130A may be converted into a digital value by an analog-digital conversion circuit, and whether or not the quantity of light incident on the photoelectric converters 10 is greater than or equal to the predetermined quantity of light may be determined by comparison with a threshold value stored in advance in the memory 162. Whether or not the quantity of light incident on the photoelectric converters 10 is greater than or equal to the predetermined quantity of light can be determined by the control circuit 160 or the image processing circuit 164, for example. The control circuit 160 may include a logic circuit formed on the semiconductor substrate 110. Whether or not the quantity of light incident on the photoelectric converters 10 is greater than or equal to the predetermined quantity of light may be determined by an ISP, for example, arranged outside of the imaging device 100A.

In a case where it has been determined that the quantity of light incident on the photoelectric converters 10 is less than the predetermined quantity of light, a voltage is applied to the photoelectric converters 10 in such a way that the potential difference between the opposite electrode 11 and the pixel electrode 12 becomes the first potential difference (step S2). The control circuit 160 supplies a drive signal to the voltage supply circuit 150, and, for example, causes the first voltage V1 to be applied to the voltage line 152 from the voltage supply circuit 150. In other words, here, in a situation where the illuminance is low, the bias voltage between the pixel electrode 12 and the opposite electrode 11 is made to be relatively low.

At the standard setting, the effect of suppressing power consumption can be expected by applying an operation with which the relatively low first voltage V1 is used as the voltage supplied to the photoelectric converters 10 from the voltage supply circuit 150. The state in which the first voltage V1 in the second voltage range is being supplied from the voltage supply circuit 150 may be referred to as a standard mode. Furthermore, using the relatively low first voltage V1 at the standard setting is not only power saving but is also advantageous for increasing operation speed compared to using the second voltage V2 at the standard setting.

Japanese Patent No. 6202512, for example, discloses a technique for realizing a global shutter with pixel sensitivity being substantially 0 by bringing a potential difference applied between an opposite electrode and a pixel electrode arranged on either side of a photoelectric conversion layer near to 0 V. In a case where this kind of technique is applied, the time required for switching voltages becomes longer when there is a large difference between the voltage applied to the opposite electrode during exposure, and the voltage applied to the opposite electrode when pixel sensitivity is set to 0 for a state to be entered in which the shutter is electronically closed. In contrast, when there is a small difference between voltages applied to the opposite electrode during exposure and during shutter use, the time required for switching voltages becomes shorter, and it becomes possible to execute a shutter operation at a higher speed. Furthermore, it is possible to shorten the time required from the end of exposure, in other words, from the voltage applied to the opposite electrode being decreased to approximately 0 V, to signal reading, and therefore driving in which the relatively low first voltage V1 is used at the standard setting is particularly advantageous for applying an electrical global shutter. The content disclosed in Japanese Patent No. 6202512 is incorporated herein in its entirety for reference.

Figure 9:
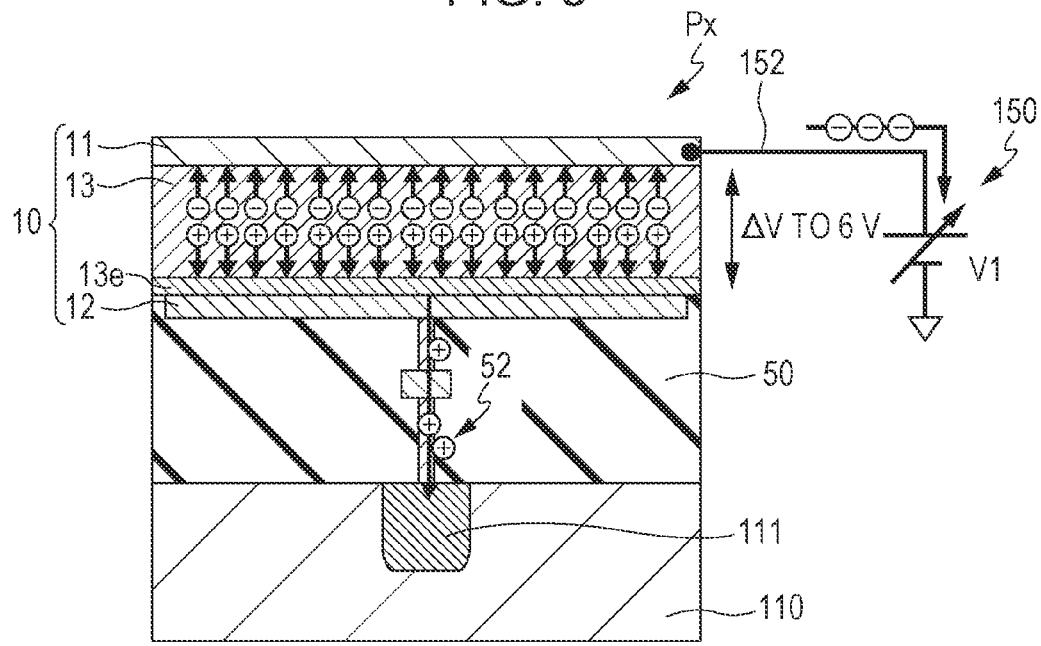
FIG. 9 is a schematic cross-sectional view for describing an operation of the pixel when a voltage of 6 V is applied as a first voltage to an opposite electrode.
Figure 10:
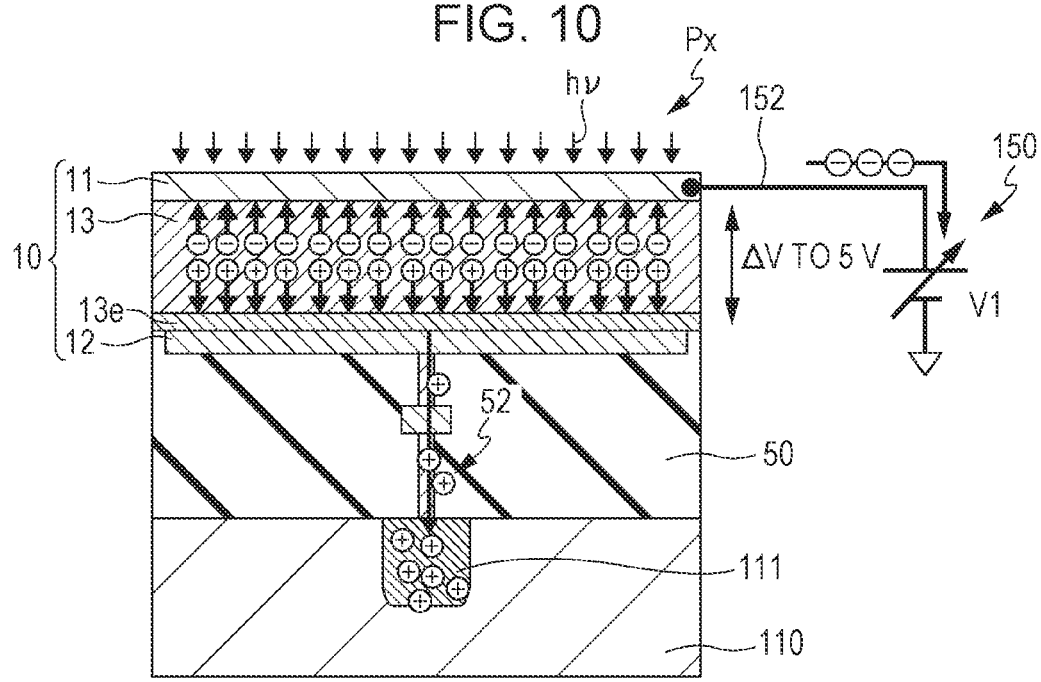
FIG. 10 is a schematic cross-sectional view for describing an operation of the pixel when a voltage of 6 V is applied as the first voltage to the opposite electrode, and schematically depicts a state in which electron holes are accumulated in an impurity region.

FIGS. 9 and 10 are schematic cross-sectional views for describing an operation of the pixels Px when a voltage of 6 V is applied as the first voltage V1 to the opposite electrode 11. During operation, the potential difference ΔV is applied between the opposite electrode 11 and the pixel electrode 12. The reset voltage $V_{RST}$ is a voltage in the vicinity of 0 V, for example, and consequently, in a state in which the voltage supply circuit 150 is supplying the first voltage V1, the photoelectric conversion layer 13 is in a state in which a potential difference of approximately 6 V is applied, as schematically depicted in FIG. 9.

When light is incident on the photoelectric conversion layer 13 and charges are generated inside the photoelectric conversion layer 13, these charges move according to the electric field between the opposite electrode 11 and the pixel electrode 12. As schematically depicted in FIG. 9, positive charges are accumulated in the impurity region 111 serving as a charge accumulation unit via the conductive structure 52, and negative charges are discharged to the voltage line 152 from the photoelectric conversion layer 13 via the opposite electrode 11.

Here, as schematically depicted by the arrows hv in FIG. 10, it is assumed that the accumulation of signal charges has continued at a relatively high illuminance in a state in which the first voltage V1 is being supplied from the voltage supply circuit 150. When the accumulation of signal charges in the impurity region 111 continues, since positive charges are used as signal charges here, the potential of the impurity region 111 gradually increases. Therefore, the effective bias voltage according to the photoelectric conversion layer 13 is less than the actual value of the first voltage V1, and can become approximately 5 V, for example. In other words, high-voltage elements and element isolation regions are not required, and reliability can be improved. It should be noted that positive charges produced by the pixel electrode 12 are no longer collected when the potential of the pixel electrode 12 exceeds the potential of the opposite electrode 11, and therefore the potential of the impurity region 111 basically does not exceed the value of the first voltage V1.

Reference will once again be made to FIG. 8. In step S1, in a case where it has been determined that the quantity of light incident on the photoelectric converters 10 is greater than or equal to the predetermined quantity of light, a voltage is applied to the photoelectric converters 10 in such a way that the potential difference between the opposite electrode 11 and the pixel electrode 12 becomes a second potential difference that is greater than the first potential difference (step S3). The control circuit 160 supplies a drive signal to the voltage supply circuit 150, and, for example, causes the second voltage V2, which is higher than the first voltage V1, to be applied to the voltage line 152 from the voltage supply circuit 150.

Figure 11:
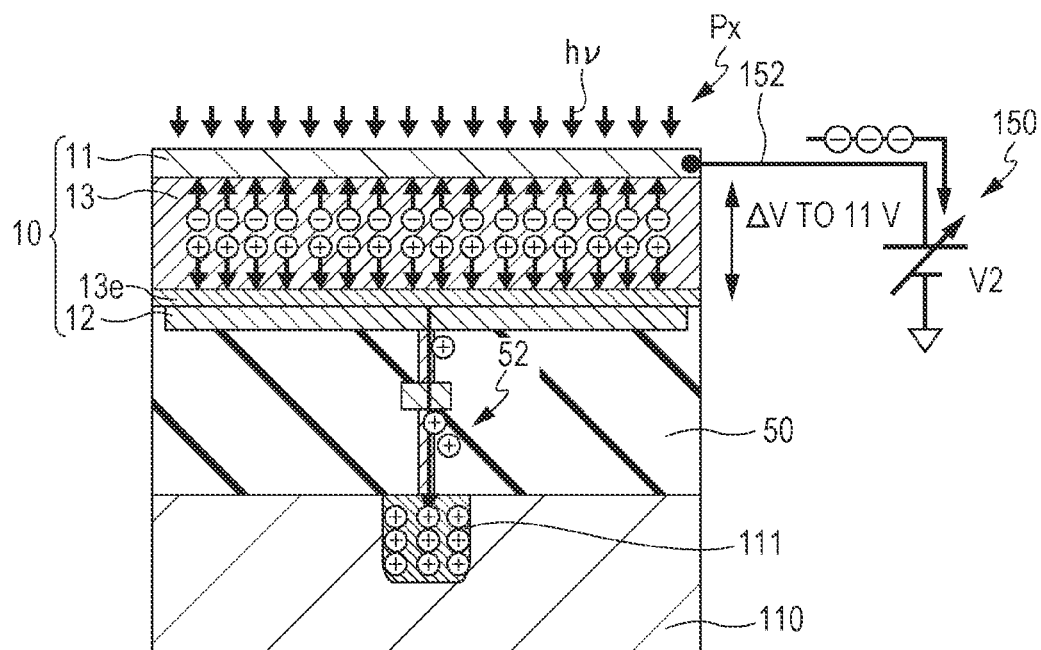
FIG. 11 is a drawing schematically depicting a state in which a potential difference is increased by applying a second voltage to a voltage line from a voltage supply circuit.

When the potential difference ΔV between the opposite electrode 11 and the pixel electrode 12 increases, the electric field inside the photoelectric conversion layer 13 increases, and a larger quantity of positive charges are collected by the pixel electrode 12, as schematically depicted in FIG. 11. Here, a voltage of 12 V is used as the second voltage V2. As is apparent with reference to FIG. 4, the photoelectric conversion efficiency in a state in which the second voltage V2 is applied to the opposite electrode 11 is high compared to a state in which the first voltage V1 is applied to the opposite electrode 11. In other words, the sensitivity of the pixels Px obtained when the second voltage V2 is applied to the opposite electrode 11 is in a high state compared to a state in which the first voltage V1 is applied to the opposite electrode 11.

The potential of the impurity region 111 gradually rises due to continuation of the accumulation of signal charges in the impurity region 111, which is similar to when the first voltage V1 is applied to the opposite electrode 11. Consequently, the effective bias voltage according to the photoelectric conversion layer 13 is less than the actual value of the second voltage V2, and can become approximately 11 V, for example, as depicted in FIG. 11.

Figure 12:
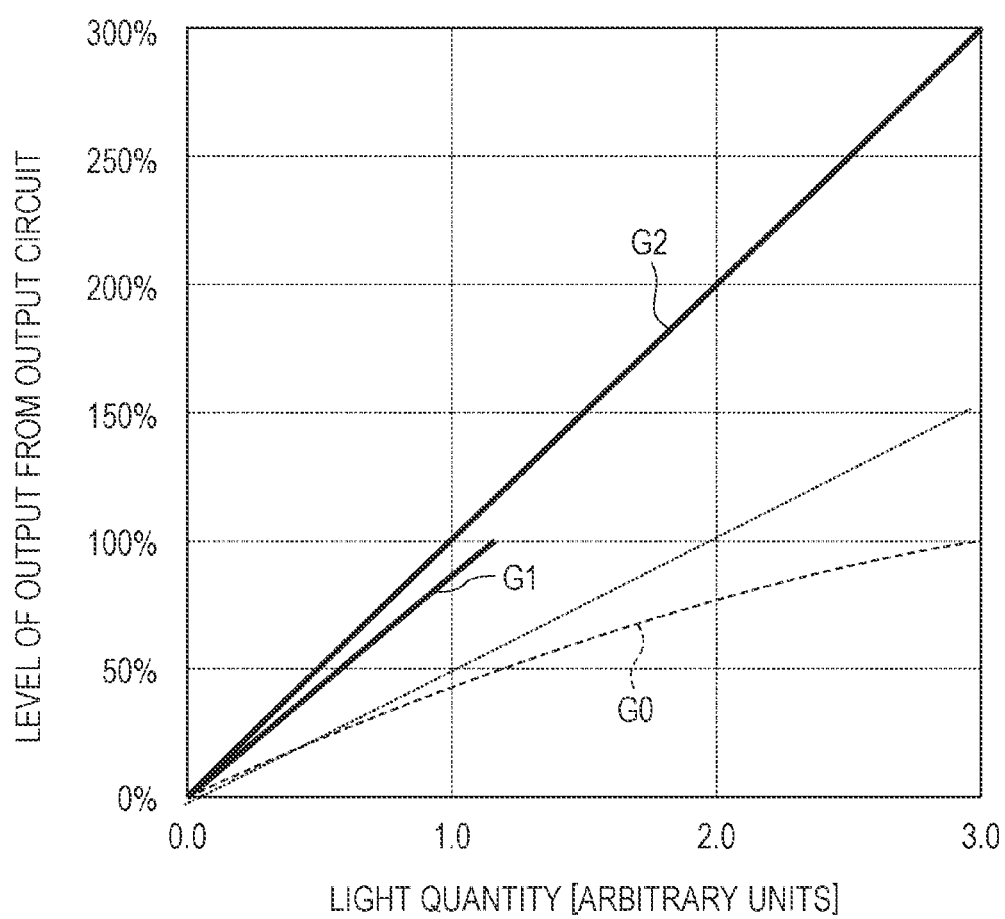
FIG. 12 is a drawing schematically depicting a typical example of a change in the level of a signal from an output circuit, with respect to a change in the quantity of light incident on a photoelectric converter, when the first voltage is applied to the opposite electrode, and when a second voltage is applied to the opposite electrode.

FIG. 12 schematically depicts a typical example of a change in the level of the signals from the output circuits 20, with respect to a change in the quantity of light incident on the photoelectric converters 10, when the first voltage V1 is applied to the opposite electrode 11, and when the second voltage V2 is applied to the opposite electrode 11. A line G1 in FIG. 12 depicts a change in the level of the output signals when a voltage of 6 V is applied as the first voltage V1 to the opposite electrode 11, and G2 depicts a change in the level of the output signals when a voltage of 12 V is applied as the second voltage V2 to the opposite electrode 11.

In the example of FIG. 12, the level of the signals from the output circuits 20 indicates a linear change with respect to a change in the quantity of light incident on the photoelectric converters 10, in either of a state in which a voltage of 6 V is applied as the first voltage V1 to the opposite electrode 11 and a state in which a relatively high voltage of 12 V is applied as the second voltage V2 to the opposite electrode 11. In other words, it is understood that it is possible to ensure linearity of the signal output with respect to a change in illuminance when either of the first voltage V1 and the second voltage V2 is supplied from the voltage supply circuit 150.

However, in the example depicted in FIG. 12, in a case where the first voltage V1 is applied to the opposite electrode 11, the range in which the signal output with respect to a change in illuminance indicates a linear change is narrow compared to the case where the second voltage V2 is applied to the opposite electrode 11. This is because the rate of change in the signal output with respect to a change in illuminance can adopt a larger value when the first voltage V1 is applied to the opposite electrode 11.

Figure 13:
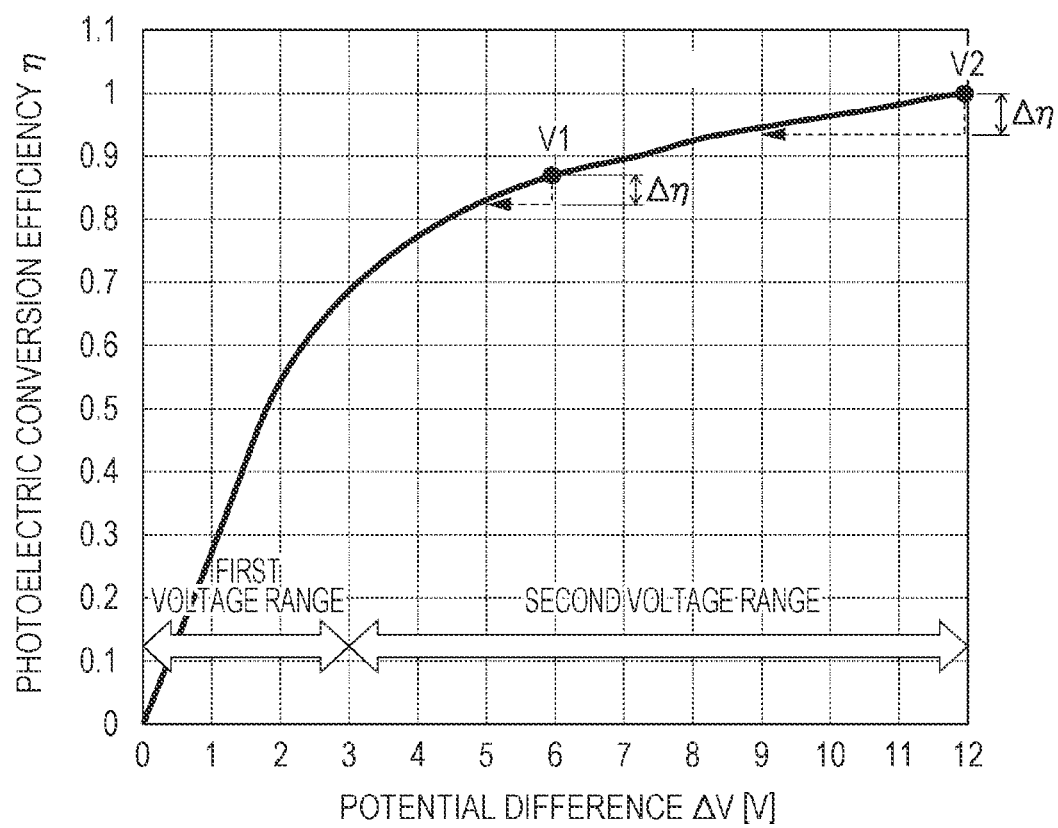
FIG. 13 is a drawing depicting once again the typical example of the photoelectric conversion characteristics depicted in FIG. 4.

FIG. 13 depicts a typical example of the photoelectric conversion characteristics of the photoelectric conversion layer 13. The graph in FIG. 13 is the same as the graph depicted in FIG. 4. In the example depicted in FIG. 13, the inclination of the graph line increases as the potential difference ΔV decreases. In a case where the photoelectric converters 10 indicate photoelectric conversion characteristics such as this, when the potential of the impurity region 111 increases due to the accumulation of signal charges with, for example, the point where the potential difference ΔV is 6 V as a starting point, the potential difference ΔV approaches the first voltage range in which the graph indicates a larger inclination. As a result, a graph indicating change in the signal output with respect to a change in illuminance may deviate from a straight line. In other words, the linearity may collapse when illuminance exceeded a range while the relatively low first voltage V1 is applied to the opposite electrode 11.

In contrast, in a state in which the relatively high second voltage V2 is applied to the opposite electrode 11, as depicted in FIG. 13, the rate of change in the photoelectric conversion efficiency η with respect to a change in the potential difference ΔV is relatively small, and, consequently, it becomes possible to permit a larger change for the potential difference ΔV. For example, the range for the potential difference ΔV that imparts a change Δη in η of the same magnitude can be approximately tripled. In other words, in a state in which the relatively high second voltage V2 is applied to the opposite electrode 11, as depicted in FIG. 12, the range for the quantity of light with which the level of the output signals changes in a linear manner can be approximately tripled compared to when the first voltage V1 is applied to the opposite electrode 11. To paraphrase this, in a state in which the second voltage V2 is applied to the opposite electrode 11, it becomes possible to permit a range that is approximately tripled for the quantity of light compared to when the first voltage V1 is applied to the opposite electrode 11, which is advantageous for photographing a bright scene requiring a wider dynamic range.

In this way, control is carried out in such a way that the first voltage V1 in the second voltage range is supplied to the photoelectric converters 10 in an environment in which illuminance is comparatively low, and the higher second voltage V2 is supplied to the photoelectric converters 10 in an environment in which illuminance is comparatively high. According to this kind of control, the dynamic range can be changed in a dynamic manner according to changes in illuminance. For example, at the standard setting, the first voltage V1 in the second voltage range can be used as the voltage supplied to the photoelectric converters 10, and, in an environment in which illuminance is comparatively high, the relatively high second voltage V2 can be used as the voltage supplied to the photoelectric converters 10. According to this kind of control, in an environment in which illuminance is comparatively high, the photoelectric converters 10 can be driven in a voltage region in which the rate of change in the photoelectric conversion efficiency η with respect to the bias voltage is relatively small, and it becomes possible to ensure linearity in a wider range. In other words, it becomes possible to automatically expand the dynamic range by means of electrical control. Furthermore, the advantage of low power consumption can be obtained by adopting, as the standard setting, an operation with which the relatively low first voltage V1 is used as the voltage supplied to the photoelectric converters 10 from the voltage supply circuit 150.

Figure 14:
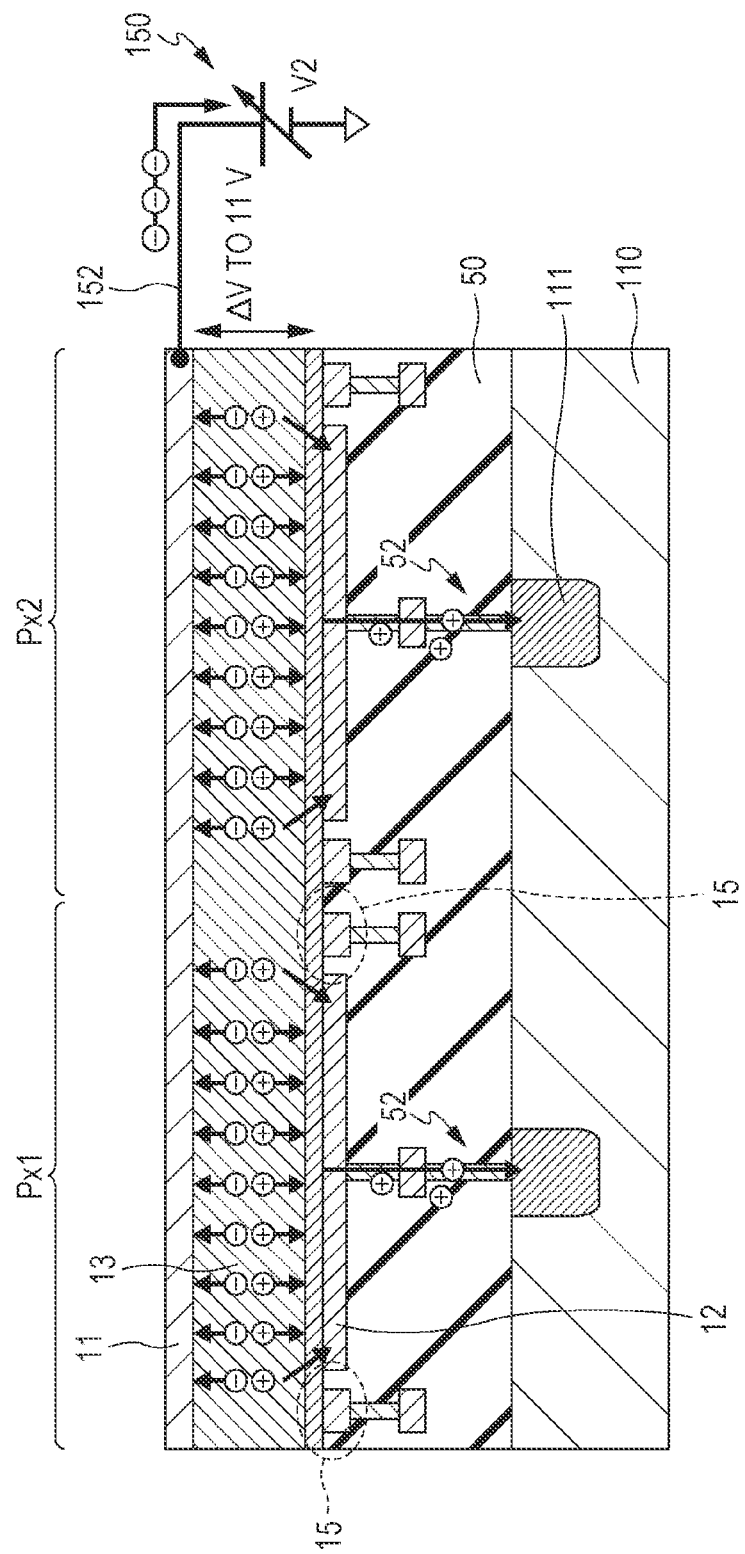
FIG. 14 is a schematic cross-sectional view depicting a configuration in which a third electrode is arranged between two pixel electrodes that are adjacent to each other.

As exemplified in FIG. 14, a third electrode 15 may be arranged between two pixel electrodes 12 that are adjacent to each other. As described hereinafter, by controlling the potential of the third electrode 15, it is possible to further expand the dynamic range relating to the direction in which the illuminance is high.

FIG. 14 depicts two pixels Px1 and Px2 that are adjacent to each other in a row or column, for example, of the plurality of pixels Px. Furthermore, in FIG. 14, the third electrode 15 is arranged between the pixel electrode 12 of the pixel Px1 and the pixel electrode 12 of the pixel Px2, and in the same layer as these pixel electrodes 12. The third electrode 15 is spatially separated from the pixel electrode 12 of the pixel Px1 and the pixel electrode 12 of the pixel Px2, and is thereby electrically isolated from these pixel electrodes 12. The third electrode 15 is configured so that a predetermined voltage can be applied during operation of the imaging device 100A by being coupled to a power source that is not depicted.

Figure 15:
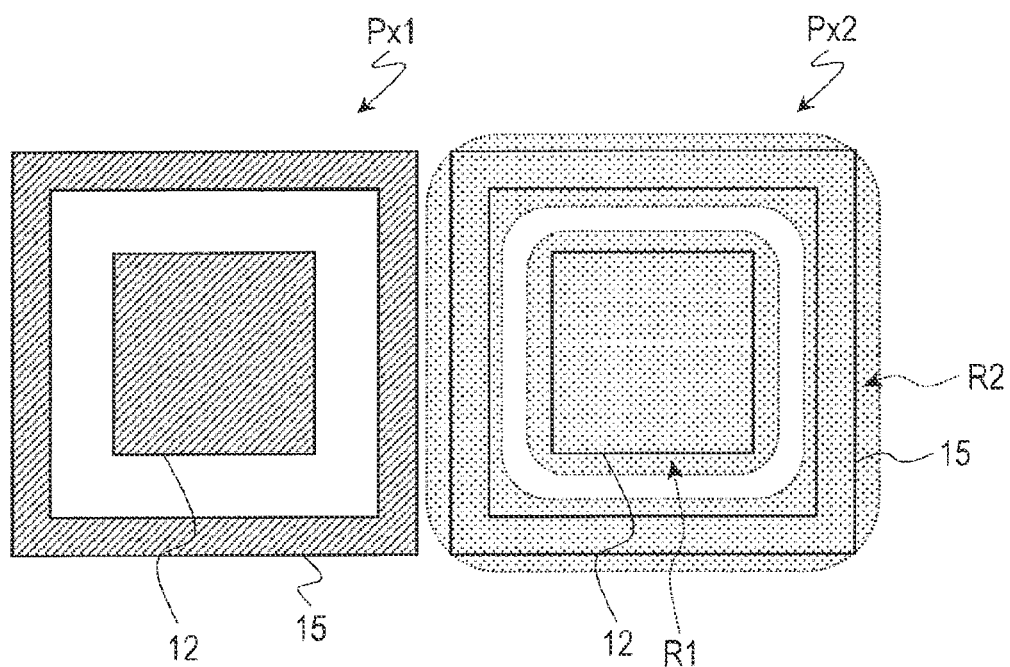
FIG. 15 is a schematic plan view depicting an example of the arrangement relationship between a pixel electrode and the third electrode, when seen from the opposite electrode side.

FIG. 15 depicts an example of the arrangement relationship between the pixel electrode 12 and the third electrode 15, when seen from the opposite electrode 11 side. In this example, the third electrode 15 has a rectangular shape surrounding the pixel electrode 12, and is provided in each of the pixel Px1 and the pixel Px2. It should be noted that it is not essential for the third electrode 15 to be arranged separately for each pixel Px. For example, it is also possible for a single third electrode 15 that straddles the plurality of pixels Px to be provided for each row of the plurality of pixels Px. Furthermore, it is also possible for a grid-shaped third electrode 15 to be arranged across the plurality of pixels Px.

When a potential that is lower than that of the opposite electrode 11 is applied, the pixel electrode 12 collects positive charges in a region R1, of the photoelectric conversion layer 13, located more or less directly above the pixel electrode 12, as schematically depicted by the shading in FIG. 15. Similarly, when a potential that is lower than that of the opposite electrode 11 is applied, the third electrode 15 can collect positive charges in a region R2, of the photoelectric conversion layer 13, located more or less directly above the third electrode 15.

Figure 16:
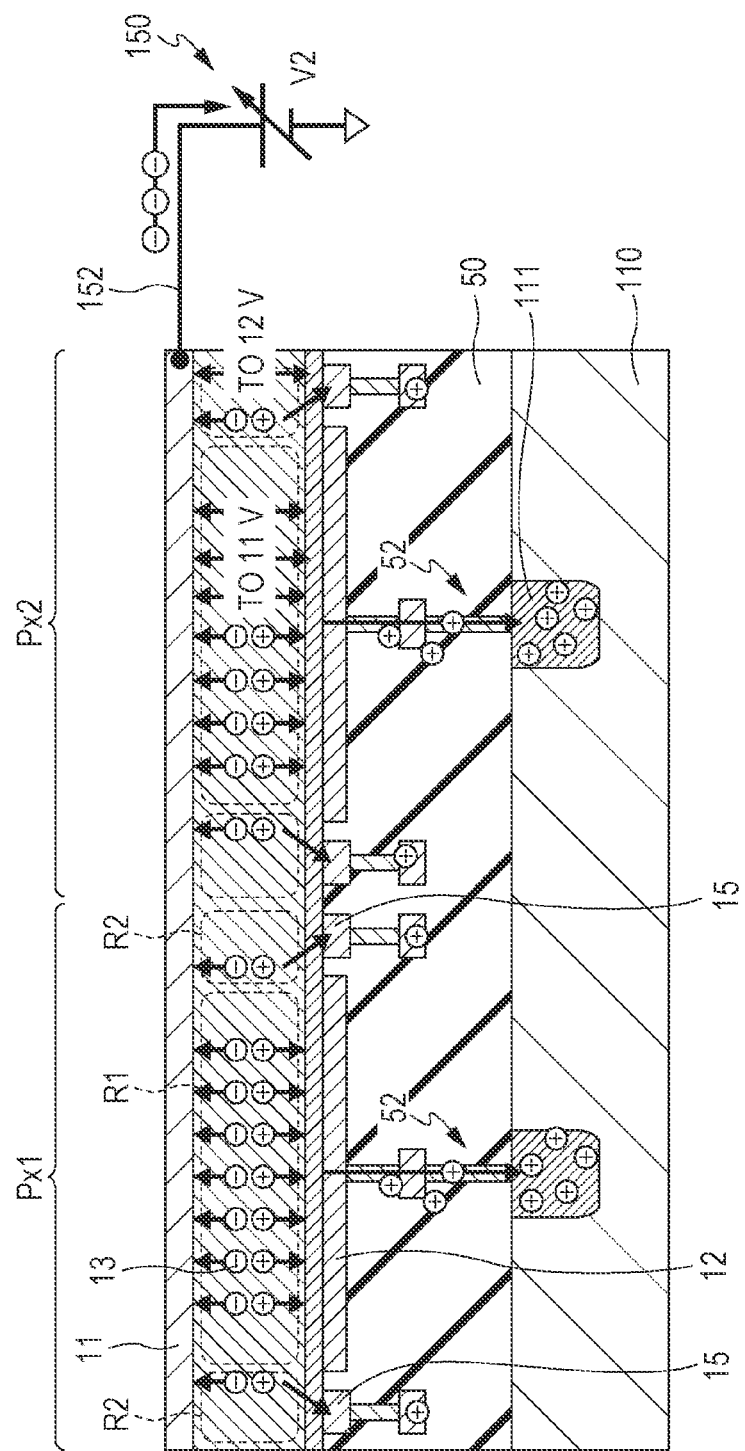
FIG. 16 is a schematic cross-sectional view for describing a mechanism that lowers the effective photoelectric conversion efficiency by applying a predetermined voltage to the third electrode.

Consequently, when the illuminance is high, a voltage that is less than or equal to the reset voltage $V_{RST}$, for example, is applied to the third electrode 15 for a potential difference that is greater than or equal to $\Delta V$ to be applied to a portion, of the photoelectric conversion layer 13, located between the opposite electrode 11 and the third electrode 15, and it thereby becomes possible for charges generated near boundaries of the pixels Px to be preferentially collected by the third electrode 15, as schematically depicted in FIG. 16. As a result, the number of charges that reach the pixel electrode 12 decreases, and the effective photoelectric conversion efficiency can be lowered. In other words, it is possible to further expand the dynamic range relating to the direction in which the illuminance is high. Furthermore, in a configuration in which a color filter is arranged on each pixel Px, an effect of suppressing color mixing can also be obtained. The voltage applied to the third electrode 15 may be supplied from the voltage supply circuit 150.

As already described, in a configuration in which electron holes are used as signal charges, together with exposure, there is an increase in the electron holes accumulated in the impurity region 111 serving as a charge accumulation unit, and therefore the potential of the impurity region 111 gradually rises. Since the potential of the impurity region 111 gradually rises together with exposure, the effective bias voltage according to the photoelectric conversion layer 13 becomes less than the value of the second voltage V2 even when the second voltage V2 is applied. Similar to when the illuminance is low with the first voltage V1 applied to the photoelectric converters 10, in this case also, the potential of the impurity region 111 basically does not exceed the second voltage V2. In other words, it is possible to suppress an increase in the electric field applied to the impurity region 111, while also having a comparatively large value for the potential difference $\Delta V$ between the opposite electrode 11 and the pixel electrode 12. Consequently, a high breakdown voltage is not required at portions such as the P-N junction formed between the impurity region 111 and regions outside thereof or the gate insulation layer 22g of the signal detection transistor 22, and reliability is easily ensured.

Example of Output Circuit

Figure 17:
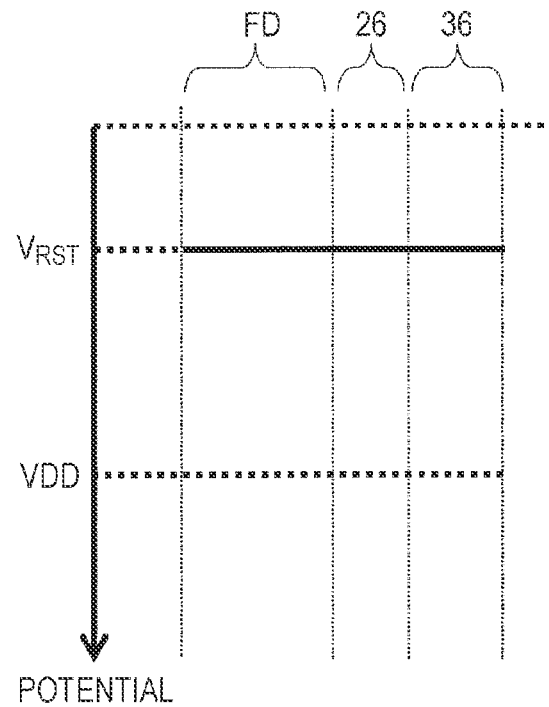
FIG. 17 is a schematic drawing for describing the relationship between a change in the potential of a node that accompanies the accumulation of signal charges, and a power source voltage.
Figure 18:
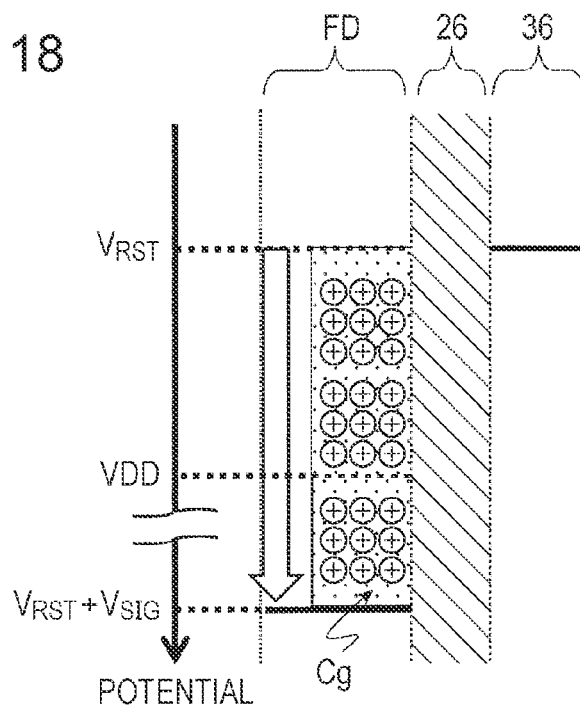
FIG. 18 is a schematic drawing for describing the relationship between a change in the potential of the node that accompanies the accumulation of signal charges, and the power source voltage.

FIGS. 17 and 18 schematically depict the relationship between a change in the potential of the node FD that accompanies the accumulation of signal charges, and the power source voltage. FIG. 17 schematically depicts the potential of a node at the drain side and the source side of the reset transistor 26 when a reset is performed. As depicted in FIG. 17, due to the reset transistor 26 being set to on-state when the photoelectric converter 10 is reset, the potential of the node FD constituting one side out of the drain and the source of the reset transistor 26 matches the potential $V_{RST}$ of the reset voltage line 36 constituting the other side.

FIG. 18 schematically depicts the potential of the node FD in a state in which signal charges are accumulated after the reset transistor 26 has been set to off-state. As depicted in FIG. 18, the potential of the node FD after the accumulation of signal charges rises from the $V_{RST}$ by an amount proportional to a voltage $V_{SIG}$ that corresponds to the quantity of accumulated signal charges Cg. Here, in an environment in which illuminance is comparatively high, in particular, in a case where the comparatively high second voltage V2 in the second voltage range is being supplied to the photoelectric converter 10, the potential of the node FD may exceed the power source voltage VDD due to the accumulation of electron holes serving as the signal charges Cg.

Figure 19:
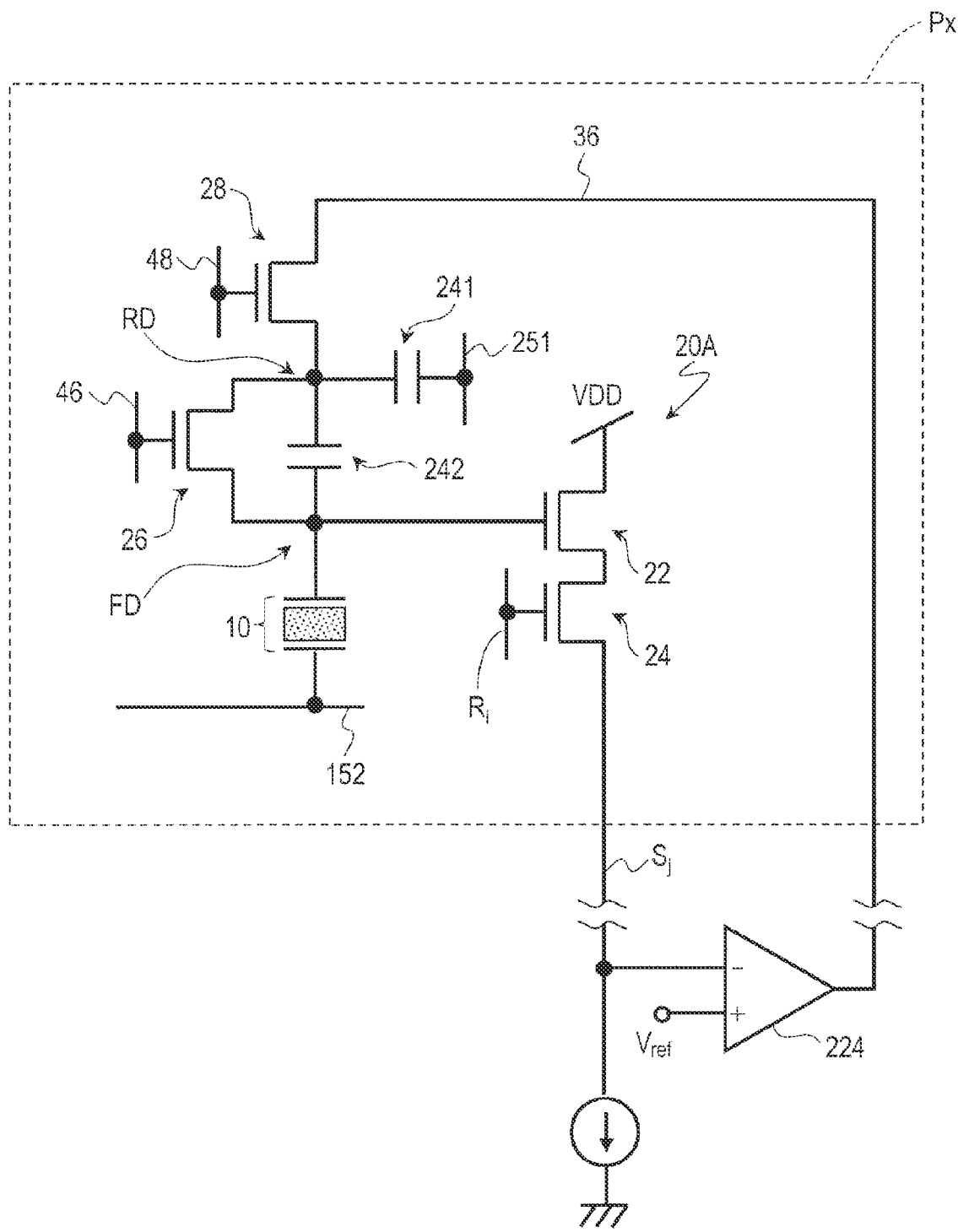
FIG. 19 is a drawing depicting a modified example of an output circuit included in the pixel.

FIG. 19 depicts a modified example of the output circuit included in the pixels Px. For simplicity, here, a pixel located in the $i^{th}$ row and the $j^{th}$ column is extracted and depicted from among the plurality of pixels Px.

In the example exemplified in FIG. 19, the pixel Px has an output circuit 20A that is coupled to the photoelectric converter 10. The output circuit 20A, in addition to the signal detection transistor 22, the address transistor 24, and the reset transistor 26, also has a first capacitor 241, one electrode of which is coupled to, out of the drain and the source of the reset transistor 26, the side that is not coupled to the pixel electrode 12 of the photoelectric converter 10.

As depicted, an accumulation control line 251 is coupled to, out of the electrodes of the first capacitor 241, the electrode at the side not coupled to the reset transistor 26. The accumulation control line 251 is coupled to an undepicted voltage supply circuit or the like, and thereby applies a predetermined voltage to the first capacitor 241 during operation. It should be noted that, in this example, the output circuit 20A also includes a second capacitor 242 that is coupled in parallel to the reset transistor 26. The first capacitor 241 typically has a capacitance value that is larger than that of the second capacitor 242.

Figure 20:
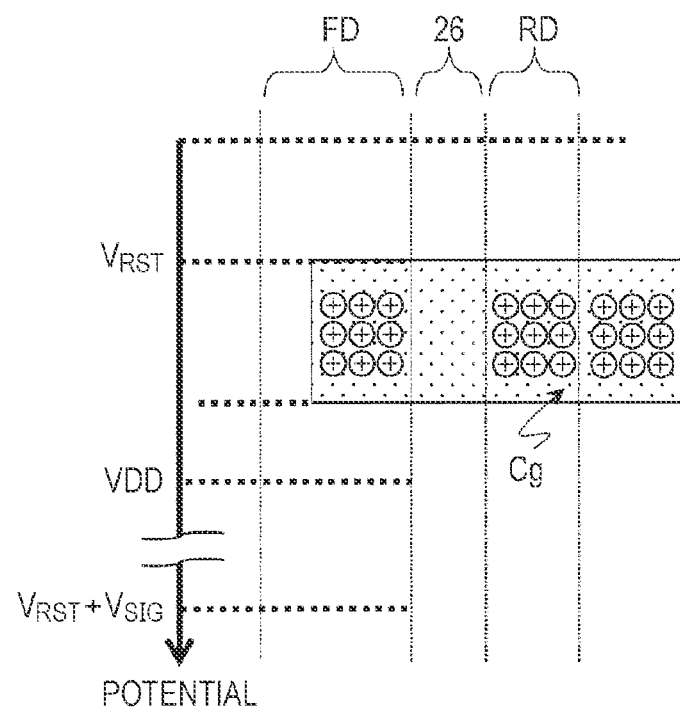
FIG. 20 is a potential diagram for describing an operation of the output circuit depicted in FIG. 19.

As mentioned above, in an environment in which illuminance is high, the potential of the node FD may exceed the power source voltage VDD due to the accumulation of the signal charges Cg. When the potential of the node FD exceeds the power source voltage VDD, the reading of signals by means of a source follower cannot be executed. However, according to the output circuit 20A exemplified in FIG. 19, the reset transistor 26 can be set to on-state when a signal is read after exposure in a mode in which, for example, the comparatively high second voltage V2 in the second voltage range is applied to the opposite electrode 11. Due to the reset transistor 26 being set to on-state when a signal is read after exposure, the first capacitor 241 is coupled to the node FD via the reset transistor 26. Due to the first capacitor 241 being coupled to the node FD via the reset transistor 26, the potential of the node FD can be lowered to a level that is less than the VDD, as schematically depicted in FIG. 20. Consequently, it becomes possible to read a signal that corresponds to the potential of the pixel electrode 12 that has changed due to the accumulation of charges generated by photoelectric conversion, without boosting the power source voltage VDD. Here, in FIGS. 19 and 20, out of the drain and the source of the reset transistor 26, a node at the side not coupled to the photoelectric converter 10 is referred to as a node RD.

In this way, in a mode in which a capacitor having a comparatively large capacitance value is coupled to the node FD via the reset transistor 26 serving as a switching element and the potential difference between the opposite electrode 11 and the pixel electrode 12 is increased, for example, control may be applied in which the reset transistor 26 is set to on-state when a signal that corresponds to accumulated signal charges is read. According to this kind of control, the potential of the node FD can be temporarily decreased in a selective manner when a signal that corresponds to accumulated signal charges is read, and signal reading can be executed even in an environment in which illuminance is high without using an even higher power source voltage. It should be noted that a temporary decrease in the potential of the node FD produced by setting the reset transistor 26 to on-state may be ordinarily executed when a signal is read in a mode in which the potential difference between the opposite electrode 11 and the pixel electrode 12 is increased, or may be selectively executed in a case where the potential of the node FD has exceeded the power source voltage VDD. Alternatively, control can also be applied in which, first, signals are read in a state in which the reset transistor 26 is off-state, and, next, signals are read with the reset transistor 26 being set to on-state. In this case, two items of data are obtained corresponding to two instances of signal reading, and therefore one item of data may be selectively used or the two items of data may be combined and used to construct an image.

It should be noted that, in the example depicted in FIG. 19, an inverting amplifier 224 is arranged in each column of the plurality of pixels Px. An inverting input terminal of the inverting amplifier 224 is coupled to an output signal line $S_j$, and the predetermined reference voltage $V_{ref}$ is applied to a non-inverting input terminal during operation. As depicted, here, the reset voltage line 36 is coupled to an output terminal of the inverting amplifier 224.

Furthermore, the output circuit 20A further includes a band control transistor 28 that is coupled between the reset transistor 26 and the reset voltage line 36. A band control signal line 48 is coupled to the gate of the band control transistor 28. The band control signal line 48 is coupled to the row scanning circuit 120, for example, and the potential thereof is thereby controlled.

According to this kind of configuration, it is possible not only to have the reset transistor 26 function as a transistor for gain switching but also to form a feedback loop in which some or all of the output signals of the signal detection transistor 22 are electrically returned by controlling the potential of the reset signal line 46 and the band control signal line 48. By forming a feedback loop, it is possible to reduce the effect of kTC noise generated due to the reset transistor 26 and the band control transistor 28 being off. The details of this kind of noise cancellation for which returning is used are described in Japanese Unexamined Patent Application Publication No. 2017-046333. The content disclosed in Japanese Unexamined Patent Application Publication No. 2017-046333 is incorporated herein in its entirety for reference.

Figure 21:
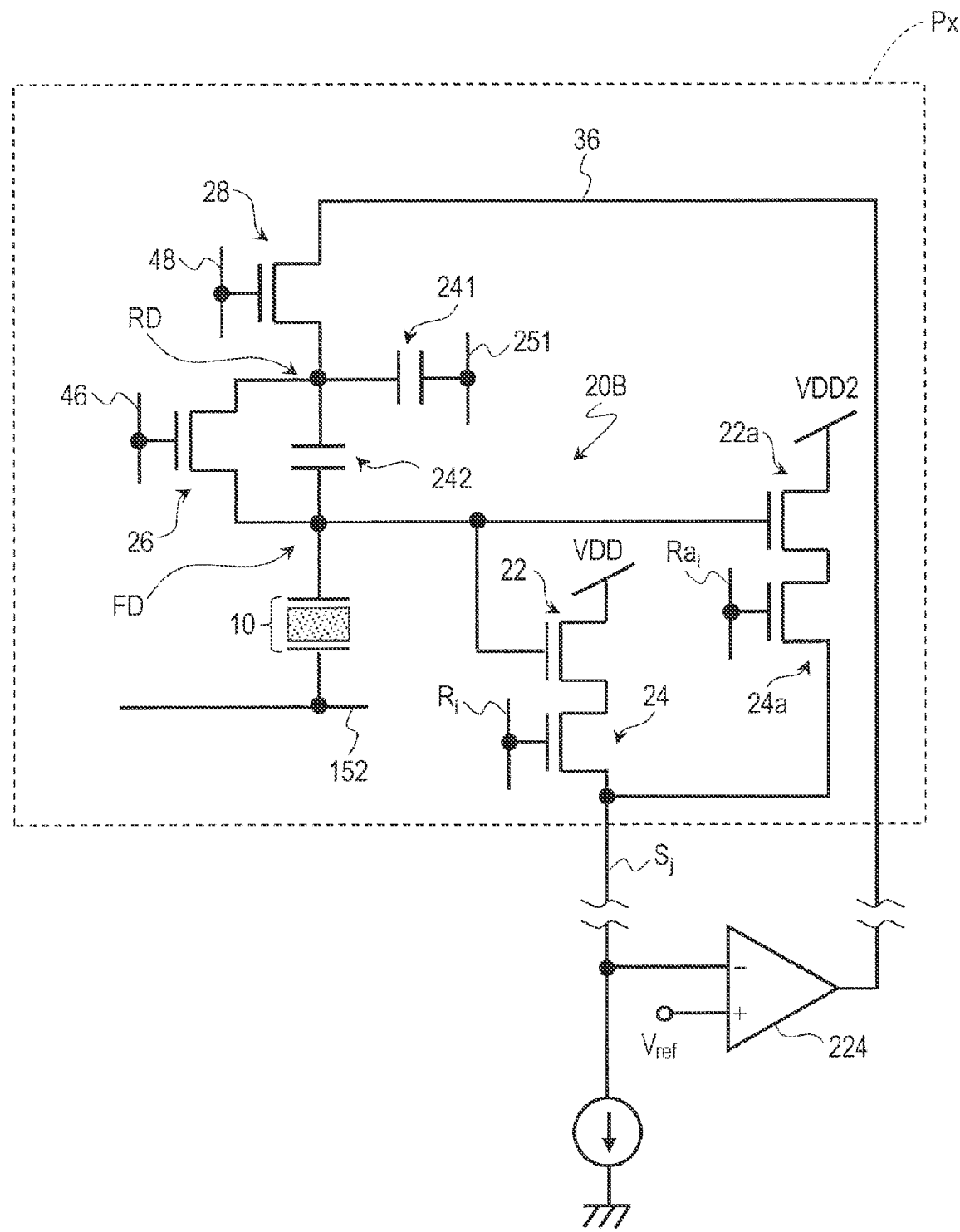
FIG. 21 is a drawing depicting a second modified example of the output circuit included in the pixel.

FIG. 21 depicts a second modified example of the output circuit included in the pixels Px. Compared to the configuration described with reference to FIG. 19, an output circuit 20B depicted in FIG. 21 further includes a set of a signal detection transistor 22a and an address transistor 24a. As depicted, the set of the signal detection transistor 22a and the address transistor 24a is coupled in parallel to a set of the signal detection transistor 22 and the address transistor 24. To be precise, the gate of the signal detection transistor 22a is coupled to the node FD, and the source of the address transistor 24a is coupled to an output signal line $S_j$.

The gate of the signal detection transistor 22 and the gate of the signal detection transistor 22a are both coupled to the node FD. In contrast, the drain of the signal detection transistor 22 and the drain of the signal detection transistor 22a are, for example, each coupled to separate voltage lines, and it thereby becomes possible to apply mutually different voltages during operation of the imaging device 100A. In this example, during operation of the imaging device 100A, the VDD serving as a third voltage is applied to the drain of the signal detection transistor 22, and a fourth voltage VDD2 that is higher than the VDD is applied to the drain of the signal detection transistor 22a.

In the example depicted, a row signal line $Ra_i$ is coupled to the gate of the address transistor 24a. The row signal line $Ra_i$ is coupled to the row scanning circuit 120 in a manner similar to the row signal line Ri, for example, and the row scanning circuit 120 is thereby able to switch the address transistor 24a on and off by controlling the potential of the row signal line $Ra_i$, and read a potential corresponding to the amount of charge accumulated in the node FD to the output signal line $S_j$ via the signal detection transistor 22a and the address transistor 24a.

According to the output circuit 20B exemplified in FIG. 21, it is possible for the signal detection transistor 22a, to which the higher fourth voltage VDD2 is applied, to be used as a source follower. For example, in a case such as where the potential of the node FD exceeds the power source voltage VDD, the control circuit 160 can cause the row scanning circuit 120 to be driven in such a way that the address transistor 24 is set to off-state and the address transistor 24a is set to on-state, when a signal is read.

In this way, which of two source followers having mutually different magnitudes for source follower power sources is to be used to carry out signal reading may be switched in accordance with the potential of the node FD. According to this kind of configuration, signal reading becomes possible even in a case where the potential of the node FD exceeds the power source voltage VDD. It should be noted that, instead of mutually varying the voltages applied to the drains, transistors having mutually different threshold voltages may be used as the signal detection transistor 22 and the signal detection transistor 22a. In this case, the aforementioned effect similar to the case where a plurality of source followers are provided can be obtained while the voltage applied to the drains is made common. Furthermore, instead of providing a plurality of source followers, the voltage to be applied to the drain of the signal detection transistor 22 may be switched between a third voltage and a fourth voltage in accordance with the potential of the node FD.

Figure 22:
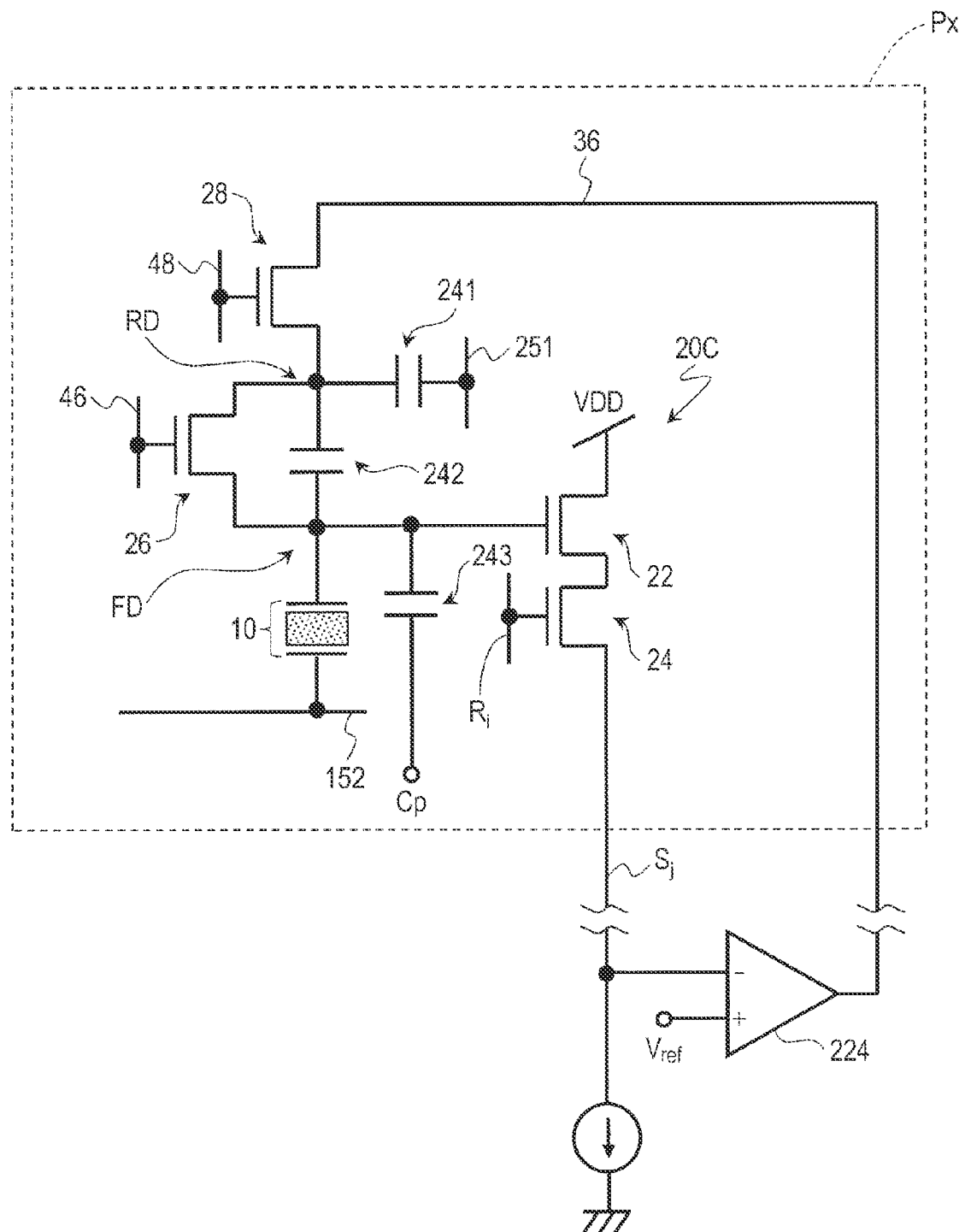
FIG. 22 is a drawing depicting a third modified example of the output circuit included in the pixel.

FIG. 22 depicts a third modified example of the output circuit included in the pixels Px. An output circuit 20C depicted in FIG. 22 has a third capacitor 243 having one electrode coupled to the node FD. An undepicted voltage supply circuit, for example, is coupled to the other electrode of the third capacitor 243, and a pulse voltage Cp, for example, is applied to the other electrode of the third capacitor 243 when a signal that corresponds to signal charges accumulated in the node FD is read.

By applying the pulse voltage Cp, the potential of the node FD can be temporarily lowered by means of coupling by way of the third capacitor 243. Therefore, when a signal is read, the potential of the node FD can be selectively decreased for the potential of the node FD to be a level that is less than the VDD, with the quantity of signal charges accumulated in the node FD being retained. That is, even in a case such as where the potential of the node FD exceeds the power source voltage, it becomes possible to read a signal by way of the signal detection transistor 22 without boosting the power source voltage.

Figure 23:
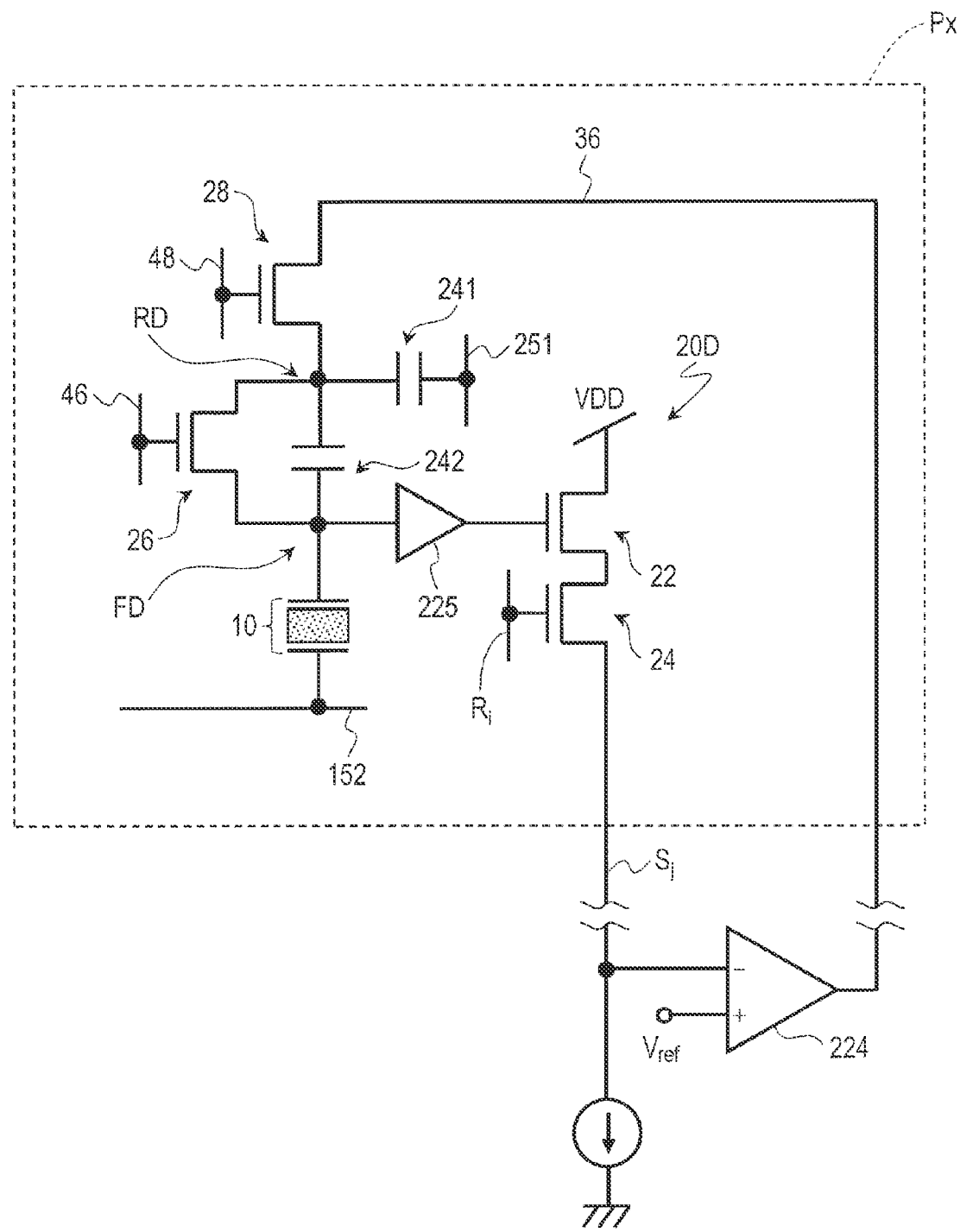
FIG. 23 is a drawing depicting a fourth modified example of the output circuit included in the pixel.

FIG. 23 depicts a fourth modified example of the output circuit included in the pixels Px. An output circuit 20D depicted in FIG. 23 has an attenuator 225 that is coupled between the photoelectric converter 10 and the gate of the signal detection transistor 22.

Figure 24:
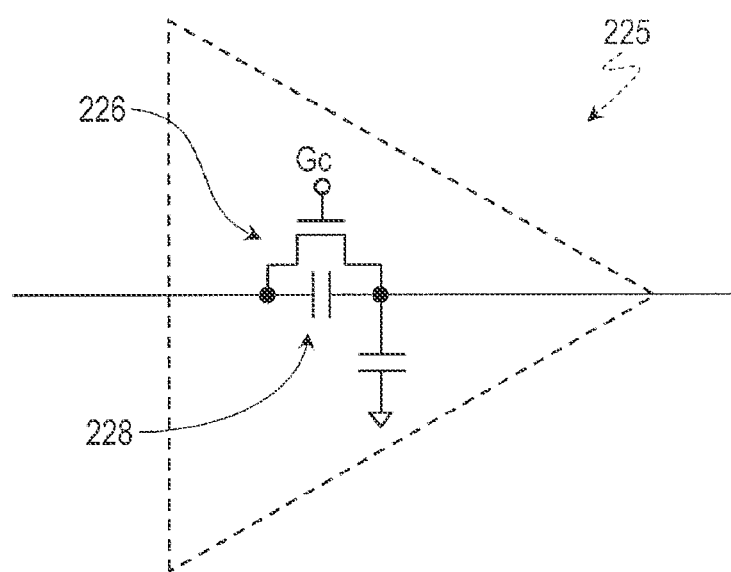
FIG. 24 is a drawing depicting a specific example of an attenuator depicted in FIG. 23.

FIG. 24 depicts a specific example of the attenuator 225 depicted in FIG. 23. In the configuration exemplified in FIG. 24, the attenuator 225 has a capacitor 228 and a gain control transistor 226 that serves as a switching element coupled in parallel to the capacitor 228.

During operation, again control signal Gc is applied from the row scanning circuit 120, for example, to the gate of the gain control transistor 226. For example, in a case such as where the potential of the node FD exceeds the power source voltage VDD, the control circuit 160 can cause the row scanning circuit 120 to be driven in such a way that the gain control transistor 226 is set to off-state, when a signal is read. Due to the gain control transistor 226 being set to off-state, the capacitor 228 is coupled to the node FD, and the capacitance value of the entire node FD can be increased. In other words, the attenuator 225 can attenuate the voltage applied to the gate of the signal detection transistor 22, by a predetermined proportion, and it consequently becomes possible to read a signal by way of the signal detection transistor 22 without boosting the power source voltage. In the present specification, the term "attenuator" is not restricted to a circuit element that is realized in combination with a switching element and a capacitor for smoothing, and is interpreted as broadly including also a level shifter, a gain amplifier, and the like.

(Use of Voltage in First Voltage Range)

In the aforementioned FIG. 12, a line G0 indicating a change in the level of the output signals with respect to a change in the quantity of light, produced when a voltage of 2 V is applied to the opposite electrode 11, is depicted as a dashed line together with lines G1 and G2. From FIG. 12, in a region in which the quantity of light is comparatively small when a voltage selected from the first voltage range is applied to the opposite electrode 11, the level of the signals indicates a linear change with respect to a change in the quantity of light, and it is understood that linearity can be ensured. When the quantity of light increases further, the degree of the increase in the level of the signals with respect to the increase in the quantity of light decreases, and a graph depicting a change in the level of the signals with respect to a change in the quantity of light comes to indicate a change having a curved form. This means that, in a state in which a voltage selected from the first voltage range is applied to the opposite electrode 11, the level of the signals automatically decreases in accordance with an increase in the quantity of light. In other words, the dynamic range relating to the direction in which the illuminance is high is expanded. Using this, as described hereinafter, the dynamic range relating to the direction in which the illuminance is high can be expanded compared to a case where the level of the signals changes in a linear form in accordance with an increase in the quantity of light.

Referring to the line G0, in a region in which the illuminance is higher, there is an increase in the deviation from a straight line in a line depicting a change in the level of the signals with respect to a change in the quantity of light. This is because, as the potential difference ΔV decreases, effects such as a decrease in charge pairs generated by photoelectric conversion and an increase in the disappearance of charge pairs due to recombination appear more easily.

However, by obtaining a characteristic curve such as that depicted in FIG. 12 in advance, it becomes possible to carry out an appropriate correction to the level of the signals detected by the detection circuit 130A. For example, correction coefficients corresponding to quantities of light may be stored in the memory 162 in advance in the form of a table, for example, and the pixel value of each pixel Px may be determined by multiplying by a correction coefficient. Due to this kind of correction, linearity is compensated, and it becomes possible to further expand the dynamic range relating to the direction in which the illuminance is high. For example, compared to the case where the level of the signals changes in a linear form in accordance with an increase in the quantity of light, the dynamic range relating to the direction in which the illuminance is high can be approximately tripled. For example, control may be executed in such a way that the first voltage V1 in the first voltage range is supplied to the photoelectric converters 10 in an environment in which illuminance is comparatively high, and the second voltage V2 in the second voltage range is supplied to the photoelectric converters 10 in an environment in which illuminance is comparatively low.

A correction for the level of the signals detected can be executed by the image processing circuit 164. The function of the image processing circuit 164, similar to the control circuit 160, may be realized by means either of a combination of a general-purpose processing circuit and software, and hardware specifically for image processing. A correction for the level of the signals detected may be executed by the control circuit 160.

According to control with which the first voltage V1 in the first voltage range is supplied to the photoelectric converters 10 in an environment in which illuminance is comparatively high, and the second voltage V2 in the second voltage range is supplied to the photoelectric converters 10 in an environment in which illuminance is comparatively low, sensitivity can be changed dynamically in accordance with a change in illuminance. For example, at the standard setting, the second voltage V2 in the second voltage range is used as the voltage supplied to the photoelectric converters 10, and, in an environment in which illuminance is comparatively high, the first voltage V1 in the first voltage range is used as the voltage supplied to the photoelectric converters 10, and it thereby becomes possible for sensitivity to be decreased automatically. In addition, in a state in which illuminance is comparatively high and the first voltage V1 in the first voltage range is supplied to the photoelectric converters 10, when the illuminance further increases, the potential difference ΔV reduces in accordance with the accumulation of electron holes in the impurity region 111. As a result, the photoelectric conversion efficiency η changes in a further decreasing direction, and therefore the dynamic range relating to the direction in which the illuminance is high can be further expanded.

In this way, it becomes possible to realize an ND filter function so to speak by means of electrical control, by using a voltage in the first voltage range as the first voltage V1. Consequently, it is no longer necessary to prepare a plurality of ND filters even for a photographing scene for which it has heretofore been necessary for one appropriate ND filter to be selected and used from among a plurality of ND filters, and the effect of simplifying photographic equipment can be obtained. For example, it becomes possible to also implement continuous alteration, in other words, stepless control, of sensitivity that was not possible with a conventional silicon image sensor, and it is possible to increase the degree of freedom of photographing that corresponds to the scene.

Modified Examples

Figure 25:
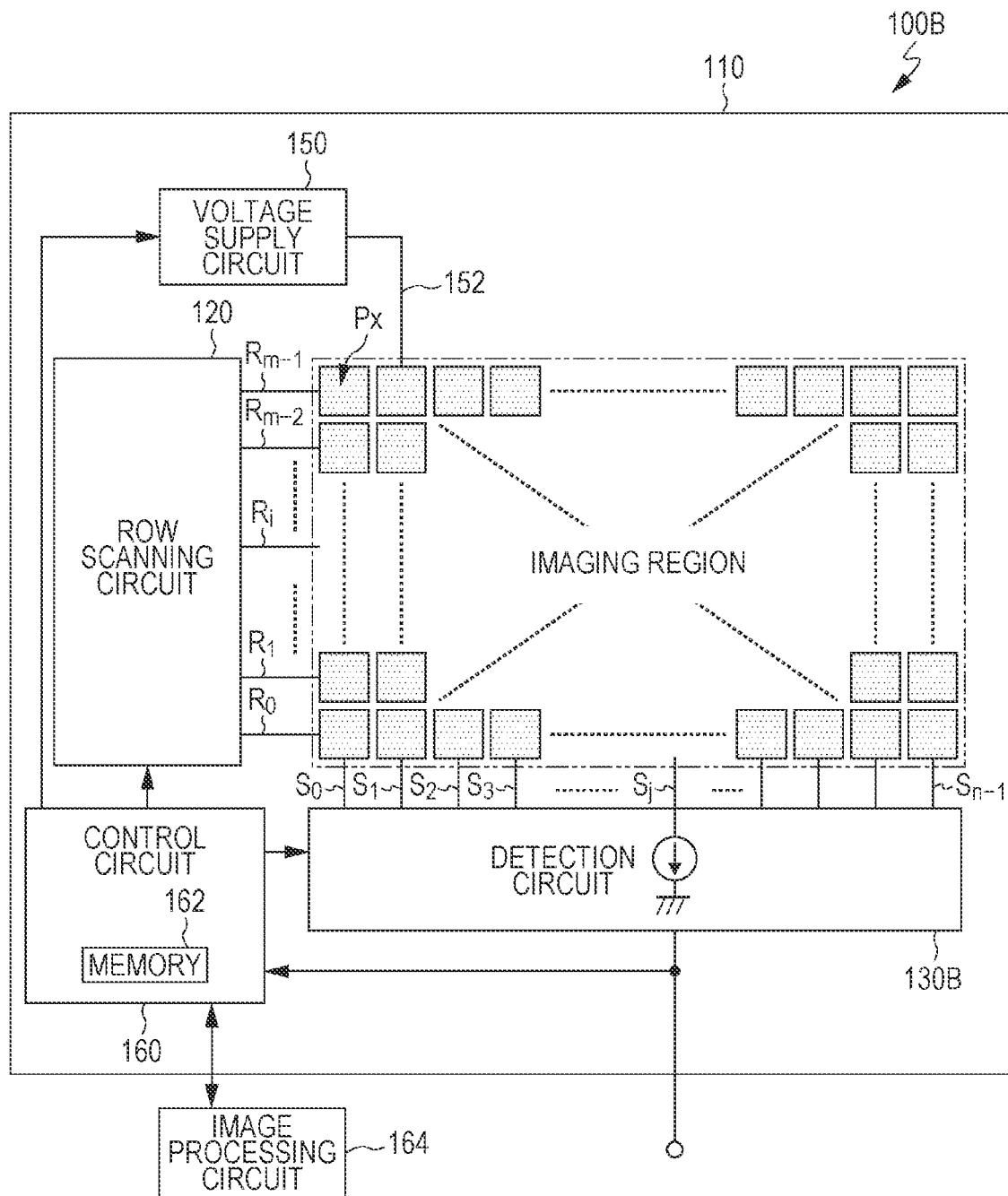
FIG. 25 is a drawing depicting an exemplary circuit configuration of an imaging device according to a modified example of the first embodiment.

FIG. 25 depicts an exemplary circuit configuration of an imaging device according to a modified example of the first embodiment. Compared to the configuration of the imaging device 100A described with reference to FIG. 1, an imaging device 100B depicted in FIG. 25 has a detection circuit 130B instead of the detection circuit 130A. The detection circuit 130B does not have the comparator 134.

The detection circuit 130B, for example, includes an analog-digital conversion circuit, and outputs digital data expressing the magnitudes of the voltages of the output signal lines $S_j$ detected, to the control circuit 160. The control circuit 160 determines whether or not the level of a signal that is output from the output circuit 20 of each pixel Px is greater than or equal to a predetermined level, on the basis of input from the detection circuit 130B. A threshold value constituting a basis for the determination can be stored in advance in the memory 162, for example. In a case where, for example, a digital value received from the detection circuit 130B is less than the threshold value retained in the memory 162, the control circuit 160 determines that the quantity of light incident on the photoelectric converters 10 is less than the predetermined quantity of light, and causes the voltage supply circuit 150 to be driven in such a way that the relatively low first voltage V1 is applied to the voltage line 152. According to such a configuration, it is possible to reduce the area taken up by the detection circuit 130B on the semiconductor substrate 110 compared to the case where the comparator 134 is arranged inside the detection circuit. It should be noted that whether or not the quantity of light incident on the photoelectric converters 10 is greater than or equal to the predetermined quantity of light may be determined by the image processing circuit 164.

In the aforementioned examples, the voltage applied to the opposite electrode 11 of the photoelectric converters 10 is switched between the first voltage V1 and the second voltage V2 in accordance with the illuminance. However, the subject for switching the applied voltage is not restricted to the opposite electrode 11, and the voltage applied to the pixel electrode 12 may be switched between two voltages, as described hereinafter.

Figure 26:
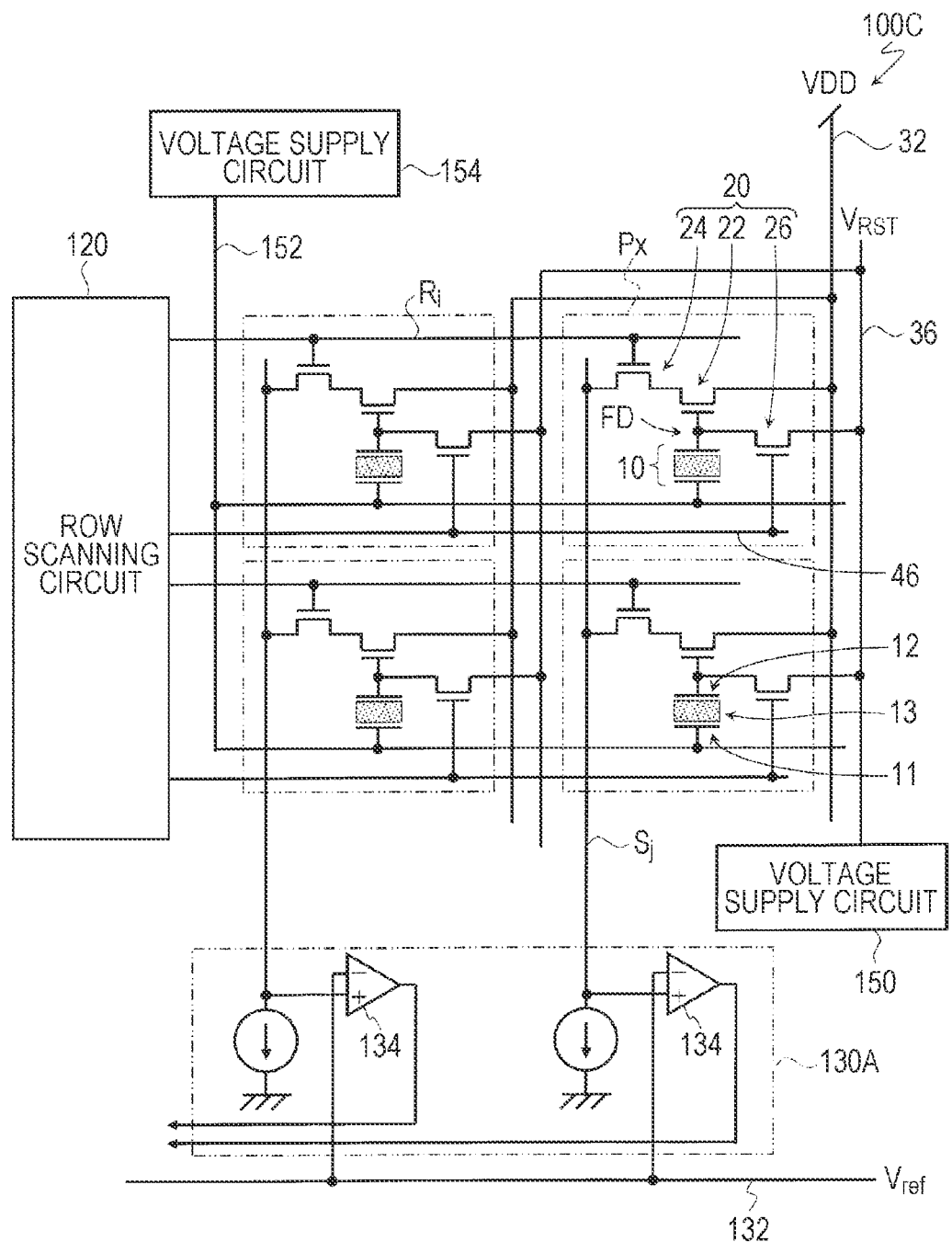
FIG. 26 is a drawing depicting an exemplary circuit configuration of an imaging device according to another modified example of the first embodiment.

FIG. 26 depicts an exemplary circuit configuration of an imaging device according to another modified example of the first embodiment. The main difference between the circuit configuration of an imaging device 100C depicted in FIG. 26 and the circuit configuration of the imaging device 100A described with reference to FIG. 2 is that, in the imaging device 100C, the voltage supply circuit 150 that supplies the first voltage V1 and the second voltage V2 is coupled to the reset voltage line 36. In other words, in this example, at least two mutually different voltages are selectively supplied as the reset voltage $V_{RST}$ to the reset voltage line 36. It should be noted that a second voltage supply circuit 154 is coupled to the voltage line 152 in the configuration exemplified in FIG. 26. The second voltage supply circuit 154 basically supplies a fixed voltage to the voltage line 152 during exposure. It should be noted that the voltage supply circuit 154 may be a separate component that is independent from the voltage supply circuit 150, or the voltage supply circuits 150 and 154 may each be part of a single voltage supply circuit.

The control circuit 160, which is not depicted in FIG. 26, for example, determines whether or not the illuminance on the photoelectric converters 10 is greater than or equal to a predetermined illuminance, on the basis of the level of the output signals detected by the detection circuit 130A, before the start of a frame in which an image is to be acquired. In a case where, for example, the illuminance on the photoelectric converters 10 is less than the predetermined illuminance, the control circuit 160, for example, drives the voltage supply circuit 150 in such a way that the relatively high second voltage V2 from among the first voltage V1 and the second voltage V2 is applied as the reset voltage $V_{RST}$ to the reset voltage line 36. Each pixel Px resets the photoelectric converter 10 on the basis of the second voltage V2, in other words, resets the potentials of the pixel electrode 12 and the impurity region 111 serving as a charge accumulation uni.

Here, the voltage supply circuit 150 supplies a voltage of 6 V, for example, as the second voltage V2 to the reset voltage line 36. Consequently, the potential of the pixel electrode 12 of each pixel Px after execution of the reset is 6 V. At such time, the voltage supply circuit 154 applies a voltage of 12 V, for example, to the opposite electrode 11 of each pixel Px via the voltage line 152. In other words, the potential difference ΔV between the opposite electrode 11 and the pixel electrode 12 at such time is 6V.

However, in a case where the illuminance on the photoelectric converters 10 is greater than or equal to the predetermined illuminance, that is, in an environment having a high illuminance, the relatively low first voltage V1 is supplied to the reset voltage line 36 from the voltage supply circuit 150. For example, in a case where a voltage of 1 V, for example, is used as the first voltage V1, the potential difference ΔV between the opposite electrode 11 and the pixel electrode 12 increases to 11 V compared to a state in which the second voltage V2 is applied to the reset voltage line 36. In other words, photographing at a higher sensitivity becomes possible. In this example, a voltage in the first voltage range is used as the first voltage V1 and a voltage in the second voltage range is used as the second voltage V2. Voltages in the second voltage range may be used for both the first voltage V1 and the second voltage V2. However, it is not essential to use voltages in the second voltage range as the first voltage V1 and the second voltage V2.

Here, an example has been described in which the second voltage V2 is applied to the reset voltage line 36 in a case where the illuminance on the photoelectric converters 10 is less than the predetermined illuminance, and the relatively low first voltage V1 is applied to the reset voltage line 36 in a case where the illuminance is greater than or equal to the predetermined illuminance. However, it should be noted that the relationship of the applied voltage to the illuminance is not restricted to this example. The voltage supply circuit 150 may be driven in such a way that the first voltage V1 is applied to the reset voltage line 36 in a case where the illuminance on the photoelectric converters 10 is less than the predetermined illuminance, and the relatively high second voltage V2 is applied to the reset voltage line 36 in a case where the illuminance is greater than or equal to the predetermined illuminance. At such time, a voltage that is lower than the first voltage V1 may be supplied to the opposite electrode 11.

Second Embodiment

Figure 27:
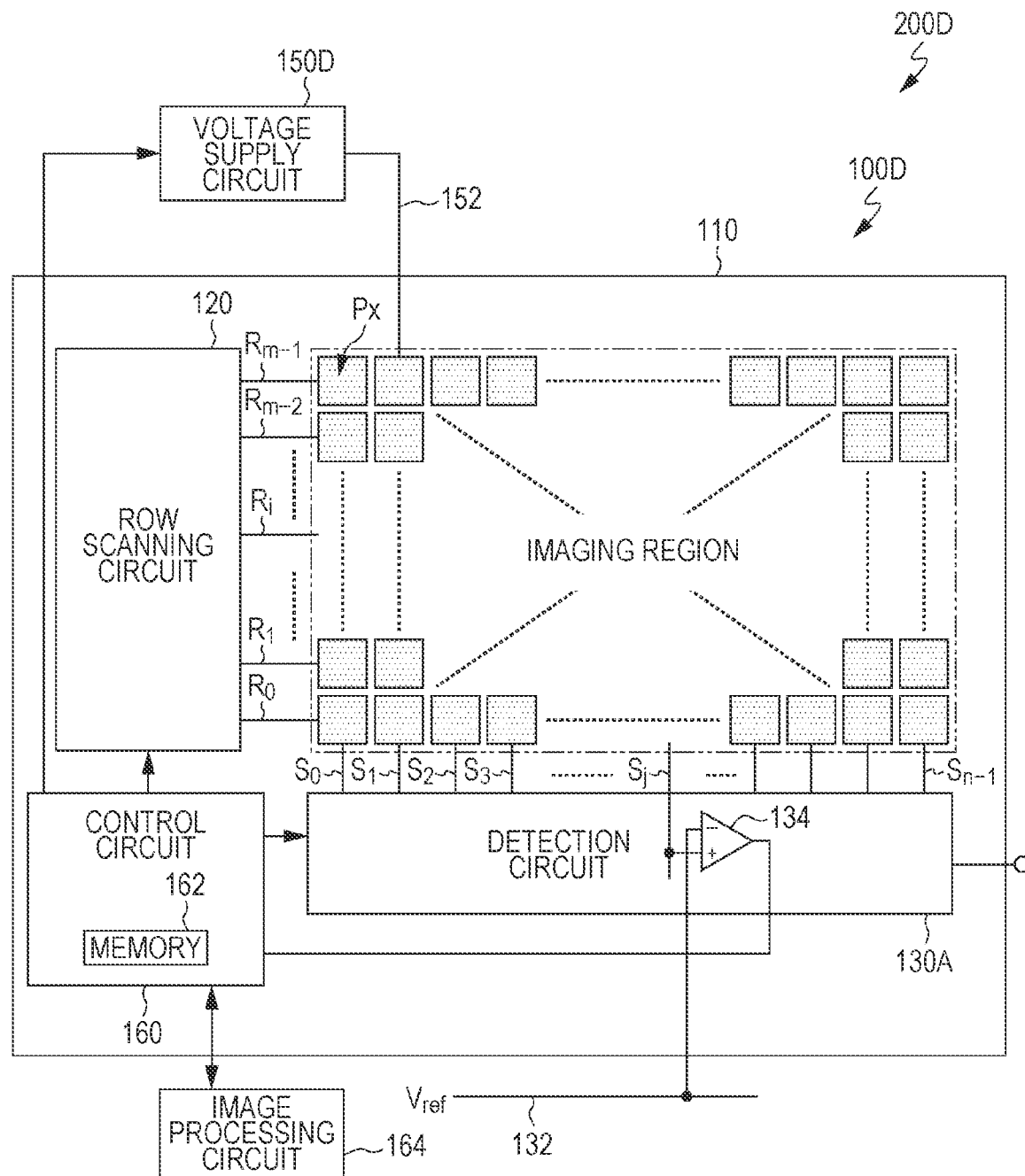
FIG. 27 is a drawing schematically depicting an exemplary configuration of a camera system according to a second embodiment of the present disclosure.

FIG. 27 schematically depicts an exemplary configuration of a camera system according to a second embodiment of the present disclosure. A camera system 200D depicted in FIG. 27 schematically includes an imaging device 100D and a voltage supply circuit 150D.

Compared to the imaging device 100A depicted in FIG. 1, the imaging device 100D depicted in FIG. 27 has a common point in including the plurality of pixels Px each having the photoelectric converter 10 and the output circuit 20, and the detection circuit 130A coupled to the output circuit 20 of each pixel Px. In the configuration exemplified in FIG. 27, the output circuits 20 and the detection circuit 130A are both formed on the semiconductor substrate 110. The photoelectric converters 10, the output circuits 20, and the detection circuit 130A may be provided in the form of a package in which these are integrated.

In the configuration exemplified in 27, the voltage supply circuit 150D is arranged within the camera system 200D in the form of a chip or a package, for example, as an element that is separate from a package that includes the photoelectric converters 10, the output circuits 20, and the detection circuit 130A, for example. For example, the voltage supply circuit 150D may be formed on a substrate that is different from the semiconductor substrate 110 on which the pixels Px are arranged. However, the voltage supply circuit 150D being coupled to one of the opposite electrode 11 and the pixel electrode 12 of each pixel Px is similar to the first embodiment.

The operation in the camera system 200D may be similar to the first embodiment. For example, the detection circuit 130A detects the level of a signal that is output from the output circuit 20 of each pixel Px. The voltage supply circuit 150D applies the first voltage V1 to the voltage line 152 in a case where the level of the output signals detected by the detection circuit 130A is lower than a predetermined voltage level, on the basis of a drive signal from the control circuit 160. In a case where the level of the output signals detected by the detection circuit 130A is greater than or equal to the predetermined voltage level, the second voltage V2 that is higher than the first voltage V1 is applied to the voltage line 152.

In this way, it is not essential for all of the semiconductor substrate 110 on which the plurality of pixels Px are formed, the row scanning circuit 120, the detection circuit 130A, the voltage supply circuit 150D, and the control circuit 160 to be integrated in the form of a chip or a package, for example. Some of these elements may be arranged in another package or substrate, and functions similar to those of the imaging device according to the first embodiment can be demonstrated also according to this kind of camera system configuration.

Figure 28:
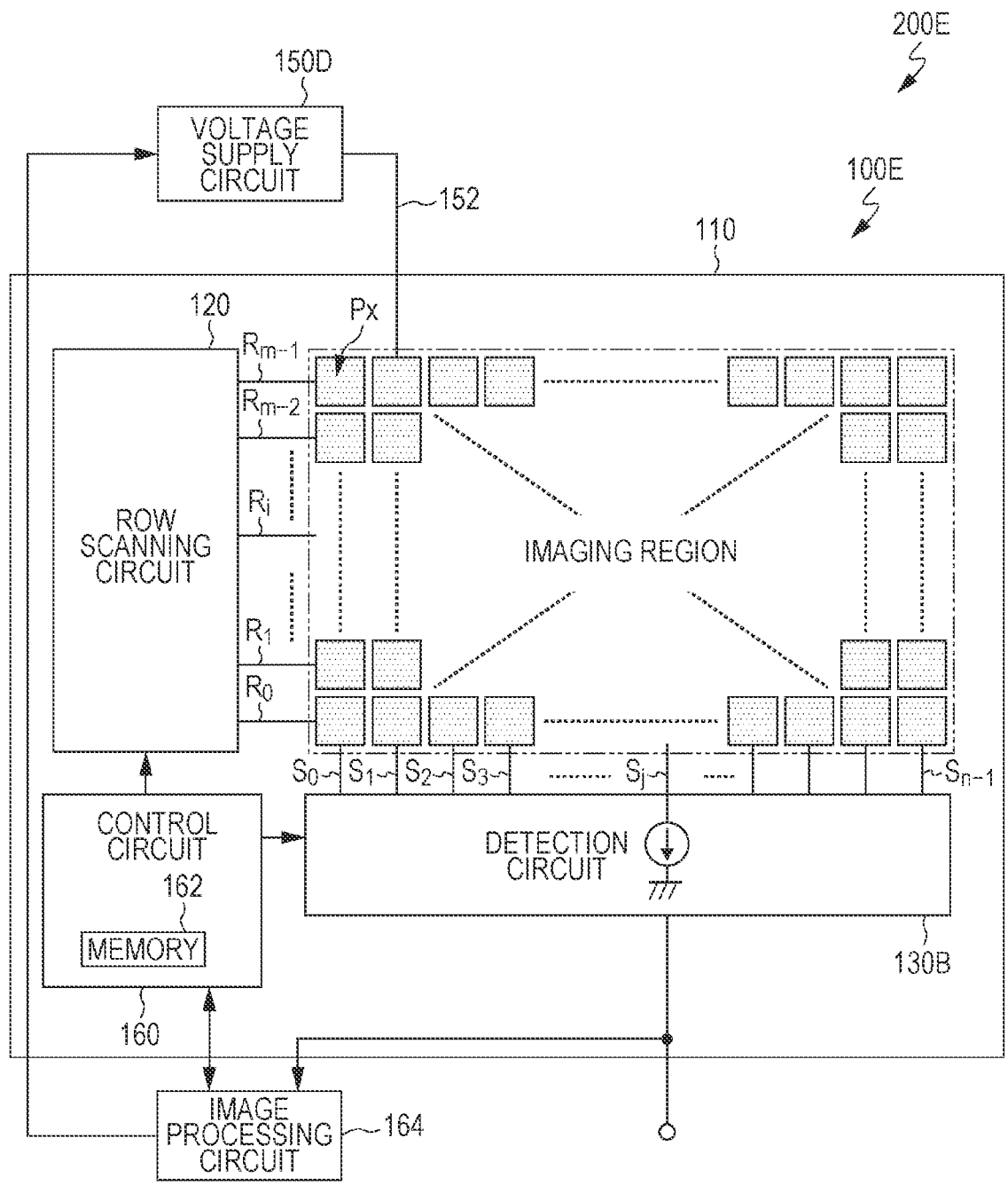
FIG. 28 is a drawing schematically depicting another exemplary configuration of the camera system according to the second embodiment of the present disclosure.

FIG. 28 schematically depicts another exemplary configuration of the camera system according to the second embodiment of the present disclosure. The main difference between the camera system 200D depicted in FIG. 27 and a camera system 200E depicted in FIG. 28 is that the camera system 200E has an imaging device 100E instead of the imaging device 100D. Compared to the imaging device 100D, the imaging device 100E has the detection circuit 130B instead of the detection circuit 130A, and, in this example, the output of the detection circuit 130B is input to the image processing circuit 164.

In the configuration exemplified in FIG. 28, the image processing circuit 164 receives an output signal of the detection circuit 130B, and executes a comparison with a predetermined threshold value on the basis of the output signal from the detection circuit 130B. In other words, the image processing circuit 164 compares the input from the detection circuit 130B and a threshold value stored in the memory 162, for example, and thereby determines whether or not the quantity of light incident on the photoelectric converters 10 is greater than or equal to a predetermined quantity of light. Data indicating the determination result is passed to the voltage supply circuit 150D, for example.

In a case where it has been determined that the level of the signal that is output from the output circuit 20 of each pixel Px is lower than the predetermined level, in other words, that the quantity of light incident on the photoelectric converters 10 is lower than the predetermined quantity of light, the voltage supply circuit 150D supplies the relatively low first voltage V1 to the voltage line 152. In a case where it has been determined that the quantity of light incident on the photoelectric converters 10 is greater than or equal to the predetermined quantity of light, the voltage supply circuit 150D supplies the second voltage V2 to the voltage line 152.

According to a configuration such as that exemplified in FIG. 28, the voltage supply circuit 150D and the image processing circuit 164 are arranged within the camera system 200E in the form of elements that are separate from the imaging device 100E, for example, as separate chips or separate packages, and therefore the degree of freedom of the design for the voltage level used and/or the voltage input timing is improved and more flexible control becomes possible. Consequently, an advantage can be obtained in that it is possible to avoid the use of a higher voltage or an increase in the chip size.

Figure 29:
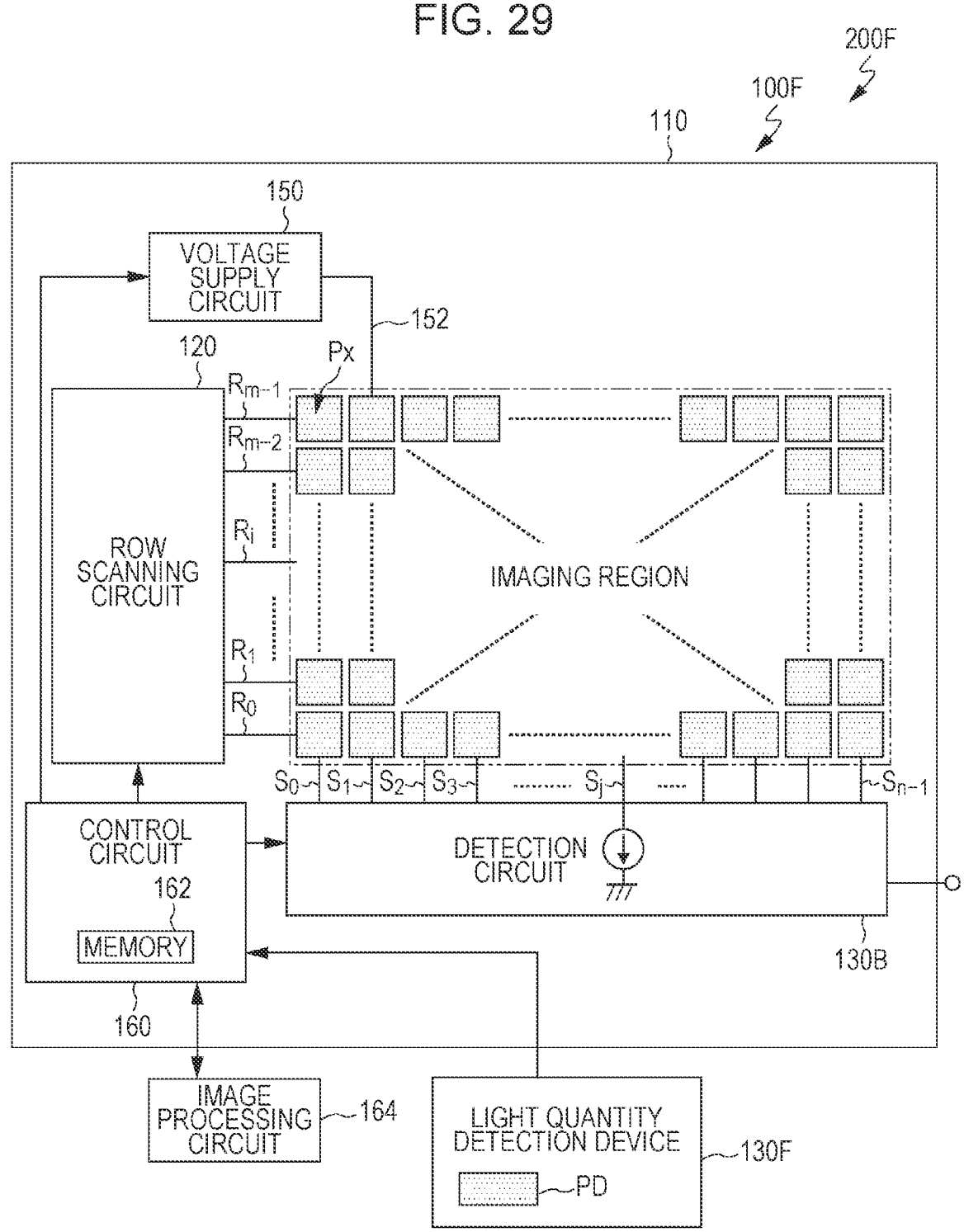
FIG. 29 is a drawing schematically depicting yet another exemplary configuration of the camera system according to the second embodiment of the present disclosure.

FIG. 29 schematically depicts yet another exemplary configuration of the camera system according to the second embodiment of the present disclosure. A camera system 200F depicted in FIG. 29 schematically includes an imaging device 100F and a light quantity detector 130F.

The imaging device 100F has a common point with the imaging device 100A depicted in FIG. 1 in including the plurality of pixels Px each having the photoelectric converter 10 and the output circuit 20, and the voltage supply circuit 150 coupled to the photoelectric converter 10 of each pixel Px. The imaging device 100F also includes the detection circuit 130B coupled to the output circuits 20. The detection circuit 130B has a common point with the aforementioned detection circuit 130A in detecting the level of the signal that is output from the output circuit 20 of each pixel Px; however, here, the detection circuit 130B does not have the function of comparing the detected level of the signals and a predetermined threshold value, and mainly carries out functions of noise-suppression signal processing, analog-digital conversion, and the like. It should be noted that, in this example, similar to the configuration exemplified in FIG. 1, the voltage supply circuit 150 is coupled to the voltage line 152 coupled to the opposite electrodes 11, and is configured in such a way that the first voltage V1 or the second voltage V2 can be selectively supplied to the opposite electrodes 11.

The light quantity detector 130F is arranged within the camera system 200F as an element that is separate from the imaging device 100F provided in the form of a single chip or package, for example. The light quantity detector 130F includes in a portion thereof a photodiode PD, for example, and detects the quantity of light incident on the imaging region formed from the plurality of pixels Px. The light quantity detector 130F can be a publicly known illuminance sensor module including a photoelectric conversion element such as a photodiode and an illuminance sensor IC, for example.

In the configuration exemplified in FIG. 29, the control circuit 160 determines whether or not the quantity of light incident on the photoelectric converters 10 arranged in the imaging region is greater than or equal to a predetermined quantity of light on the basis of output from the light quantity detector 130F, for example. The control circuit 160, in addition, similar to the first embodiment, determines whether to cause the first voltage V1 or the second voltage V2 to be supplied to the voltage line 152 from the voltage supply circuit 150, in accordance with the determination result as to whether or not the quantity of light incident on the photoelectric converters 10 is greater than or equal to the predetermined quantity of light. The voltage supply circuit 150 applies the first voltage V1 to the voltage line 152 in a case where the quantity of light incident on the photoelectric converters 10 is less than the predetermined quantity of light, for example, on the basis of a drive signal from the control circuit 160. In a case where the quantity of light incident on the photoelectric converters 10 is greater than or equal to the predetermined quantity of light, the second voltage V2 that is higher than the first voltage V1 is applied to the voltage line 152.

Figure 30:
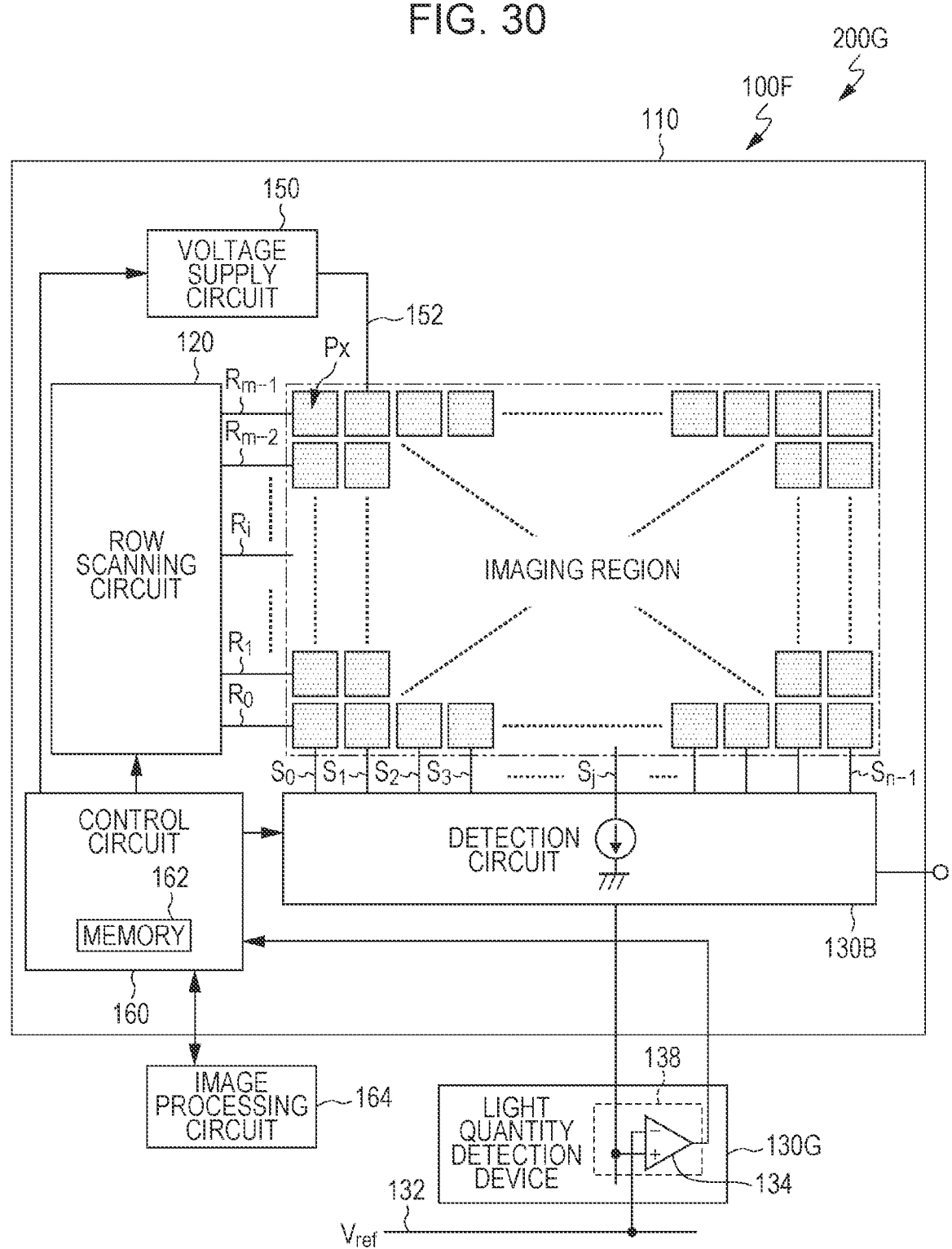
FIG. 30 is a drawing depicting a modified example of a light quantity detector.

FIG. 30 depicts a modified example of the light quantity detector. Compared to the example described with reference to FIG. 29, a camera system 200G depicted in FIG. 30 has a light quantity detector 130G including a light quantity detection circuit 138 instead of the photodiode PD.

In the configuration exemplified in FIG. 30, the light quantity detection circuit 138 includes the comparator 134, which outputs a comparison result for the voltage levels of the output signal lines $S_j$ with respect to the voltage level of the reference line 132. In other words, in this example, the light quantity detection circuit 138 detects the level of output signals from the output circuits 20, and carries out a comparison with the voltage level of the reference line 132. The comparison result is returned to the control circuit 160, and the control circuit 160 determines whether or not the quantity of light incident on the photoelectric converters 10 is greater than or equal to the predetermined quantity of light, on the basis of the detection result according to the light quantity detection circuit 138.

In this way, instead of a direct measurement of the quantity of light by means of an illuminance sensor module or the like, information relating to the quantity of light incident on the photoelectric converters 10 may be obtained by way of detecting the level of the signals that are output from the pixels Px. For example, some or all of the plurality of pixels Px arranged in the imaging region may be made to function as an illuminance sensor. The acquisition of output signals from the pixels Px by the light quantity detector 130G may be carried out using a wired method or a wireless method.

Figure 31:
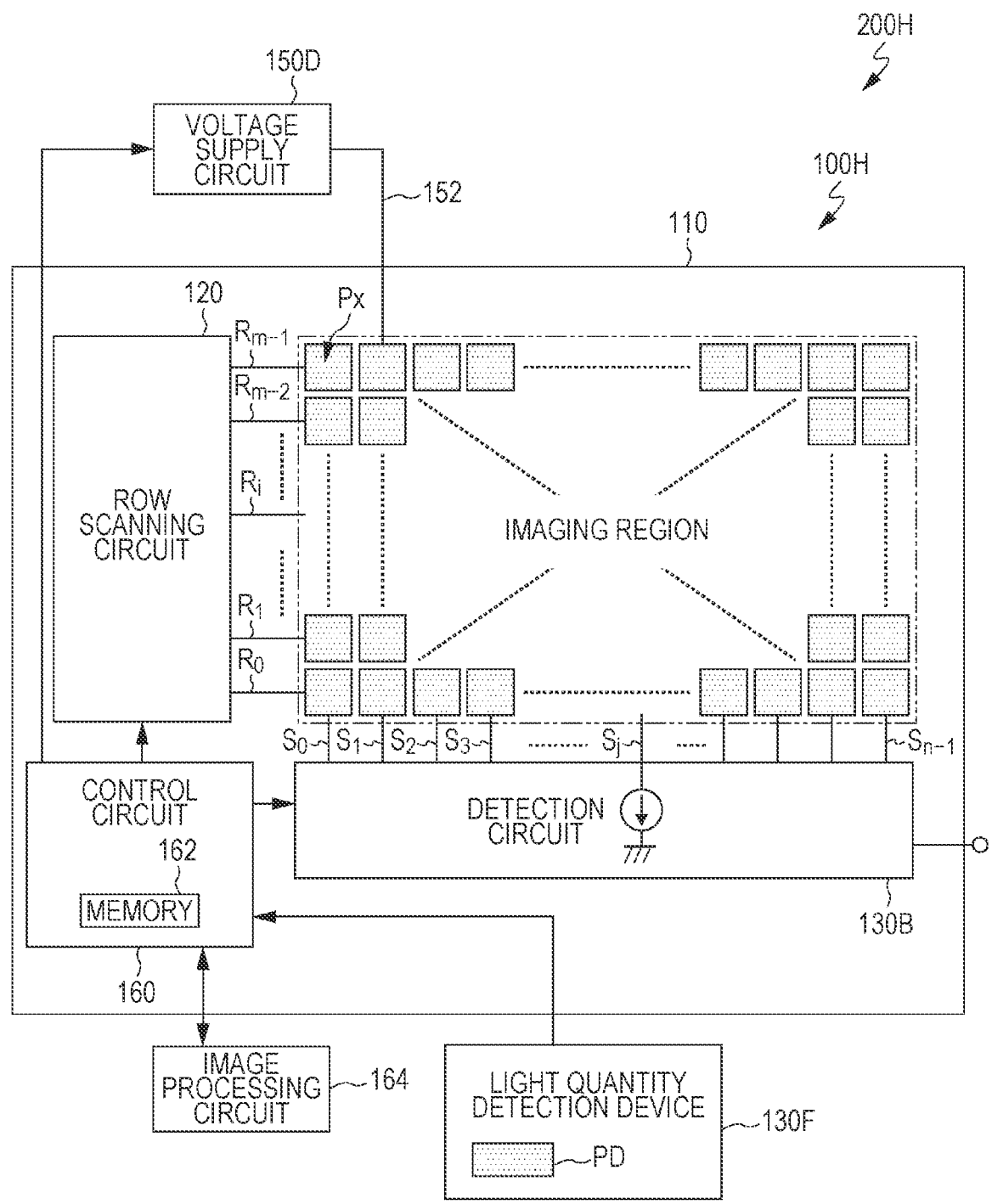
FIG. 31 is a drawing schematically depicting yet another exemplary configuration of the camera system according to the second embodiment of the present disclosure.

FIG. 31 schematically depicts yet another exemplary configuration of the camera system according to the second embodiment of the present disclosure. A camera system 200H depicted in FIG. 31 schematically includes an imaging device 100H including the plurality of pixels Px each having the photoelectric converter 10 and the output circuit 20, the voltage supply circuit 150D, and the light quantity detector 130F.

In this example, the voltage supply circuit 150D and the light quantity detector 130F are provided outside of the imaging device 100H as elements that are separate from the imaging device 100H. Similar to the example described with reference to FIG. 29, the control circuit 160 determines whether or not the quantity of light incident on the photoelectric converters 10 is greater than or equal to a predetermined quantity of light, on the basis of the quantity of light detected by the light quantity detector 130F. The control circuit 160 causes either of the first voltage V1 and the second voltage V2 to be applied to the voltage line 152 from the voltage supply circuit 150D, in accordance with the determination result.

The light quantity detector 130G depicted in FIG. 30 may be applied instead of the light quantity detector 130F. In other words, the level of the signal that is output from the output circuit 20 of each pixel Px may be obtained, and which of the first voltage V1 and the second voltage V2 is to be output from the voltage supply circuit 150D may be determined based on a comparison result between the level of the signals from the output circuits 20 and the predetermined threshold value.

(Processing at Timing of Voltage Switching and Stage Thereafter)

Next, a description will be given regarding correction processing corresponding to the timing of switching the voltage applied to the voltage line 152. As described hereinafter, a correction corresponding to the timing of switching the voltage applied to the voltage line 152 may be applied to the signal level detected by the detection circuits 130A and 130B. Hereinafter, a specific example of correction processing is described with the aforementioned imaging device 100A being used as an example; however, it goes without saying that it is possible for similar correction processing to be applied also to the imaging devices 100B and 100C and the camera systems 200D to 200H.

Figure 32:
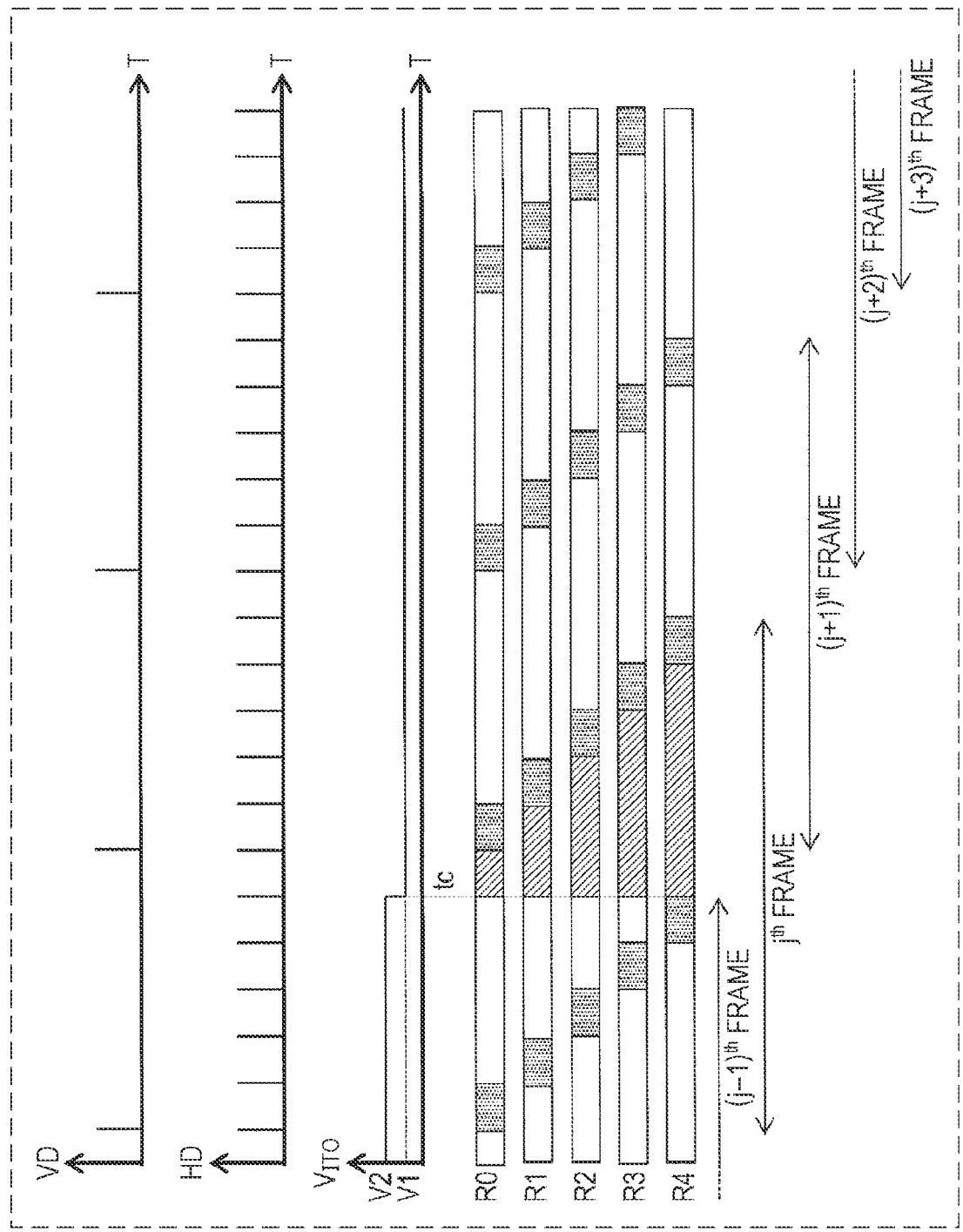
FIG. 32 is a drawing for describing the relationship between the timing of switching between the first voltage and the second voltage, and a change in the level of a signal acquired by a detection circuit, which accompanies the switching of the voltage.

FIG. 32 is a drawing for describing the relationship between the timing of switching between the first voltage V1 and the second voltage V2, and a change in the level of the signals acquired by the detection circuit 130A, which accompanies the switching of the voltage. In FIG. 32, the uppermost timing chart depicts the rise of a pulse of a vertical synchronization signal VD, the timing chart immediately therebelow depicts the rise of a pulse of a horizontal synchronization signal HD, and the next timing chart depicts a change in a voltage $V_{ITO}$ that is applied to the opposite electrodes 11 from the voltage line 152.

In FIG. 32, in the timing chart displayed second from the top, the period from the rise of a certain pulse to the rise of the next pulse corresponds to 1H, which is one horizontal scanning period. In this 1H period, signals from the pixels Px belonging to a one row from among the plurality of pixels Px are read. FIG. 32 schematically represents an operation in each row of the plurality of pixels Px by means of rectangles that extend in the horizontal direction. The white rectangles in FIG. 32 represent periods in which signal charges are accumulated, in other words, exposure periods. The shaded rectangles represent periods in which the voltage levels of the output signal lines $S_j$ are read by the detection circuit 130A. For simplicity, here, it is assumed that there are five rows of the plurality of pixels Px, and operations from row 0 to row 4 are schematically depicted. In FIG. 32, R0 to R4 respectively correspond to row 0 to row 4.

In FIG. 32, the bidirectional arrows in the lowermost section schematically depict frame periods. The timing for the start of each frame is the timing of the rise of a pulse of the vertical synchronization signal VD. In the example depicted in FIG. 32, the voltage supply circuit 150 switches the voltage supplied to the opposite electrodes 11 from the second voltage V2 to the relatively low first voltage V1 at a time tc that is during the $j^{th}$ frame period. In more detail, in the exposure period for each row in the $j^{th}$ frame period, the voltage applied to the voltage line 152 is switched to the first voltage V1.

In FIG. 32, the hatched rectangles schematically depict periods in which the first voltage V1 is applied to the opposite electrodes 11, within an exposure period included in the $j^{th}$ frame period. As is apparent from FIG. 32, when a rolling shutter is applied, if switching between the first voltage V1 and the second voltage V2 is executed in the exposure period for each row, a period in which signal charges are accumulated while the first voltage V1 is applied to the opposite electrodes 11 and a period in which signal charges are accumulated while the second voltage V2 is applied to the opposite electrodes 11 can become intermixed within one frame period. In addition, the ratio between the length of a period in which signal charges are accumulated while the first voltage V1 is applied to the opposite electrodes 11 and the length of a period in which signal charges are accumulated while the second voltage V2 is applied to the opposite electrodes 11 can be different for each row of the plurality of pixels Px.

Therefore, with an operation such as that depicted in FIG. 32, an advantage can be obtained in that there is no effect from switching voltages in frame periods other than the frame periods in which voltage switching is executed. However, on the other hand, vertical shading can occur in an image that is based on pixel signals acquired in a frame period in which voltage switching has been executed. In other words, variations in brightness can occur in each row. However, this kind of vertical shading caused by voltage switching can be corrected by means of processing such as that described hereinafter.

The level of the signal that is output from a pixel Px is generally proportional to the product of the sensitivity in the pixel Px and the length of the exposure period for that pixel Px. Here, the photoelectric converter 10 in a typical embodiment of the present disclosure can have photoelectric conversion characteristics in which the photoelectric conversion efficiency η changes due to a change in the potential difference ΔV between the opposite electrode 11 and the pixel electrode 12, as described with reference to FIG. 4. In other words, sensitivity in the pixels Px changes according to the voltage supplied to the voltage line 152 from the voltage supply circuit 150. Information relating to the way in which the photoelectric conversion efficiency η of each pixel Px changes due to a change in the potential difference ΔV can be acquired in advance by means of actual measurements or the like. Consequently, first, the product of the length T1 of a period in which signal charges are accumulated while the first voltage V1 is applied to the opposite electrodes 11 and the sensitivity S1 of the pixels Px in that period is calculated. Next, the product of the length T2 of a period in which signal charges are accumulated while the second voltage V2 is applied to the opposite electrodes 11 and the sensitivity S2 of the pixels Px in that period is calculated. A correction coefficient with which (T1*S1+T2*S2), which is the sum of the aforementioned, becomes uniform for each row is then multiplied with a digital value representing the signal level, for example. It is thereby possible to cancel the effect of voltage switching on an image. In other words, it is sufficient for a larger gain to be applied as the periods depicted as hatched rectangles in FIG. 32 become longer.

Processing for this kind of correction may be executed by the image processing circuit 164 or the control circuit 160, for example. The correction coefficient may be determined according to the magnitude of (T1*S1+T2*S2), and may be stored in the memory 162 or the like in advance.

Figure 33:
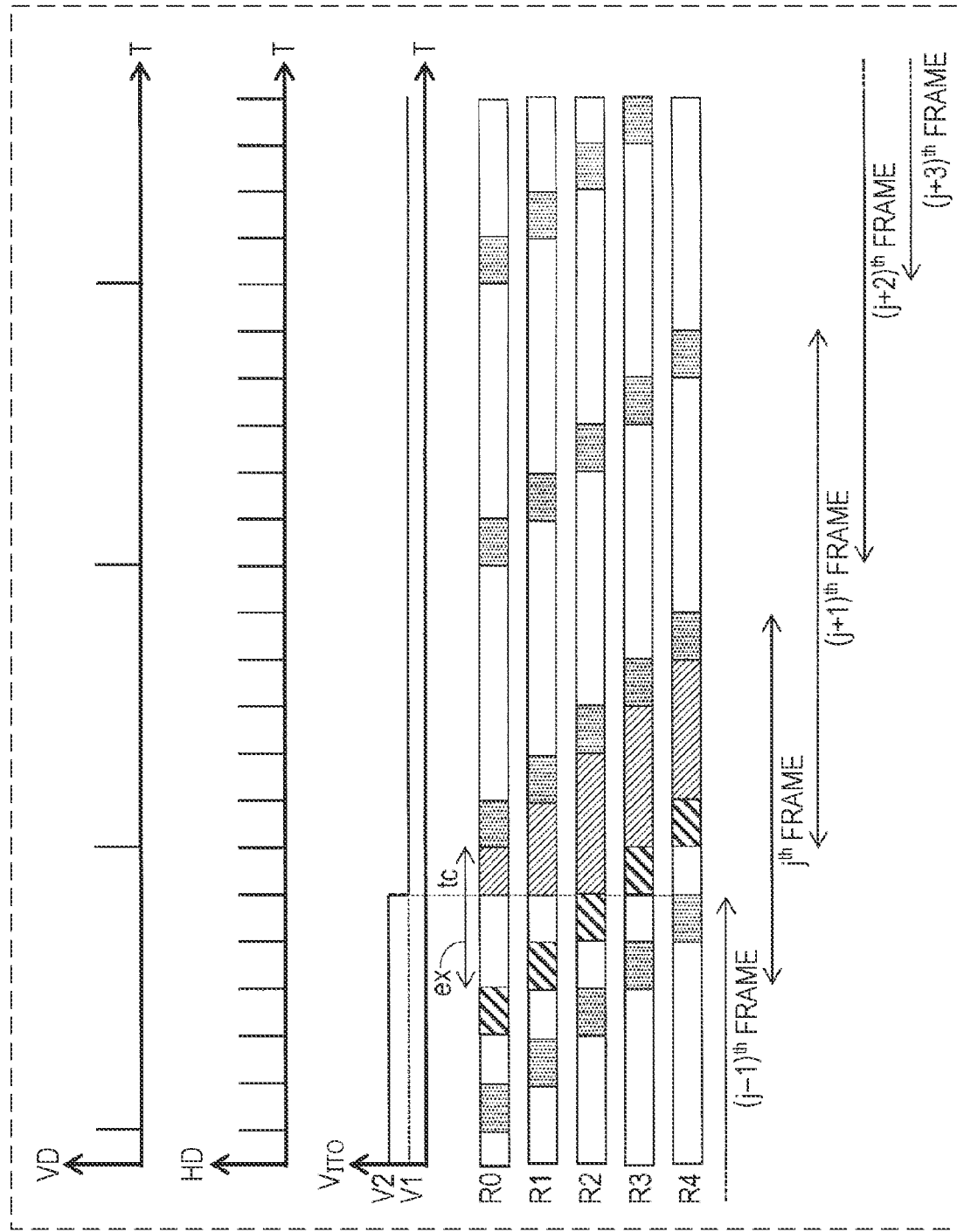
FIG. 33 is a drawing depicting another example of the timing of switching between the first voltage and the second voltage.

FIG. 33 depicts another example of the timing of switching between the first voltage V1 and the second voltage V2. Rectangles to which thick diagonal hatching has been applied in FIG. 33 represent periods for an electronic shutter so to speak, in which the reset transistor 26 is switched to on for charges from the node FD to be discharged. FIG. 33 is an example of a case where an electronic shutter is implemented in row units before the start of the accumulation of signal charges in the $j^{th}$ frame period. In this example, as schematically depicted by the bidirectional arrow ex in FIG. 33, a period from the end of the electronic shutter to the start of signal reading corresponds to an exposure period of the $j^{th}$ frame period.

As depicted in FIG. 33, also in a case where switching between the first voltage V1 and the second voltage V2 is executed in a scanning period for an electronic shutter, the ratio between the length T1 of a period in which signal charges are accumulated while the first voltage V1 is applied to the opposite electrodes 11 and the length T2 of a period in which signal charges are accumulated while the second voltage V2 is applied to the opposite electrodes 11 can be different among the rows of the plurality of pixels Px.

However, also in the case where this kind of operation is applied, the value of the photoelectric conversion efficiency η with respect to the potential difference ΔV is already known, and the control circuit 160 can acquire information relating to the timing at which switching is performed from the second voltage V2 to the first voltage V1 and the timing at which signals are read. Consequently, similar to the example described with reference to FIG. 32, it is possible to apply a correction with which (T1*S1+T2*S2) becomes uniform in each row, and it is possible to avoid the generation of vertical shading in an image.

Figure 34:
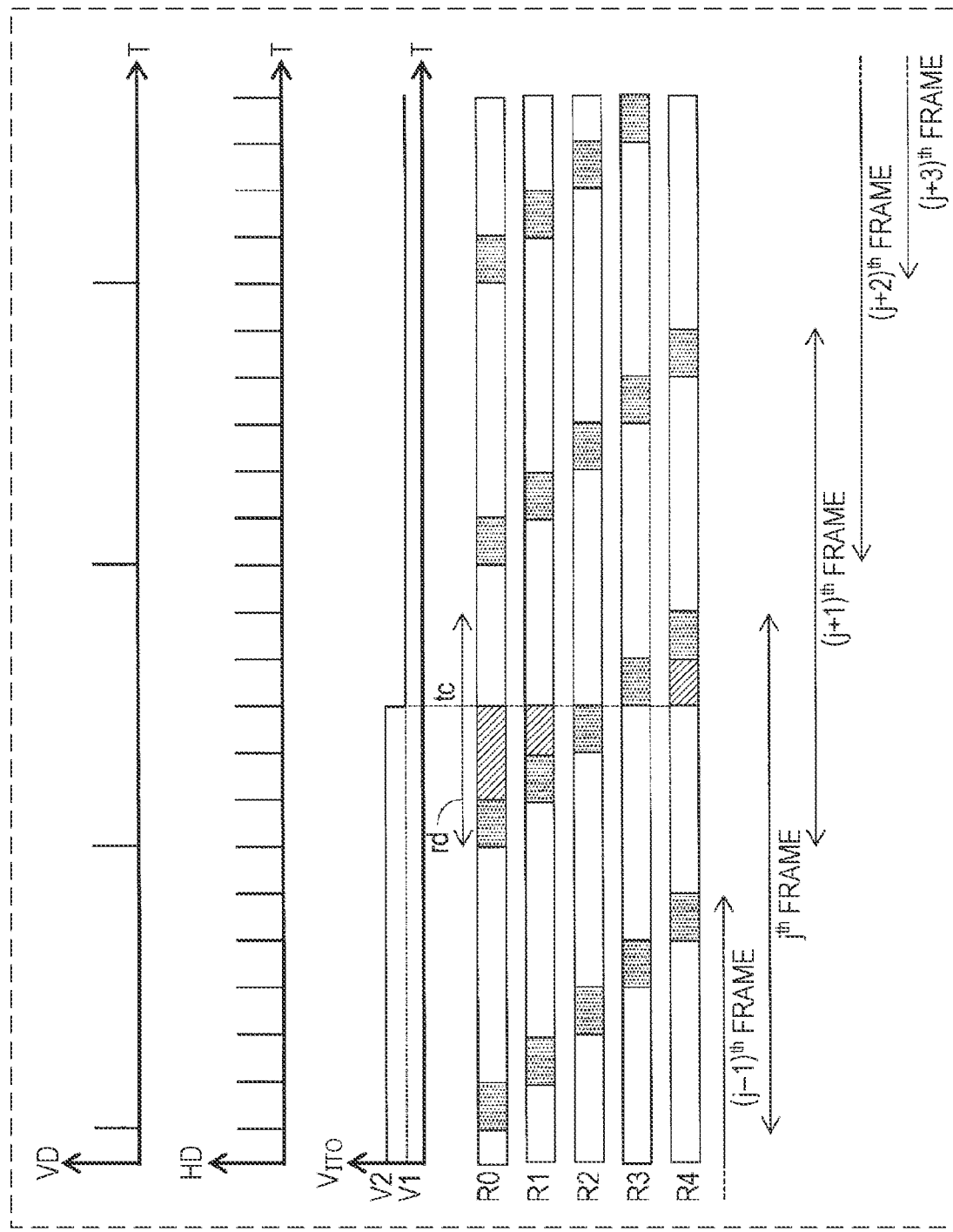
FIG. 34 is a drawing depicting yet another example of the timing of switching between the first voltage and the second voltage.

FIG. 34 depicts yet another example of the timing of switching between the first voltage V1 and the second voltage V2. FIG. 34 is an operation example in which switching between the first voltage V1 and the second voltage V2 is executed during a row scanning period for reading signals in the $j^{th}$ frame period. The row scanning period for reading signals in the jth frame period is schematically depicted by a bidirectional arrow rd in FIG. 34.

In FIG. 34, the hatched rectangle in R4 schematically depicts a period in which the first voltage V1 is applied to the opposite electrodes 11, within an exposure period included in the $j^{th}$ frame period. Furthermore, in FIG. 32, the hatched rectangles in R0 and R1 schematically depict periods in which the second voltage V2 is applied to the opposite electrodes 11, within an exposure period included in the $(j+1)^{th}$ frame period. As is apparent with reference to FIG. 34, in a case where switching between the first voltage V1 and the second voltage V2 has been executed in a signal reading period in a certain frame period, sensitivity modulation brought about by the voltage switching affects also the accumulation of signal charges in the next frame period. In this case also, it is possible to avoid the generation of vertical shading in an image by applying a correction with which (T1*S1+T2*S2) becomes uniform in each row to the $j^{th}$ frame period and the $(j+1)^{th}$ frame period.

Figure 35:
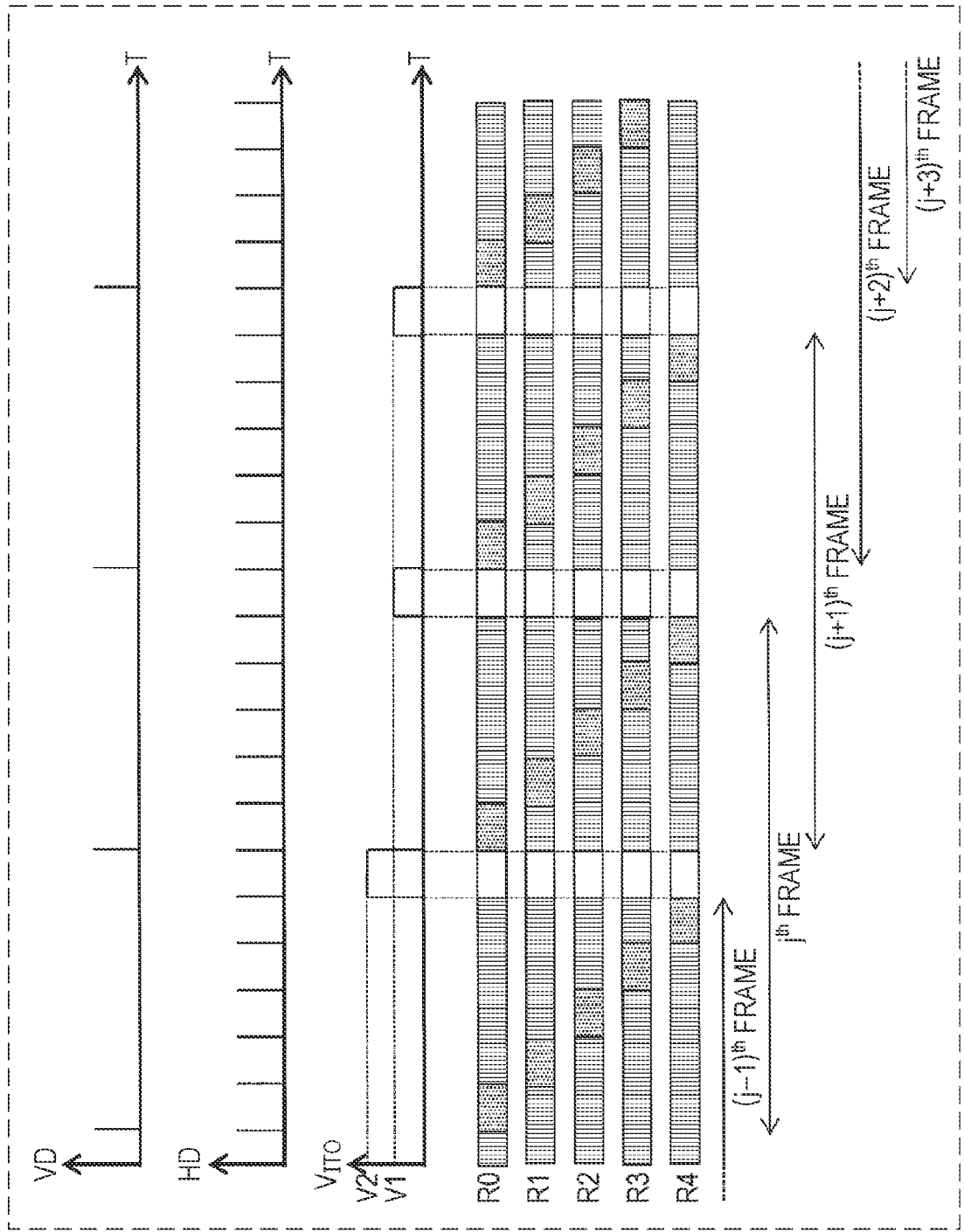
FIG. 35 is a drawing for describing the relationship between the timing of switching between the first voltage and the second voltage when a global shutter implemented by controlling a potential difference is applied, and a change in the level of the signal acquired by the detection circuit, which accompanies the switching of the voltage.

FIG. 35 is a drawing for describing the relationship between the timing of switching between the first voltage V1 and the second voltage V2 when a global shutter implemented by controlling the potential difference ΔV is applied, and a change in the level of signals acquired by the detection circuit 130A, which accompanies the switching of the voltage. In the example depicted in FIG. 35, the second voltage V2 is selectively applied to the opposite electrodes 11 in a period from after the end of the reading of signals relating to a $(j-1)^{th}$ frame period to the start of the reading of signals relating to the $j^{th}$ frame period. Furthermore, the first voltage V1 is selectively applied to the opposite electrodes 11 in a period from after the end of the reading of signals relating to the $j^{th}$ frame period to the start of the reading of signals relating to the $(j+1)^{th}$ frame period. In addition, the first voltage V1 is selectively applied to the opposite electrodes 11 in a period from after the end of the reading of signals relating to the $(j+1)^{th}$ frame period to the start of the reading of signals relating to a $(+2)^{th}$ frame period. In other periods, the potential of the opposite electrodes 11 is made to be a positive potential in the vicinity of 0 V, in such a way that the potential difference ΔV becomes substantially 0 V.

FIG. 35 is an operation example of when an electrical global shutter such as that described in the aforementioned Japanese Patent No. 6202512 is applied. In FIG. 35, periods depicted by white rectangles correspond to periods for the substantial accumulation of signal charges, in other words, exposure periods. In this example, in the $(j+1)^{th}$ frame period, although it can be said that switching from the second voltage V2 to the first voltage V1 is executed, an accumulation of signal charges substantially does not occur in periods in which the potential of the opposite electrodes 11 is made to be a potential in the vicinity of 0 V, and therefore there is no generation of vertical shading caused by switching the voltage applied to the opposite electrodes 11. Consequently, the aforementioned correction processing is not required. In this way, the correction processing is not required depending on the operation mode of the imaging device. Therefore, it is not necessary for the aforementioned correction processing to be applied in every case, and it is sufficient for the correction processing to be executed as required. Whether or not correction processing corresponding to switching between the first voltage V1 and the second voltage V2 is to be executed may be switched on the basis of the operation mode of the imaging device, a user command, or the like.

Figure 36:
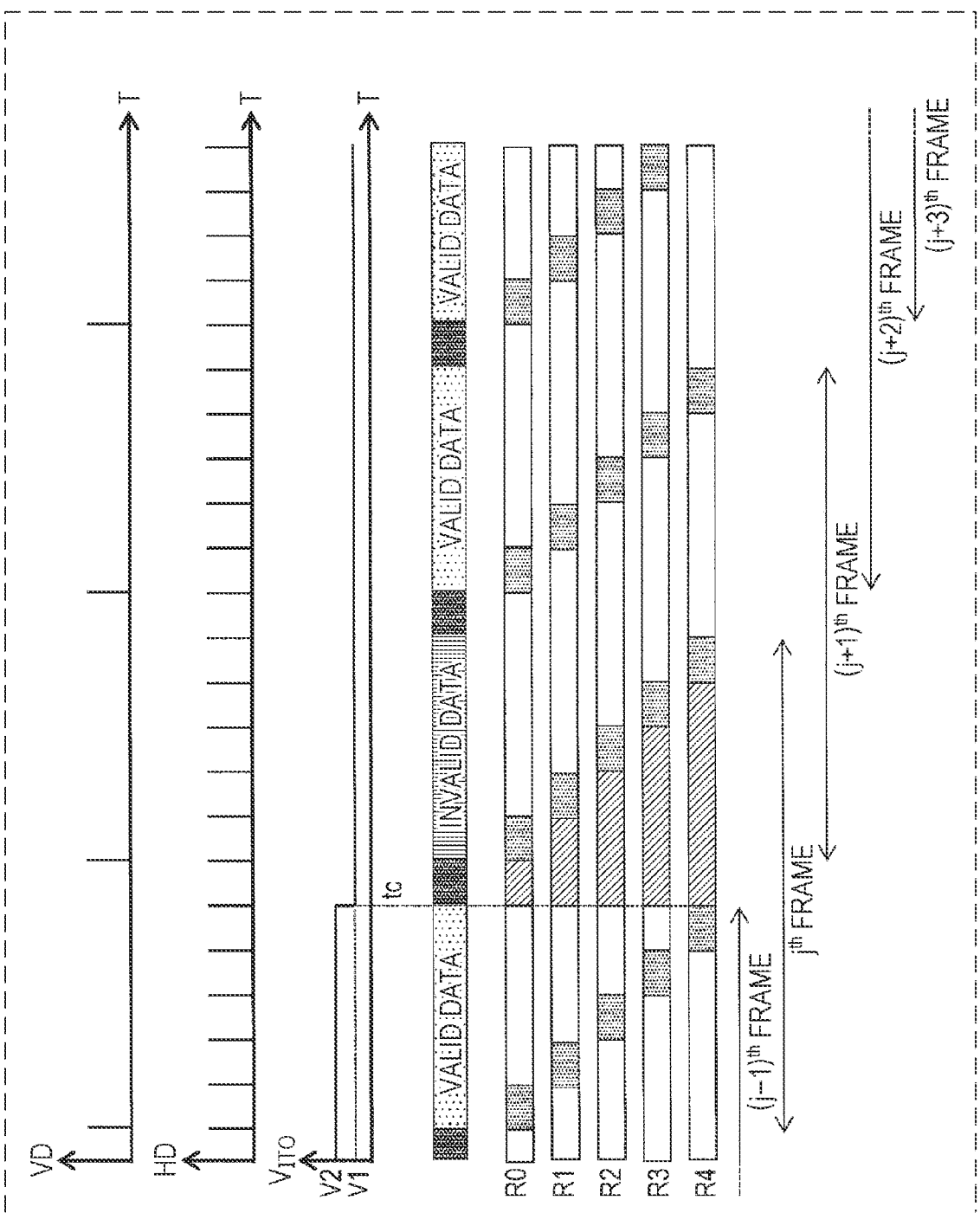
FIG. 36 is a drawing for describing an example of the relationship between the timing of switching between the first voltage and the second voltage, and an output from the imaging device.

Furthermore, in a case where photographing is to be executed at a frame rate that is sufficiently high, a correction with which (T1*S1+T2*S2) becomes uniform in each row can be omitted. FIG. 36 is a drawing for describing an example of the relationship between the timing of switching between the first voltage V1 and the second voltage V2, and an output from the imaging device 100A. In FIG. 36, the rectangles drawn below the chart depicting a change in the voltage $V_{ITO}$ schematically depict whether image data is valid or invalid on the basis of the signal level detected by the detection circuit 130A.

Similar to the example described with reference to FIG. 32, in the example depicted in FIG. 36, switching between the first voltage V1 and the second voltage V2 is executed in the exposure period of each row of the $j^{th}$ frame period. Therefore, in a case where correction processing is not carried out, vertical shading caused by voltage switching can occur in an image that is based on pixel signals acquired in the $j^{th}$ frame period.

However, in a case where the frame rate is sufficiently high, even if pixel signals acquired in frame periods in which there is a possibility of the generation of vertical shading due to voltage switching, namely the $j^{th}$ frame period in this example, are discarded as invalid data, as schematically depicted in FIG. 36, it can be said that the effect thereof is small. In this way, in a case where the frame rate is sufficiently high, pixel signals acquired in frame periods in which there is a possibility of the generation of vertical shading may be discarded as invalid data, and pixel signals acquired in other frame periods may be selectively acquired as valid data. In the present specification, processing in which pixel signals acquired in frame periods that has a possibility of vertical shading are discarded as invalid data, is referred to as mask processing. This kind of mask processing is effective in a case where it is difficult to ensure a region for mounting a circuit for executing corrections with which (T1*S1+T2*S2) becomes uniform in each row.

Figure 37:
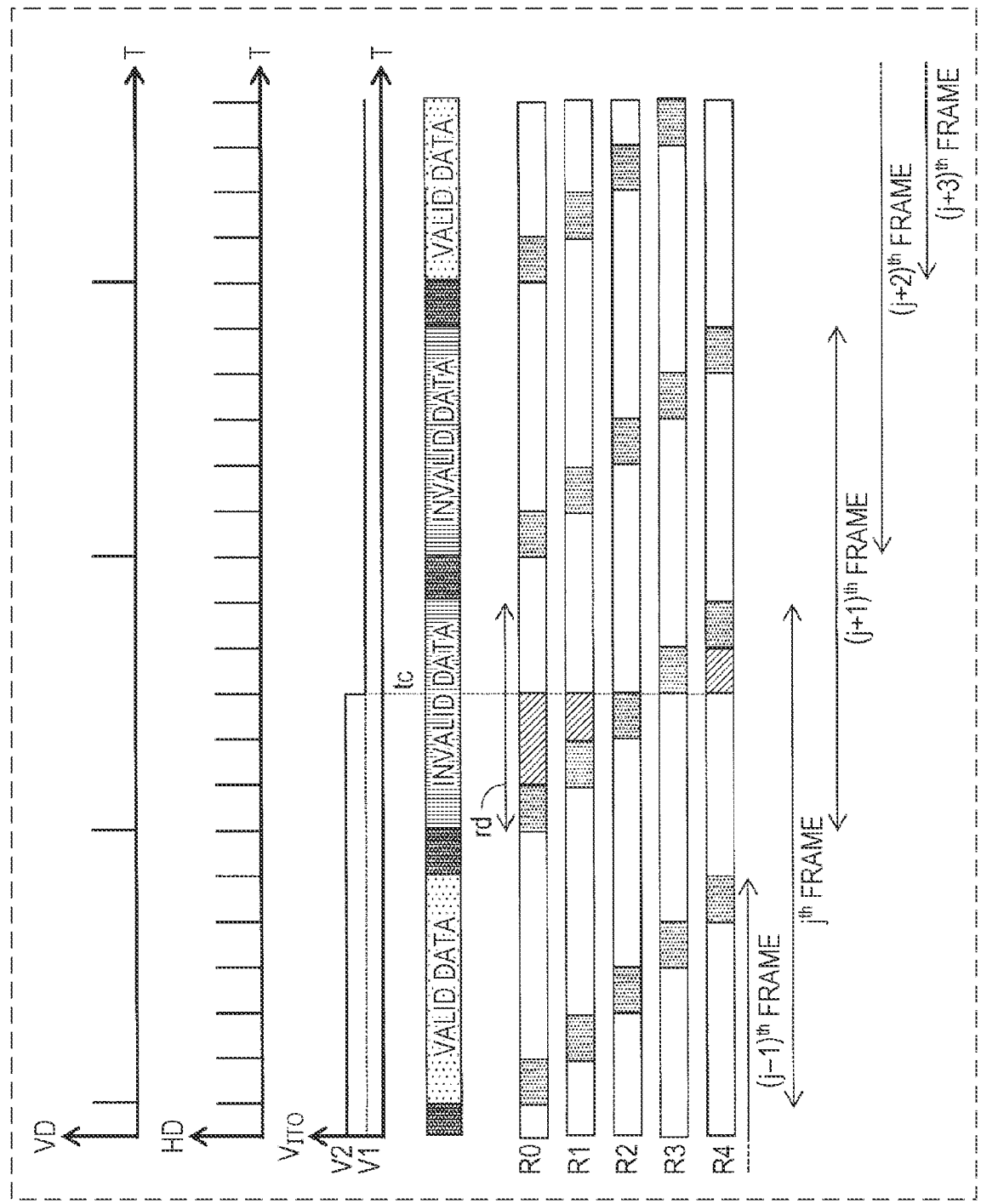
FIG. 37 is a drawing depicting an application example of mask processing in a case where switching between the first voltage and the second voltage has been executed during a row scanning period for reading signals.

FIG. 37 depicts an application example of mask processing in a case where switching between the first voltage V1 and the second voltage V2 has been executed during a row scanning period for reading signals. As described with reference to FIG. 34, in a case where switching between the first voltage V1 and the second voltage V2 has been executed in a signal reading period in a certain frame period, sensitivity modulation brought about by the voltage switching affects also the accumulation of signal charges in the next frame period. Consequently, in a case where switching between the first voltage V1 and the second voltage V2 has been executed during a row scanning period for reading a $j^{th}$ signal, pixel signals acquired in the $j^{th}$ frame period and pixel signals acquired in the $(j+1)^{th}$ frame period may be set as targets for the mask processing as invalid data, as schematically depicted in FIG. 37.

It is sufficient for the aforementioned mask processing to be executed as required, and it is beneficial for it to be possible to switch between whether or not the mask processing is to be executed. The mask processing can be executed by a logic circuit arranged in the control circuit 160, for example, or the image processing circuit 164. The selection of data may be executed by an analog-digital conversion circuit in the detection circuit 130A.

(Reflection of Detected Exposure Quantity on Potential Difference ΔV in Automatic Exposure Setting Process)

It is not necessary for the voltages that can be supplied to the opposite electrodes 11 or the pixel electrodes 12 by the aforementioned voltage supply circuits 150, 150D, and 154 to be restricted to the two values of the first voltage V1 and the second voltage V2. The voltage supply circuits 150, 150D, and 154 may be configured so as to be able to selectively apply any voltages of three or more values to the voltage line 152 in accordance with the environment in which photographing is carried out, for example. For example, as described hereinafter, the voltage supply circuit 150, 150D, or 154 may be configured so as to apply a voltage to the voltage line 152 with switching being performed between voltages of three or more values, in accordance with the exposure quantity, that is, the illuminance on the photoelectric converters 10.

Figure 38:
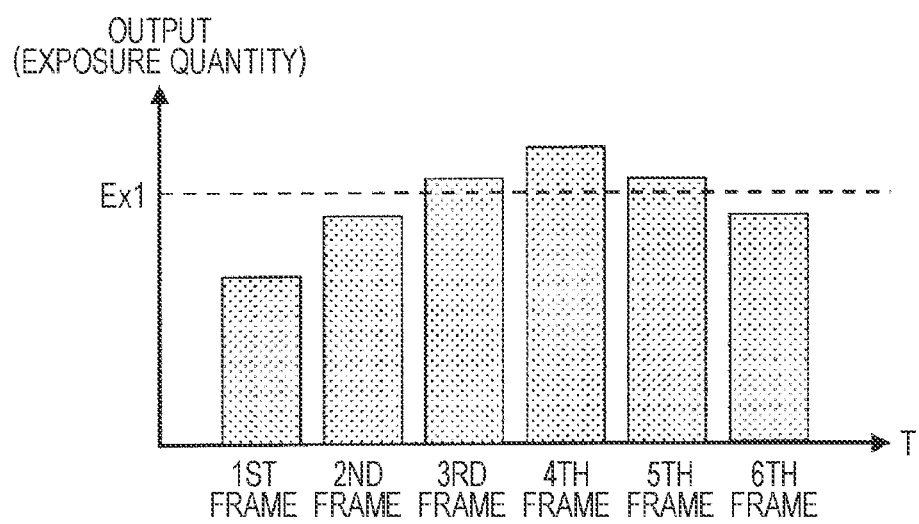
FIG. 38 is a drawing for describing an example of a processing sequence in an automatic exposure setting process, which can be applied in an imaging device and a camera system according to embodiments of the present disclosure.

FIG. 38 is a drawing for describing an example of a processing sequence in an automatic exposure setting process, which can be applied in an imaging device and a camera system according to the embodiments of the present disclosure. The graph depicted in FIG. 38 depicts examples of changes in the exposure quantity for each frame period.

Figure 39:
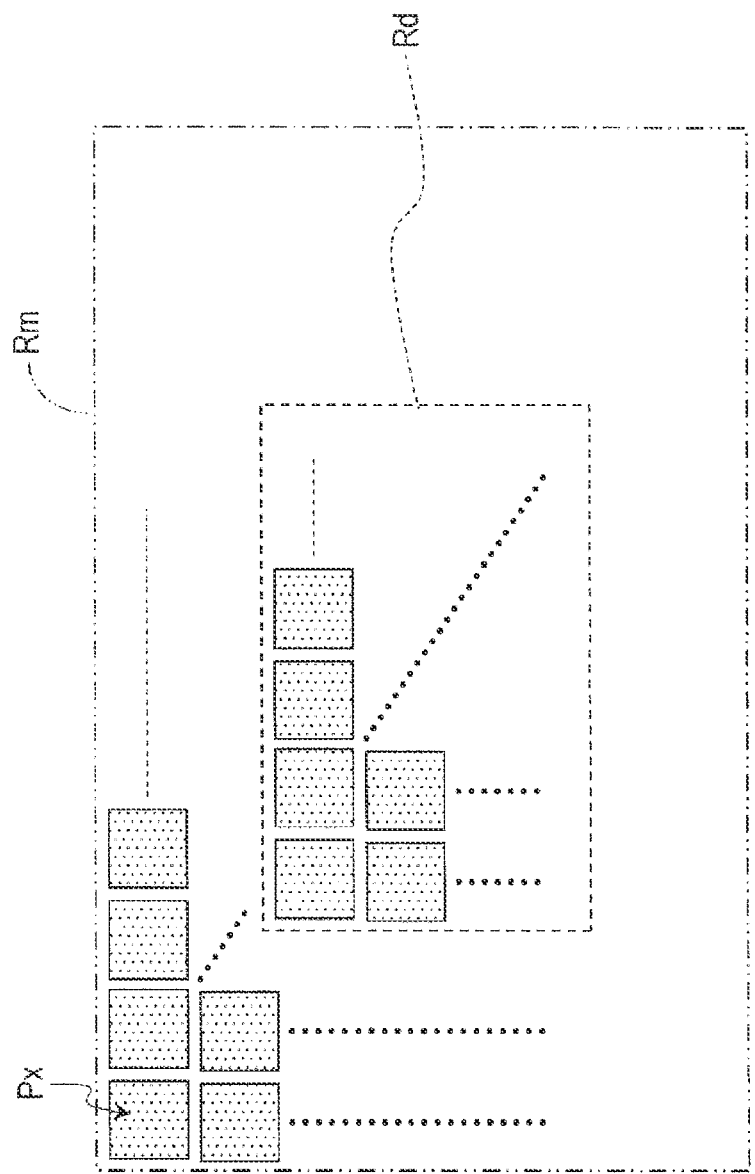
FIG. 39 is a schematic plan view for describing an example in which a region including the photoelectric converters of some or all of the pixels included in an imaging region is used as an exposure quantity detection region.

The exposure quantity indicated by the vertical axis of FIG. 38 can be calculated as described hereinafter, for example. As schematically depicted in FIG. 39, a region including the photoelectric converters 10 of the plurality of pixels Px is taken as an imaging region Rm, and an arbitrary region including the photoelectric converters 10 of one or more pixels Px from within the imaging region Rm is taken as a detection region Rd. At such time, the exposure quantity indicated by the vertical axis of FIG. 38 can be calculated by detecting, for each frame period, the level of the signals from the output circuits 20 of the pixels Px located in the detection region Rd. For example, an average value for the level of the signals from the output circuits 20 of the pixels Px located in the detection region Rd can be made to correspond to the exposure quantity. Instead of detecting signal levels by means of the detection circuit 130A or 130B, the exposure quantity for each frame period may be estimated by means of the light quantity detector 130F or 130G.

Figure 40:
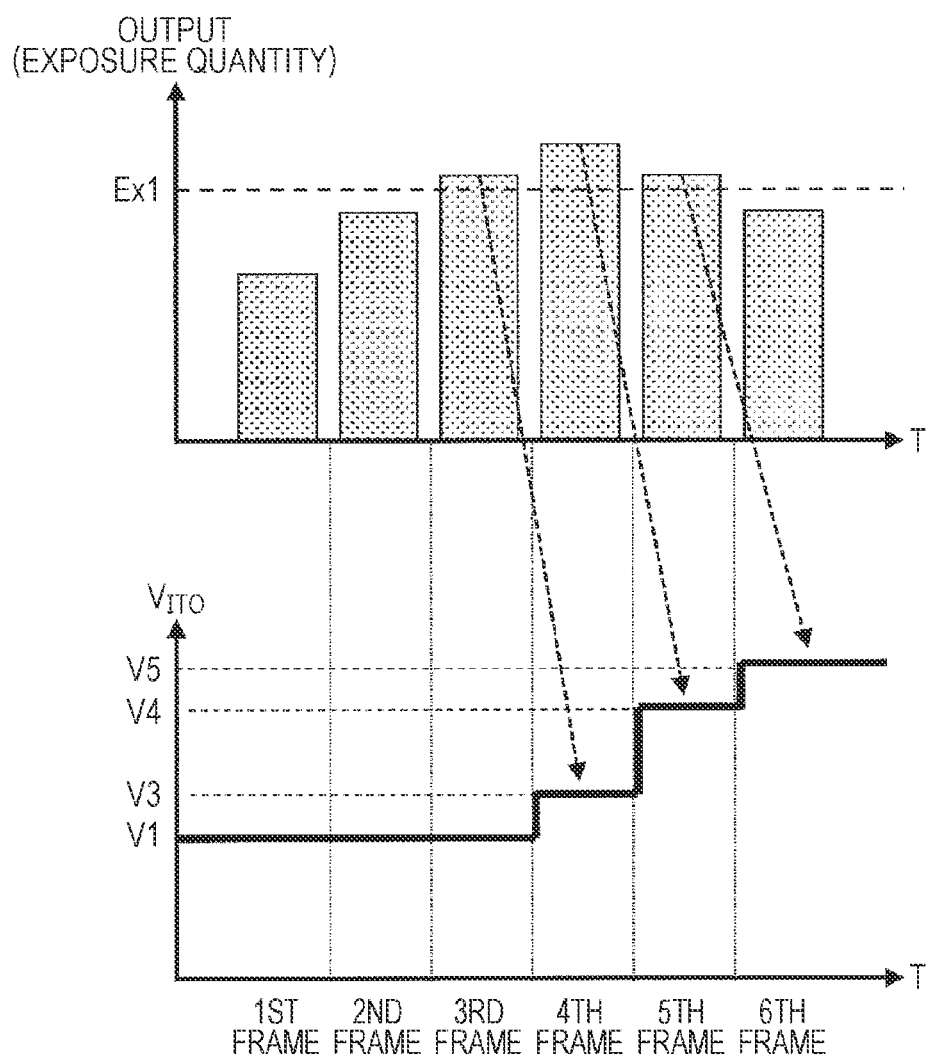
FIG. 40 is a diagram depicting an example of processing in which a voltage that is output from the voltage supply circuit is altered according to the exposure quantity detected.

FIG. 40 depicts an example of processing in which a voltage that is output from the voltage supply circuit is altered according to the exposure quantity detected. FIG. 40 depicts a graph indicating changes in exposure quantity for each frame period, and a graph indicating changes in the voltage $V_{ITO}$ applied to the opposite electrodes 11 from the voltage line 152, together as one drawing. The graph in the upper section of FIG. 40 is the same as the graph depicted in FIG. 38. In the example depicted in FIG. 40, in a case where an exposure quantity exceeding a predetermined threshold value Ex1 is detected in a certain frame period, the voltage that is output from the voltage supply circuit 150 is switched to a higher voltage.

In the example depicted in FIG. 40, if attention is directed to the third frame period, for example, the acquired exposure quantity exceeds the value Ex1. Therefore, the voltage supply circuit 150 switches the voltage supplied to the voltage line 152 to a third voltage V3 that is higher than the first voltage V1. Consequently, in the next fourth frame period, signal charges are accumulated in a state in which the relatively high third voltage V3 is applied to the opposite electrodes 11. In a case where the photoelectric converters 10 have photoelectric conversion characteristics such as those depicted in FIG. 4, for example, the sensitivity of the pixels Px increases together with an increase in the voltage applied to the photoelectric converters 10.

It should be noted that, in this example, the exposure quantity acquired in the fourth frame period still exceeds the threshold value Ex1. Consequently, the voltage supply circuit 150 further increases the voltage supplied to the voltage line 152, and applies a fourth voltage V4 to the photoelectric converters 10. In a case where the exposure quantity acquired in the fifth frame period still exceeds the threshold value Ex1, the voltage supply circuit 150 applies an even higher fifth voltage V5 to the voltage line 152, as depicted in FIG. 40. In this example, the exposure quantity acquired in the sixth frame period is less than or equal to the threshold value Ex1, and therefore, in the seventh frame period, the voltage applied to the opposite electrodes 11 remains as the fifth voltage V5. The aforementioned second voltage V2 can be any of the third voltage V3 to the fifth voltage V5 that are higher than the first voltage V1.

In this way, the voltage that is output from the voltage supply circuit 150 may be switched in a multistage or continuous manner in such a way that the exposure quantity acquired in the immediately preceding frame period is reflected in the photoelectric conversion efficiency in the next frame period. In addition, in a case where an exposure quantity that is less than a predetermined threshold value Ex2 is detected in a certain frame period, processing may be executed in which the voltage that is output from the voltage supply circuit 150 is switched to a lower voltage.

Figure 41:
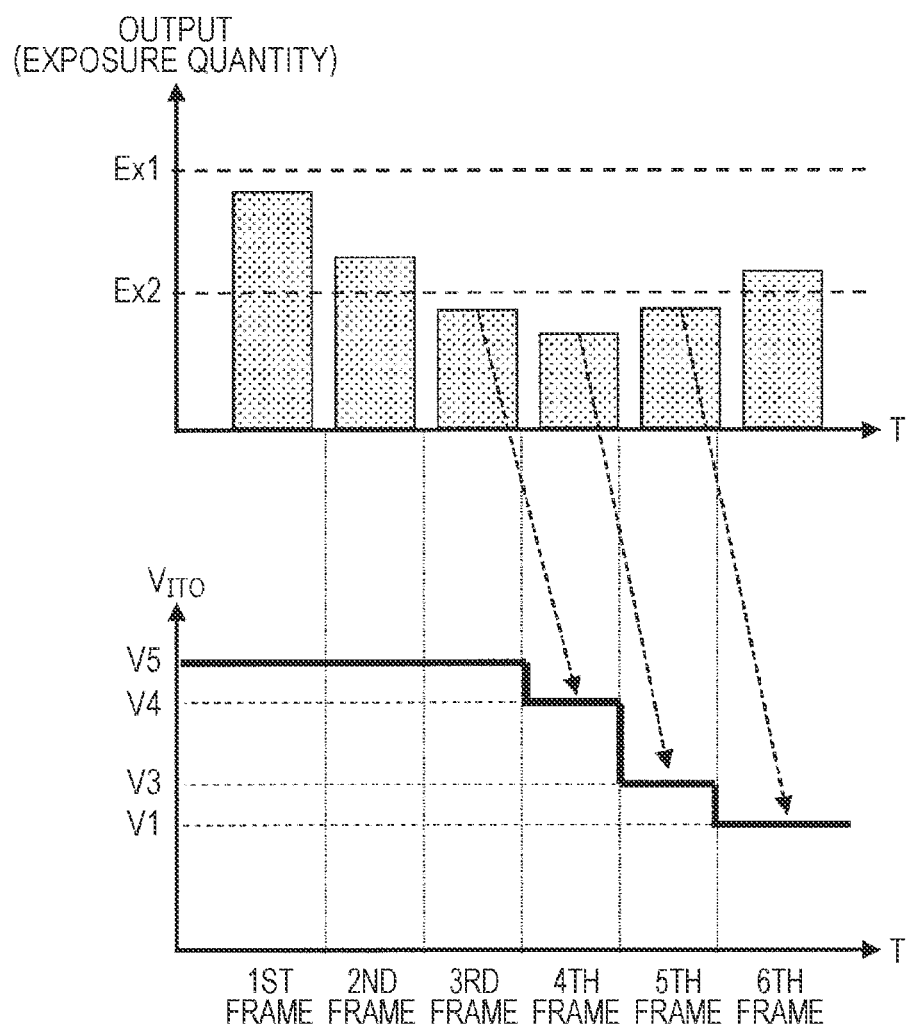
FIG. 41 is a diagram depicting another example of processing in which the voltage that is output from the voltage supply circuit is altered according to the exposure quantity detected.

FIG. 41 depicts another example of processing in which the voltage that is output from the voltage supply circuit is altered according to the exposure quantity detected. Similar to FIG. 40, FIG. 41 also depicts a graph indicating changes in exposure quantity for each frame period, and a graph indicating changes in the voltage $V_{ITO}$ applied to the opposite electrodes 11 from the voltage line 152, together as one drawing.

In the example depicted in FIG. 41, in a case where an exposure quantity that is less than the predetermined threshold value Ex2 is detected in a certain frame period, the voltage that is output from the voltage supply circuit 150 is switched to a lower voltage. In the example depicted in FIG. 41, the exposure quantity acquired in the third frame period, for example, is less than the value Ex2. Therefore, the voltage supply circuit 150 causes the voltage supplied to the voltage line 152 to decrease from the fifth voltage V5 to the fourth voltage V4. The exposure quantity acquired in the fourth frame period is also less than the threshold value Ex2, and therefore the voltage supply circuit 150 changes the voltage supplied to the voltage line 152 to the lower third voltage V3. In a case where the exposure quantity acquired in the fifth frame period is also less than the threshold value Ex2, the voltage supply circuit 150 applies the even lower first voltage V1 to the voltage line 152. In this example, the exposure quantity acquired in the sixth frame period is between the threshold value Ex2 and the threshold value Ex1, and therefore, in the seventh frame period, the first voltage V1 is applied to the opposite electrodes 11.

In this way, the separate threshold value Ex2 may be provided serving as a determination basis for switching the voltage that is output from the voltage supply circuit 150 to a lower voltage. The threshold value Ex2 may be less than or equal to the threshold value Ex1. In the examples depicted in FIGS. 38 to 41, the voltage applied to the opposite electrodes 11 or the pixel electrodes 12 in the next frame period is determined according to a comparison result between an exposure quantity acquired in the immediately preceding frame period and a threshold value; however, it should be noted that the voltage applied to the opposite electrodes 11 or the pixel electrodes 12 may be determined based on two or more comparison results.

Figure 42:
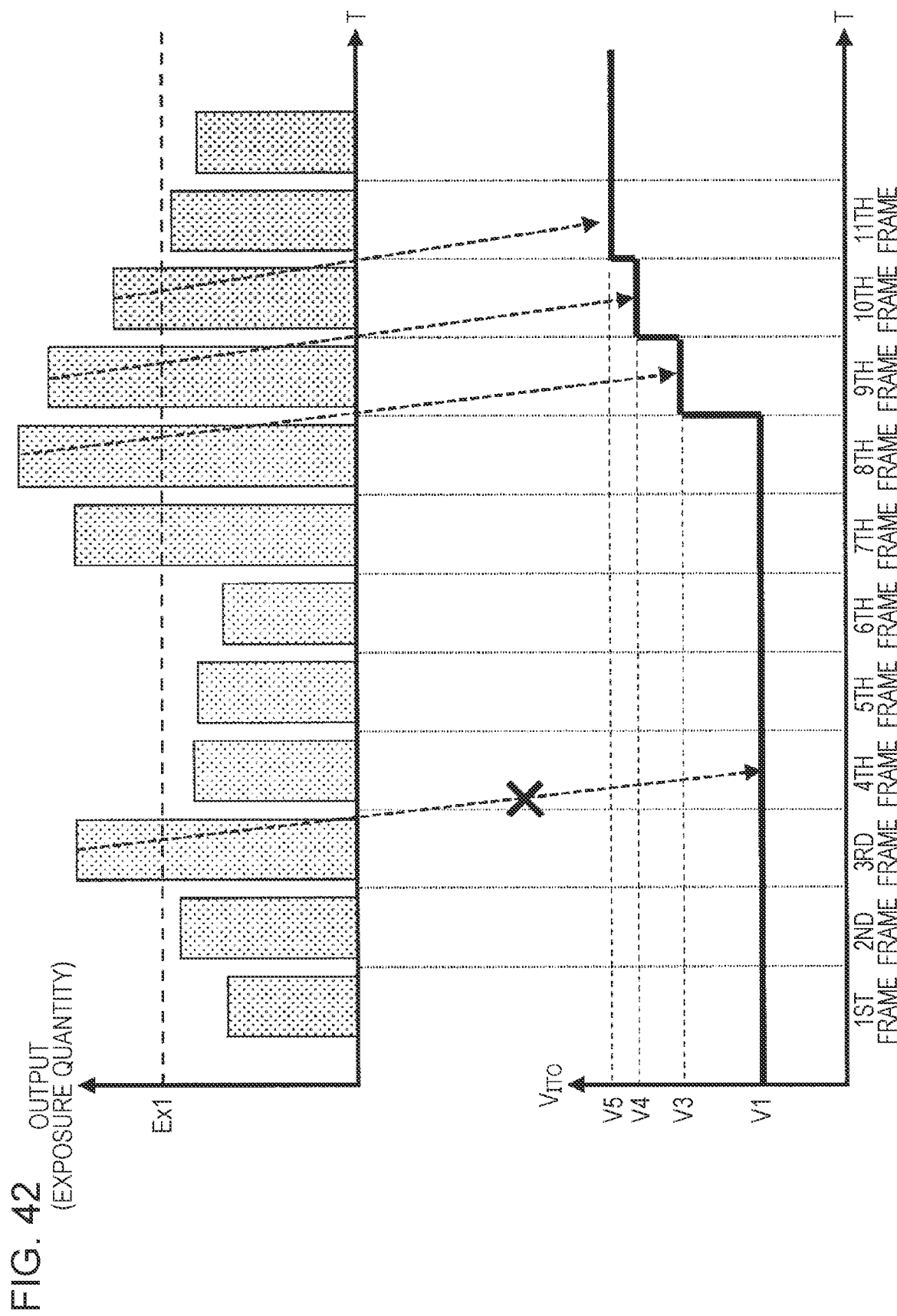
FIG. 42 is a diagram depicting yet another example of processing in which the voltage that is output from the voltage supply circuit is altered according to the exposure quantity detected.

FIG. 42 depicts yet another example of processing in which the voltage that is output from the voltage supply circuit is altered according to the exposure quantity detected. In FIG. 42, in a case where the exposure quantity acquired in the immediately preceding frame period exceeds the threshold value Ex1 twice continuously, the voltage that is output from the voltage supply circuit 150 is switched to a higher voltage.

If attention is directed to the third frame period, for example, the acquired exposure quantity exceeds the threshold value Ex1. At this point in time, the voltage that is output from the voltage supply circuit 150 is not switched. In this example, the exposure quantity acquired in the fourth frame period does not exceed the threshold value Ex1. Therefore, the voltage that is output from the voltage supply circuit 150 is kept at the first voltage V1.

The exposure quantity next exceeds the threshold value Ex1 in the seventh frame period. At this point in time also, the voltage that is output from the voltage supply circuit 150 is not switched. In this example, the exposure quantities acquired in the consecutive eighth to tenth frame periods all exceed the threshold value Ex1. Consequently, the voltage that is output from the voltage supply circuit 150 is sequentially increased after acquisition of the exposure quantity in the eighth frame period, after acquisition of the exposure quantity in the ninth frame period, and after acquisition of the exposure quantity in the tenth frame period.

In this way, in a case where the exposure quantity acquired in the immediately preceding frame period exceeds the threshold value or is less than the threshold value continuously a plurality of times, the voltage that is output from the voltage supply circuit 150 may be switched to a higher voltage or a lower voltage. According to this kind of processing, for example, when a camera stroboscope is lit, when photographing is carried out with a light source that periodically repeats flickering, or the like, it is possible to reduce the possibility of an overflow of signal charges occurring, while suppressing power consumption.

(Correction of Linearity Corresponding to Voltage Applied to Photoelectric Converters 10)

Figure 43:
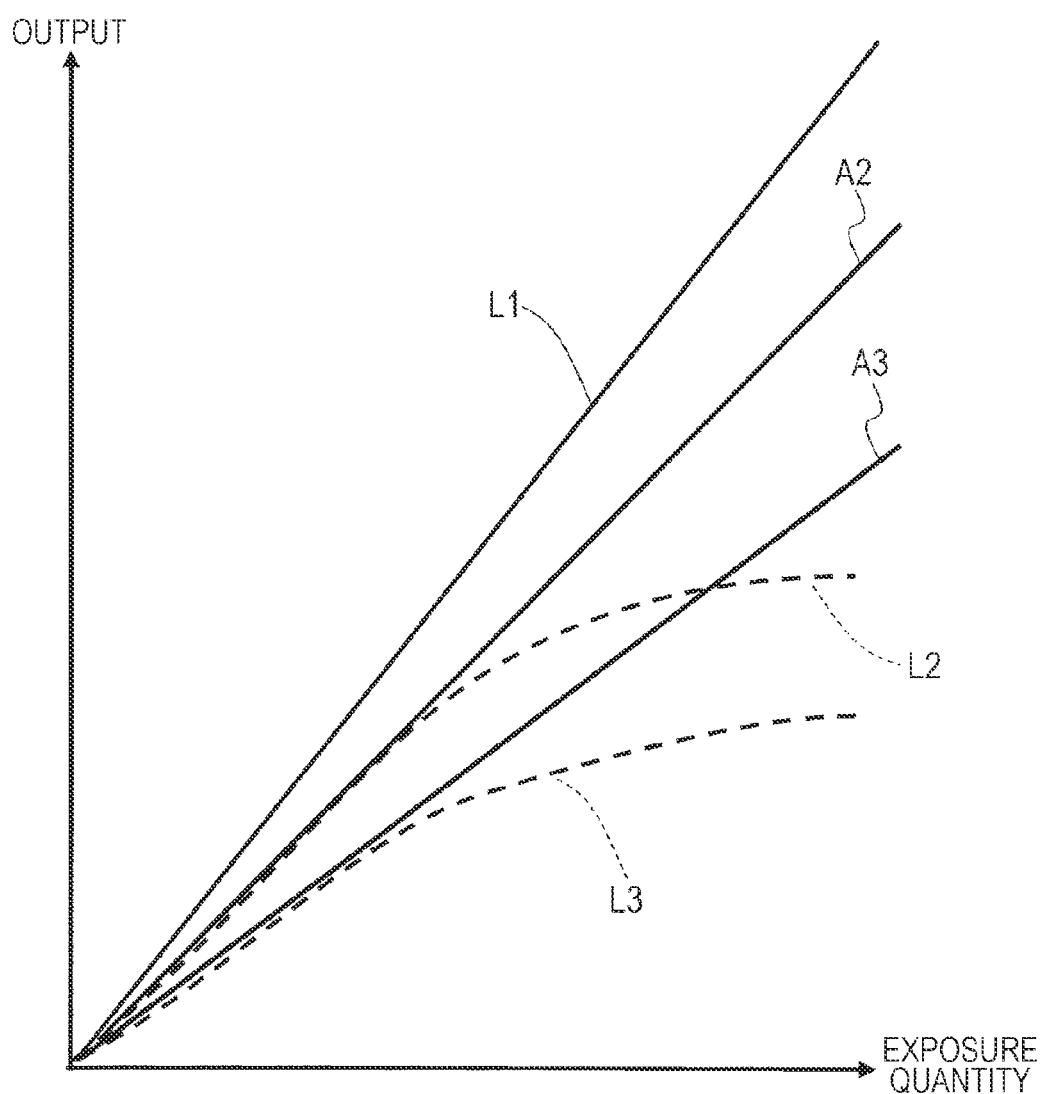
FIG. 43 is a drawing schematically depicting an example of a change in the output of the detection circuit, with respect to an increase in the exposure quantity.

FIG. 43 schematically depicts an example of a change in the output of the detection circuit 130A with respect to an increase in the exposure quantity. In FIG. 43, a solid line L1 indicates an exemplary change in the output of the detection circuit 130A with respect to an increase in the exposure period, in other words, an increase in the exposure quantity, at a fixed illuminance, which is obtained in a case where a voltage in the second voltage range is applied to the opposite electrodes 11. A dashed line L2 indicates a change in the output obtained in a case where a lower voltage within the second voltage range is applied to the opposite electrodes 11. It should be noted that, in FIG. 43, a dashed line L3 indicates an exemplary change in the output of the detection circuit 130A with respect to an increase in the exposure quantity, which is obtained in a case where a voltage in the first voltage range is applied to the opposite electrodes 11.

As described with reference to FIG. 12, a change in the photoelectric conversion efficiency η in the photoelectric conversion layer 13 with respect to a change in the potential difference ΔV applied between the opposite electrode 11 and the pixel electrode 12 is sometimes not linear. Therefore, according to the magnitude of the voltage applied to the opposite electrodes 11 or the pixel electrodes 12, the output of the detection circuit 130A may not increase proportionally with respect to an increase in the exposure period. A tendency such as this is likely to appear particularly if the potential difference ΔV is small. In the example depicted in FIG. 43, the solid line L1 corresponds to a case where the voltage applied to the opposite electrodes 11 or the pixel electrodes 12 is comparatively large, and the solid line L1 is linear. The dashed lines L2 and L3 correspond to a case where the voltage applied to the opposite electrodes 11 or the pixel electrodes 12 is relatively small, and the deviation of the dashed lines L2 and L3 from a straight line increases as the exposure quantity increases.

Figures 44, 45:
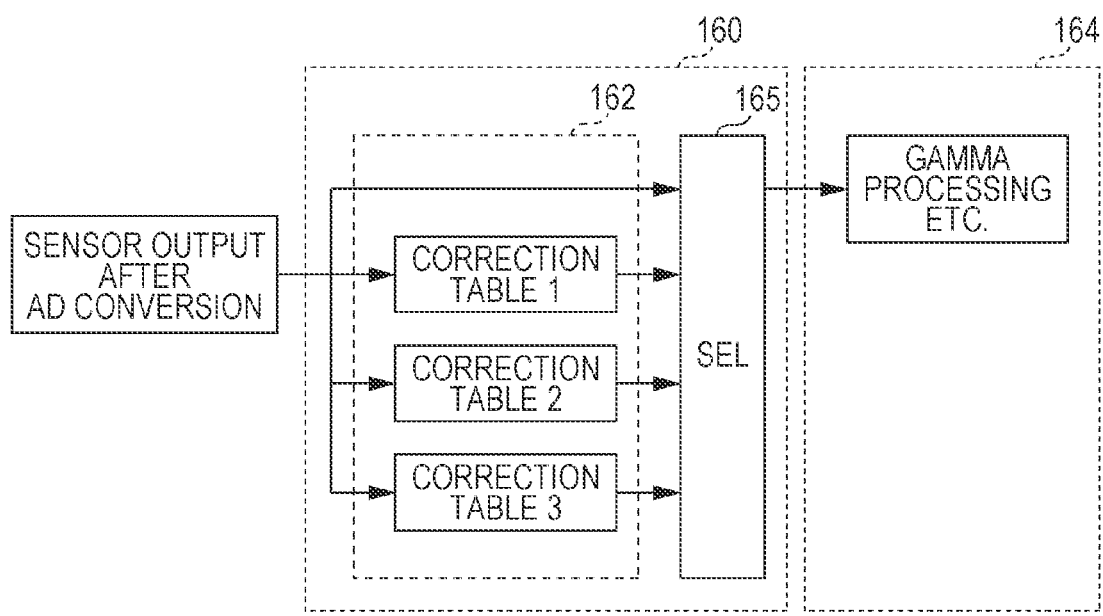
FIG. 44 is a block diagram schematically depicting an overview of linearity compensation processing.
FIG. 45 is a drawing depicting an example of a correction table.

Thus, a deviation from a straight line of the output of the detection circuit 130A with respect to an increase in the exposure period may be corrected by correcting the output from the detection circuit 130A, for example. FIG. 44 schematically depicts an overview of linearity compensation processing. For example, a table for converting the output from the detection circuit 130A into an appropriate digital value may be prepared for each voltage value that could be output from the voltage supply circuit 150.

In this example, three correction tables 1 to 3 corresponding to voltages that could be output from the voltage supply circuit 150 are retained in the memory 162. For example, the control circuit 160 receives an output after analog-digital conversion or the like from the detection circuit 130A, and applies a correction table in accordance with the specific value of the voltage applied to the photoelectric converters 10 from the voltage supply circuit 150. A selector 165 in FIG. 44 is a circuit that selects which of the correction tables 1 to 3 is to be applied, or whether a correction table is not to be applied, in accordance with the value of the voltage supplied to the photoelectric converters 10 from the voltage supply circuit 150. The output after correction is passed to the image processing circuit 164, and gamma processing is carried out, for example.

FIG. 45 depicts an example of a correction table. In the correction table depicted in FIG. 45, digital values after linearity compensation are given for each digital value that is an output from the detection circuit 130A. For example, when N is input as sensor output from the detection circuit 130A, the control circuit 160 outputs X to the image processing circuit 164. It should be noted that, in a case where a voltage that does not require linearity compensation is selected as a voltage to be applied to the photoelectric converters 10 from the voltage supply circuit 150, as with line L1 in FIG. 43, the sensor output from the detection circuit 130A is passed to the image processing circuit 164 without being altered.

By applying this kind of linearity compensation processing, as depicted in FIG. 43, the characteristics indicated by line L2 can be corrected as indicated by the solid straight line A2 in FIG. 43, and the characteristics indicated by the graph L3 can be corrected as indicated by the solid straight line A3. The linearity compensation processing may be executed by the image processing circuit 164. Instead of preparing a table for pre-gamma correction output, gamma correction may be executed using a y value that takes deviation from a straight line into consideration. Alternatively, instead of converting a digital value using a table, linearity may be compensated by multiplying sensor output from the detection circuit 130A by an appropriate coefficient.

Figure 46:
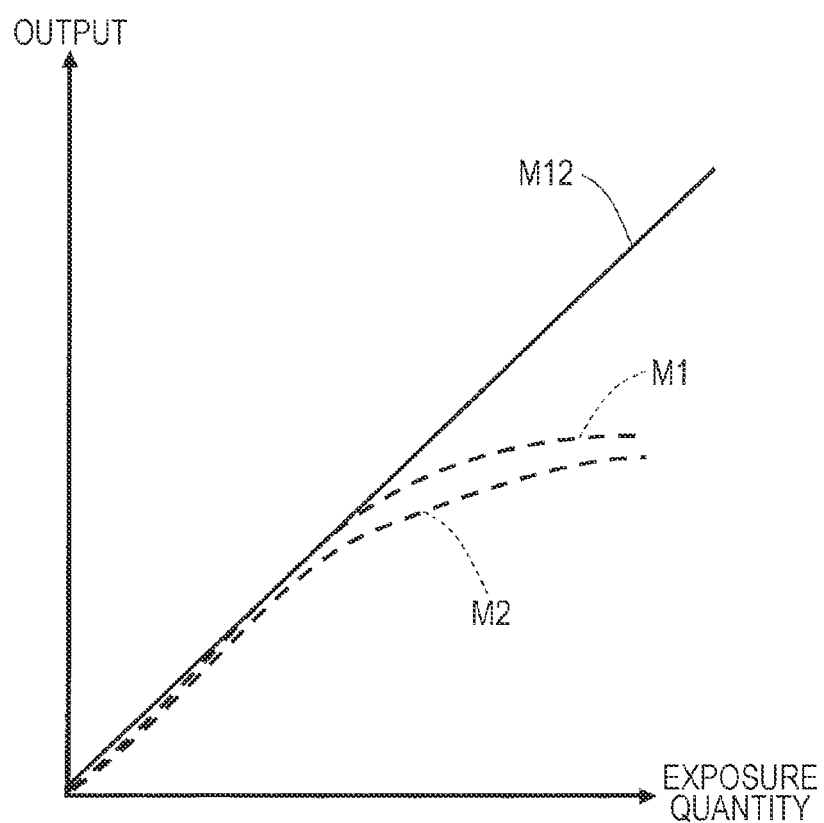
FIG. 46 is a drawing for describing differences in deviation in linearity according to the imaging device or according to the camera system.

It should be noted that deviation in linearity such as the aforementioned can be different according to the imaging device or according to the camera system. FIG. 46 is a drawing for describing differences in deviation in linearity according to the imaging device or according to the camera system. In FIG. 46, a dashed line M1 indicates an exemplary change in the output of the detection circuit 130A with respect to an increase in the exposure quantity in relation to a certain imaging device, and a dashed line M2 indicates an exemplary change in the output of the detection circuit 130A with respect to an increase in the exposure quantity in relation to another imaging device. It is beneficial if the output of the detection circuit 130A with respect to an increase in the exposure quantity matches between these imaging devices as indicated by a straight line M12 in FIG. 46, for example.

Figures 47, 48:
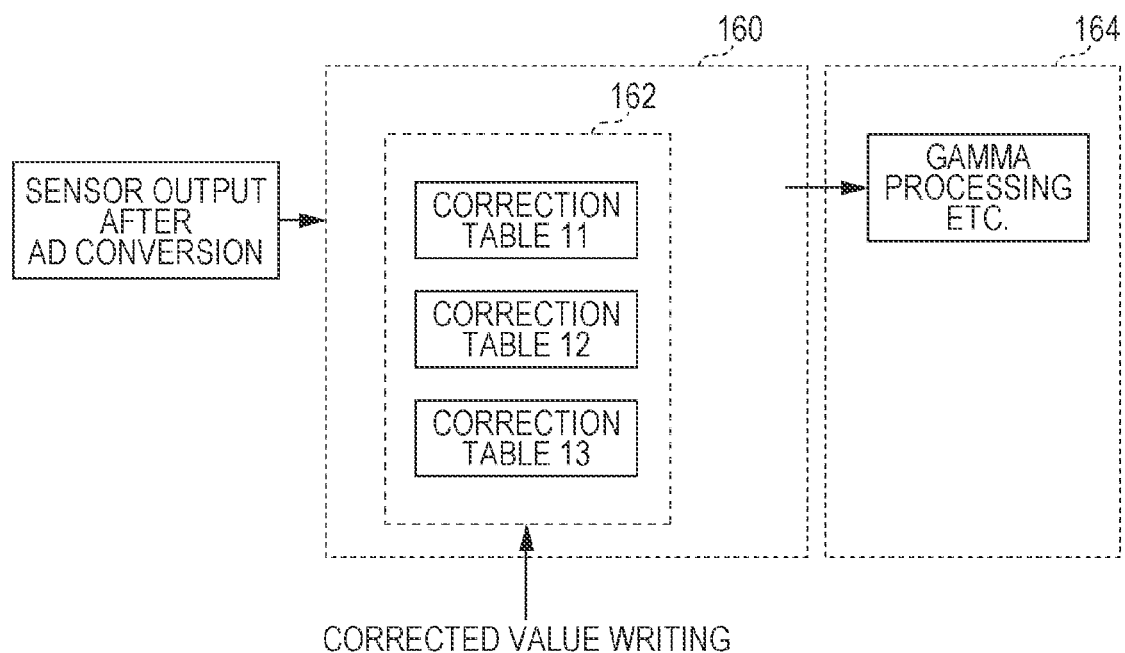
FIG. 47 is a block diagram schematically depicting an overview of linearity compensation processing in which differences according to the imaging device or according to the camera system are canceled.
FIG. 48 is a drawing depicting an example of a correction table stored in a memory of an imaging device of sample 1.

FIG. 47 schematically depicts an overview of linearity compensation processing in which differences according to the imaging device or according to the camera system are canceled. For example, in a case where there is an imaging device of sample 1 and an imaging device of sample 2, data relating to photoelectric conversion characteristics such as those depicted in FIG. 4 is acquired in advance for samples 1 and 2 using testers or the like. In addition, corrected values for each sample are calculated based on the acquired data, and the corrected values are stored in the memory 162 in the form of a table, for example. FIG. 47 depicts an overview of linearity compensation processing in sample 1, for example. Correction tables 11 to 13 for converting the output from the detection circuit 130A into an appropriate digital value are written for each voltage value that could be output from the voltage supply circuit 150, in the memory 162 of the imaging device of sample 1. It should be noted that the memory 162 is typically a nonvolatile memory.

FIG. 48 depicts an example of a correction table stored in the memory 162 of the imaging device of sample 1, and FIG. 49 depicts an example of a correction table stored in the memory 162 of the imaging device of sample 2. In a case where this kind of correction table is applied, with respect to sensor output N from the detection circuit 130A for example, a digital value X is output from the control circuit 160 of the imaging device of sample 1, whereas a digital value Y is output from the control circuit 160 of the imaging device of sample 2. By applying this kind of linearity compensation processing that is adapted according to the imaging device or according to the camera system, as depicted in the example of FIG. 46, it is possible to cancel the effect of differences in photoelectric conversion characteristics caused by individual differences according to the imaging device or according to the camera system.

As mentioned above, corrected values that are calculated based on data relating to photoelectric conversion characteristics can be prepared for each voltage value that could be output from the voltage supply circuit 150. However, there may also be cases where exposure is carried out with the presumed exposure time being exceeded, or where a voltage that had not been presumed is included in the voltages that are output from the voltage supply circuit 150, for example.

Figure 51:
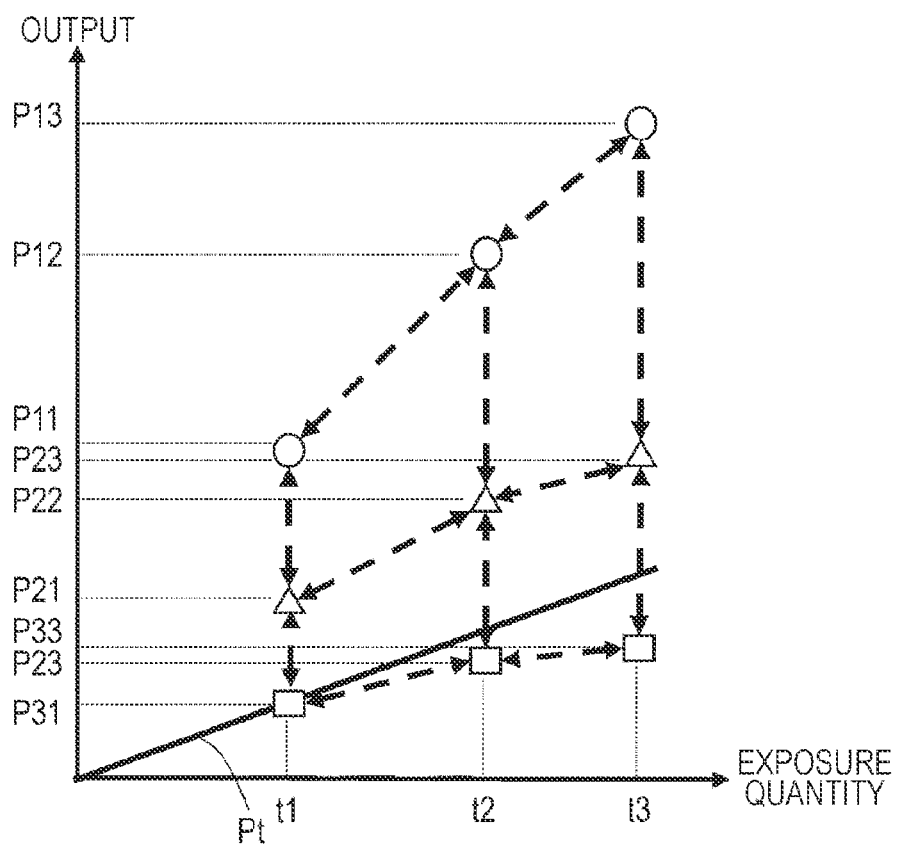
FIG. 51 is a drawing depicting the plotting of output values given in the correction table of FIG. 50.

FIG. 50 depicts another example of a correction table stored in the memory 162, and FIG. 51 depicts the plotting of output values given in the correction table of FIG. 50. In FIG. 51, the white circles indicate plots relating to corrected values that are applied when a voltage Va is applied to the photoelectric converters 10 from the voltage supply circuit 150, and the white triangles indicate plots relating to corrected values that are applied when a voltage Vb is applied to the photoelectric converters 10 from the voltage supply circuit 150. Furthermore, the white rectangles indicate plots relating to corrected values that are applied when a voltage Vc is applied to the photoelectric converters 10 from the voltage supply circuit 150.

In a case where, for example, the value of P13 has not been obtained in advance in the correction table of FIG. 50, the value of P13 can be computed by means of linear interpolation from corrected value P11 and corrected value P12, for example. Furthermore, in a case where, for example, a voltage that had not been presumed is applied to the voltage line 152 from the voltage supply circuit 150, it is possible to compute a straight line indicating the characteristics of the output of the detection circuit 130A with respect to an increase in the exposure quantity, from a discrete value given in the correction table. As exemplified in FIG. 51, if a parameter representing a straight line Pt is calculated, for example, it is possible for a corrected value for when an exposure quantity between t2 and t3a and a voltage between Vb and Vc are applied to the photoelectric converters 10 to be calculated afterward and applied in linearity compensation.

Figure 52:
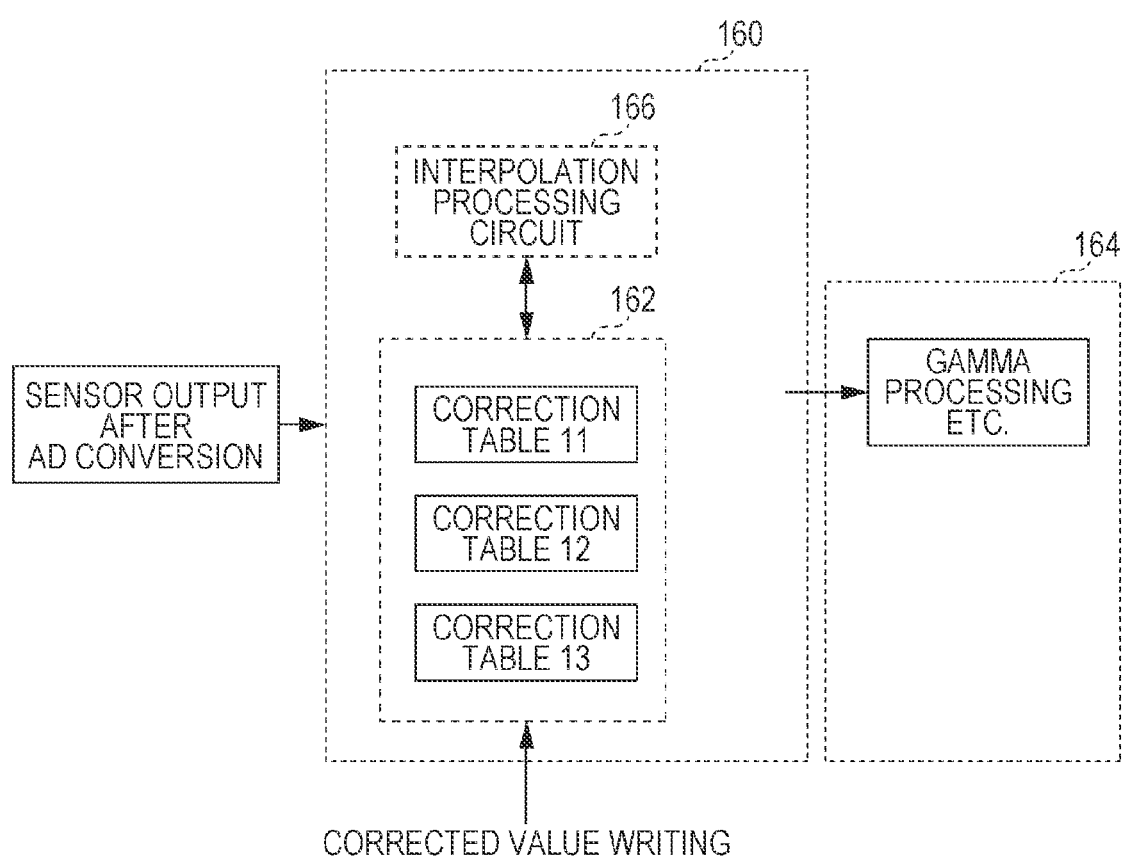
FIG. 52 is a drawing schematically depicting an overview of linearity compensation processing including interpolation processing.

FIG. 52 schematically depicts an overview of linearity compensation processing including interpolation processing. As exemplified in FIG. 52, the control circuit 160 can include in a portion thereof an interpolation processing circuit 166 that executes this kind of linear interpolation.

The embodiments of the present disclosure can be applied to photodetectors, image sensors, and the like, and an imaging device or a camera system of the present disclosure can be used in digital still cameras such as digital single-lens reflex cameras and digital mirrorless single-lens cameras, or digital video cameras, for example. Alternatively, an imaging device or a camera system of the present disclosure can be used in various camera systems or sensor systems including commercial cameras for broadcasting uses, medical cameras, surveillance cameras, or the like. It is also possible to acquire images using infrared rays by appropriately selecting the material of the photoelectric conversion layer. An imaging device that performs imaging using infrared rays can be used in security cameras, cameras that are used mounted on vehicles, or the like. Vehicle-mounted cameras can be used as input for a control device, for the safe travel of a vehicle, for example. Alternatively, vehicle-mounted cameras can be used to support an operator, for the safe travel of a vehicle.

What is claimed is:

1. An imaging device comprising:
a photoelectric converter that includes a first electrode, a second electrode, and a photoelectric conversion layer located between the first electrode and the second electrode;
a voltage supply circuit that applies a bias voltage between the first electrode and the second electrode;
an amplifier transistor that includes a gate electrically connected to the second electrode, the amplifier transistor being configured to output a signal that corresponds to a potential of the gate; and
a detection circuit that is configured to detect a level of the signal from the amplifier transistor, wherein
the voltage supply circuit
applies the bias voltage in a first voltage range, in a case where the level detected by the detection circuit is less than a first threshold value, and
applies the bias voltage in a second voltage range that is greater than the first voltage range, in a case where the level detected by the detection circuit is greater than a second threshold value.

2. The imaging device according to claim 1, wherein the second threshold value is equal to the first threshold value.

3. The imaging device according to claim 1, wherein the second threshold value is greater than the first threshold value.

4. The imaging device according to claim 1, wherein the photoelectric converter has photoelectric conversion characteristics in which a first rate of change is different from a second rate of change, the first rate of change being a rate of change of a photoelectric conversion efficiency of the photoelectric converter with respect to the bias voltage in the first voltage range, the second rate of change being a rate of change of the photoelectric conversion efficiency of the photoelectric converter with respect to the bias voltage in the second voltage range.

5. The imaging device according to claim 1, wherein a potential of the first electrode is higher than the potential of the second electrode in both of a state in which the bias voltage in the first voltage range is applied between the first electrode and the second electrode, and a state in which the bias voltage in the second voltage range is applied between the first electrode and the second electrode.

6. The imaging device according to claim 1, wherein, in a graph of a photoelectric conversion efficiency of the photoelectric converter with respect to the bias voltage, when Vt is a value of the bias voltage corresponding to an intersecting point between a first tangent at a point where the photoelectric conversion efficiency rises from 0 and a second tangent at a point where the bias voltage is a largest value during operation, the first voltage range is a voltage range that is less than the Vt.

7. The imaging device according to claim 1, wherein, in a graph of a photoelectric conversion efficiency of the photoelectric converter with respect to the bias voltage, when Vt is a value of the bias voltage corresponding to an intersecting point between a first tangent at a point where a value of the photoelectric conversion efficiency is 0.06 and a second tangent at a point where the bias voltage is a largest value during operation, the first voltage range is a voltage range that is less than the Vt.

8. The imaging device according to claim 1, wherein the second voltage range is a voltage range in which a change in a photoelectric conversion efficiency with respect to a change of 1 V in the bias voltage is less than 10%.

9. The imaging device according to claim 1, wherein the second voltage range is a voltage range in which a photoelectric conversion efficiency is 0.7 or more.

10. The imaging device according to claim 1, wherein a first efficiency that is a photoelectric conversion efficiency of the photoelectric converter when the bias voltage in the first voltage range is supplied is lower than a second efficiency that is the photoelectric conversion efficiency of the photoelectric converter when the bias voltage in the second voltage range is supplied.

11. The imaging device according to claim 10, wherein a ratio of the bias voltage in the second voltage range with respect to the bias voltage in the first voltage range is greater than a ratio of the second efficiency with respect to the first efficiency.

12. The imaging device according to claim 11, wherein the ratio of the second efficiency with respect to the first efficiency is 1.25 or more and 100 or less.

13. The imaging device according to claim 10, wherein a ratio of the second efficiency with respect to the first efficiency is 1 or more and 1.25 or less.

14. An imaging device comprising:
- a photoelectric converter that includes a first electrode, a second electrode, and a photoelectric conversion layer located between the first electrode and the second electrode;
- a voltage supply circuit that applies a bias voltage between the first electrode and the second electrode;
- an amplifier transistor that includes a gate electrically connected to the second electrode, the amplifier transistor being configured to output a signal that corresponds to a potential of the gate; and
- a detection circuit that is configured to detect a level of the signal from the amplifier transistor, wherein
- the voltage supply circuit increases the bias voltage, in a case where the level detected by the detection circuit is greater than a first threshold value.

15. The imaging device according to claim 14, wherein the voltage supply circuit decreases the bias voltage, in a case where the level detected by the detection circuit is less than a second threshold value.

16. The imaging device according to claim 15, wherein the second threshold value is equal to the first threshold value.

17. The imaging device according to claim 15, wherein the second threshold value is greater than the first threshold value.

18. The imaging device according to claim 14, wherein the photoelectric converter has photoelectric conversion characteristics in which a photoelectric conversion efficiency of the photoelectric converter increases in an upwardly convex curved form with respect to an increase in the bias voltage.

19. An imaging device comprising:
- a photoelectric converter that includes a first electrode, a second electrode, and a photoelectric conversion layer located between the first electrode and the second electrode;
- a voltage supply circuit that applies a bias voltage between the first electrode and the second electrode;
- an amplifier transistor that includes a gate that is electrically connected to the second electrode, the amplifier transistor being configured to output a signal that corresponds to a potential of the gate; and
- a detection circuit that is configured to detect a level of the signal from the amplifier transistor, wherein
- the voltage supply circuit decreases the bias voltage, in a case where the level detected by the detection circuit is less than a first threshold value.

20. The imaging device according to claim 19, wherein the photoelectric converter has photoelectric conversion characteristics in which a photoelectric conversion efficiency of the photoelectric converter increases in an upwardly convex curved form with respect to an increase in the bias voltage.

* * * * *